(12) United States Patent
Zhao et al.

(10) Patent No.: US 10,483,381 B2
(45) Date of Patent: Nov. 19, 2019

(54) SEMICONDUCTOR DEVICE AND METHOD FOR FABRICATING SEMICONDUCTOR DEVICE

(71) Applicant: Huawei Technologies Co., Ltd., Shenzhen, Guangdong (CN)

(72) Inventors: Jing Zhao, Dongguan (CN); Chen-Xiong Zhang, Plano, TX (US)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/024,562

(22) Filed: Jun. 29, 2018

(65) Prior Publication Data

US 2018/0323291 A1 Nov. 8, 2018

Related U.S. Application Data

(63) Continuation of application No. PCT/CN2015/100348, filed on Dec. 31, 2015.

(51) Int. Cl.
| | |
|---|---|
| *H01L 29/66* | (2006.01) |
| *H01L 21/8234* | (2006.01) |
| *H01L 23/535* | (2006.01) |
| *H01L 27/06* | (2006.01) |
| *H01L 27/088* | (2006.01) |
| *H01L 49/02* | (2006.01) |
| *H01L 29/06* | (2006.01) |

(52) U.S. Cl.
CPC .......... *H01L 29/66977* (2013.01); *H01L 21/823475* (2013.01); *H01L 21/823481* (2013.01); *H01L 23/535* (2013.01); *H01L 27/0629* (2013.01); *H01L 27/088* (2013.01); *H01L 28/20* (2013.01); *H01L 28/40* (2013.01); *H01L 29/0653* (2013.01)

(58) Field of Classification Search
None
See application file for complete search history.

(56) References Cited

U.S. PATENT DOCUMENTS

| | | | |
|---|---|---|---|
| 2014/0252442 A1* | 9/2014 | Chuang | H01L 27/0629 257/306 |
| 2014/0252455 A1 | 9/2014 | Chuang et al. | |
| 2014/0256102 A1 | 9/2014 | Chuang et al. | |
| 2016/0093638 A1* | 3/2016 | Cheng | H01L 27/1203 257/347 |

FOREIGN PATENT DOCUMENTS

| | | |
|---|---|---|
| CN | 101771050 A | 7/2010 |
| CN | 101777557 A | 7/2010 |
| CN | 101819975 A | 9/2010 |

* cited by examiner

*Primary Examiner* — Michelle Mandala
(74) *Attorney, Agent, or Firm* — Conley Rose, P.C.

(57) ABSTRACT

A semiconductor device and a method for fabricating a semiconductor device are disclosed. The semiconductor device includes a tunnel field-effect transistor and a planar device. The tunnel field-effect transistor includes a first substrate and a first electrical element, and the first electrical element is formed on one side of the first substrate; the planar device includes a second substrate and a second electrical element, the second substrate and the first substrate are an integrated structure and form a main substrate, the second electrical element is formed on one side of the second substrate, and the second electrical element and the first electrical element are disposed on a same side of the main substrate; and the planar device includes any one of a metal oxide semiconductor transistor, a capacitor, and a resistor.

20 Claims, 31 Drawing Sheets

SEMICONDUCTOR DEVICE AND METHOD FOR FABRICATING SEMICONDUCTOR DEVICE

CROSS-REFERENCE TO RELATED APPLICATIONS

This application is a continuation of International Application No. PCT/CN2015/100348, filed on Dec. 31, 2015, the disclosure of which is hereby incorporated by reference in its entirety.

TECHNICAL FIELD

The present application relates to the field of semiconductor technologies, and in particular, to a semiconductor device and a method for fabricating a semiconductor device.

BACKGROUND

A complementary metal-oxide-semiconductor (CMOS) is a core component of a microelectronic integrated circuit, and its size and operating voltage obey the Moore's law, so as to achieve better performance and higher integration density. However, reduction of the size of the CMOS is accompanied with constantly increasing power consumption of the CMOS. One reason is that electric current leakage increases because of a short-channel effect, and the other reason is that it becomes increasingly difficult to reduce supply voltage for the device. The difficulty in reducing supply voltage for the CMOS device mainly results from a relatively large sub-threshold swing of the CMOS device, usually higher than 60 mV/dec. A tunnel field-effect transistor (TFET) is considered as a good replacement of the CMOS device for its less electric current leakage and steep subthreshold slope. Currently, when the TFET and a conventional planar structure (such as an MOS transistor, a capacitor, or a resistor) are used to jointly construct a circuit, it is difficult to combine the TFET and the conventional planar structure due to a limitation of a TFET structure characteristic. Currently, to integrate a non-planar TFET and a planar structure, usually a TFET is first formed, the planar structure is formed, and then the TFET and the planar structure are combined. This increases process complexity and implementation costs to a large extent.

SUMMARY

According to a first aspect, the present disclosure provides a semiconductor device, where the semiconductor device includes a tunnel field-effect transistor and a planar device; the tunnel field-effect transistor includes a first substrate and a first electrical element, and the first electrical element is formed on one side of the first substrate; the planar device includes a second substrate and a second electrical element, the second substrate and the first substrate are an integrated structure and form a main substrate, the second electrical element is formed on one side of the second substrate, and the second electrical element and the first electrical element are disposed on a same side of the main substrate; and the planar device includes any one of a metal oxide semiconductor transistor, a capacitor, and a resistor.

In a first implementation, the first substrate includes a first surface and a second surface that are disposed opposite to each other; the second substrate includes a third surface and a fourth surface that are disposed opposite to each other; the first substrate is in contact with the second substrate; the third surface is flush with the first surface; and the fourth surface is flush with the third surface.

With reference to the first implementation, in a second implementation, the first electrical element includes a first shallow trench isolation region and a second shallow trench isolation region; the first shallow trench isolation region and the second shallow trench isolation region are embedded into the first substrate from the first surface; one end of the first shallow trench isolation region is flush with the first surface; one end of the second shallow trench isolation region is flush with the first surface; and the second shallow trench isolation region and the first shallow trench isolation region are opposite to each other and separated by apart of the first substrate.

With reference to the second implementation, in a third implementation, the first electrical element further includes a first drain region, a second drain region, a first source region, a first insulation layer, a first gate dielectric layer, and a first gate region; the first drain region and the second drain region are embedded into the first substrate from the first surface; one end of the first drain region is flush with the first surface; one end of the second drain region is flush with the first surface; the first drain region and the second drain region are opposite to each other, separated by a part of the first substrate, and disposed between the first shallow trench isolation region and the second shallow trench isolation region; the first drain region is in contact with the first shallow trench isolation region; the second drain region is in contact with the second shallow trench isolation region; the first source region is disposed in a protruding manner on the first surface, and the first source region is located between the first drain region and the second drain region; the first insulation layer is disposed in a protruding manner on the first surface; the first insulation layer is symmetrically disposed on both sides of the first source region, and connected to a region between the first drain region and the first source region and a region between the second drain region and the first source region, and a thickness of the first insulation layer is less than a height of the first source region; the first gate dielectric layer is symmetrically disposed on the both sides of the first source region and is attached to a surface of the first source region and a surface of the first insulation layer; and the first gate region is disposed around the first gate dielectric layer.

With reference to the third implementation, in a fourth implementation, the first gate dielectric layer includes a first gate dielectric portion and a second gate dielectric portion; the first gate dielectric portion is stacked on the first insulation layer; one end of the second gate dielectric portion is connected to the first gate dielectric portion, and the second gate dielectric portion is attached to the surface of the first source region.

With reference to the fourth implementation, in a fifth implementation, the first gate region includes a first part and a second part; the first part is stacked on the first gate dielectric portion; and one end of the second part is connected to one end of the first part, and the second part is attached to a surface of the second gate dielectric portion.

With reference to the fifth implementation, in a sixth implementation, the first gate dielectric layer further includes a third gate dielectric portion, the third gate dielectric portion is connected to one end, of the second gate dielectric portion, that is away from the first gate dielectric portion, and the third gate dielectric portion covers one end, of the first source region, that is away from the substrate; and the first gate region further includes a third part, the third part is connected to one end, of the second part, that is away from the first part, and the third part covers the third gate dielectric portion.

With reference to the fifth implementation, in a seventh implementation, the first electrical element further includes a first drain, a second drain, a first source, and two first gates; the first drain, the second drain, the first source, and the two first gates are correspondingly connected to the first drain region, the second drain region, the first source region, and the second part of the first gate region, respectively; and the two first gates are respectively disposed on both sides of the first source.

Further, the first electrical element further includes a first isolation layer, where the first isolation layer covers the first drain region, the second drain region, the first source region, and the first gate region; a first through hole, a second through hole, a third through hole, a fourth through hole, and a fifth through hole are disposed at the first isolation layer; the first through hole is disposed corresponding to the first drain region, and the first drain is connected to the first drain region by using the first through hole; the second through hole is disposed corresponding to the second drain region, and the second drain is connected to the second drain region by using the second through hole; the third through hole is disposed corresponding to the first source region, and the first source is connected to the first source region by using the third through hole; the fourth through hole and the fifth through hole are respectively disposed on both sides of the third through hole, the fourth through hole and the fifth through hole are separately disposed corresponding to the second part of the first gate region, and the two first gates are connected to the second part of the first gate region respectively by using the fourth through hole and the fifth through hole.

Further, the first electrical element further includes at least one of a first ohmic contact layer, a second ohmic contact layer, a third ohmic contact layer, a fourth ohmic contact layer, or a fifth ohmic contact layer, where the first ohmic contact layer is disposed between the first drain and the first drain region, to connect the first drain and the first drain region; the second ohmic contact layer is disposed between the second drain and the second drain region, to connect the second drain and the second drain region; the third ohmic contact layer is disposed between the first source and the first source region, to connect the first source and the first source region; the fourth ohmic contact layer is disposed between a first first-gate and the second part of the first gate region, to connect the first first-gate and the second part of the first gate region; and the fifth ohmic contact layer is disposed between a second first-gate and the second part of the first gate region, to connect the second first-gate and the second part of the first gate region.

With reference to the sixth implementation, in an eighth implementation, the first electrical element further includes a first drain, a second drain, a first source, and three first gates; the first drain, the second drain, the first source, and the three first gates are correspondingly connected to the first drain region, the second drain region, the first source region, and the first gate region during disposing; and two of the first gates are connected to the second part and respectively disposed on both sides of the first source, and the other one first gate is connected to the third part.

Further, the first electrical element further includes a first isolation layer, where the first isolation layer covers the first drain region, the second drain region, the first source region, and the first gate region; a first through hole, a second through hole, a third through hole, a fourth through hole, a fifth through hole, and a sixth through hole are disposed at the first isolation layer; the first through hole is disposed corresponding to the first drain region, and the first drain is connected to the first drain region by using the first through hole; the second through hole is disposed corresponding to the second drain region, and the second drain is connected to the second drain region by using the second through hole; the third through hole is disposed corresponding to the first source region, and the first source is connected to the first source region by using the third through hole; the fourth through hole and the fifth through hole are respectively disposed on both sides of the third through hole, and the fourth through hole and the fifth through hole are separately disposed corresponding to the second part of the first gate region; the sixth through hole is disposed corresponding to the third part; the two first gates are connected to the second part respectively by using the fourth through hole and the fifth through hole; and the other one first gate is connected to the third part by using the sixth through hole.

Further, the first electrical element further includes at least one of a first ohmic contact layer, a second ohmic contact layer, a third ohmic contact layer, a fourth ohmic contact layer, a fifth ohmic contact layer, or a sixth ohmic contact layer, where the first ohmic contact layer is disposed between the first drain and the first drain region, to connect the first drain and the first drain region; the second ohmic contact layer is disposed between the second drain and the second drain region, to connect the second drain and the second drain region; the third ohmic contact layer is disposed between the first source and the first source region, to connect the first source and the first source region; the fourth ohmic contact layer is disposed between a first first-gate and the second part of the first gate region, to connect the first first-gate and the second part of the first gate region; the fifth ohmic contact layer is disposed between a second first-gate and the second part of the first gate region, to connect the second first-gate and the second part of the first gate region; and the sixth ohmic contact layer is disposed between a third first-gate and the third part of the first gate region, to connect the third first-gate and the third part of the first gate region.

With reference to any one of the first aspect or the first to the eighth implementations of the first aspect, in a ninth implementation, the second electrical element includes a third shallow trench isolation region and a fourth shallow trench isolation region; the third shallow trench isolation region and the fourth shallow trench isolation region are embedded into the second substrate from the third surface; one end of the third shallow trench isolation region is flush with the third surface; one end of the fourth shallow trench isolation region is flush with the third surface; and the fourth shallow trench isolation region and the third shallow trench isolation region are disposed opposite to each other and separated by a part of the second substrate.

With reference to the ninth implementation, in a tenth implementation, when the planar device is the metal oxide semiconductor transistor, the second electrical element includes a second source region, a third drain region, a second gate dielectric layer, and a second gate region; the second source region and the third drain region are embedded into the second substrate from the third surface; one end of the second source region is flush with the third surface; one end of the third drain region is flush with the third surface; the second source region and the third drain region are opposite to each other, separated by apart of the second substrate, and disposed between the third shallow trench isolation region and the fourth shallow trench isolation region; the second source region is in contact with the third shallow trench isolation region; the third drain region is in contact with the fourth shallow trench isolation region; the second gate dielectric layer is disposed in a protruding manner on the third surface, and the second gate dielectric layer is disposed between the second source region and the third drain region; and the second gate region is stacked on the second gate dielectric layer, and the second gate region is in contact with the second gate dielectric layer.

With reference to the tenth implementation, in an eleventh implementation, the second electrical element further includes a second source, a third drain, and a second gate; and the second source, the third drain, and the second gate are correspondingly connected to the second source region, the third drain region, and the second gate region, respectively.

With reference to the eleventh implementation, in a twelfth implementation, the second electrical element further includes a second isolation layer; the second isolation layer is located at a same layer as the first isolation layer; the second isolation layer covers the second source region, the third drain region, and the second gate region; a seventh through hole, an eighth through hole, and a ninth through hole are disposed at the second isolation layer; the seventh through hole is disposed corresponding to the second source region, and the second source is connected to the second source region by using the seventh through hole; the eighth through hole is disposed corresponding to the third drain region, and the third drain is connected to the third drain region by using the eighth through hole; and the ninth through hole is disposed corresponding to the second gate region, and the second gate is connected to the second gate region by using the ninth through hole.

Further, the second electrical element further includes at least one of a seventh ohmic contact layer, an eighth ohmic contact layer, or a ninth ohmic contact layer, where the seventh ohmic contact layer is disposed between the second source and the second source region; the eighth ohmic contact layer is disposed between the third drain and the third drain region; and the ninth ohmic contact layer is disposed between the second gate and the second gate region.

With reference to the tenth implementation, in a thirteenth implementation, the first drain region, the second drain region, the second source region, and the third drain region are first-type ion heavily-doped regions, and the first source region is a second-type ion heavily-doped region, where the first-type ion heavily-doped region is an N-type ion heavily-doped region, and the second-type ion heavily-doped region is a P-type ion heavily-doped region; or the first-type ion heavily-doped region is a P-type ion heavily-doped region, and the second-type ion heavily-doped region is an N-type ion heavily-doped region.

With reference to the ninth implementation, in a fourteenth implementation, when the planar device is the capacitor, the second electrical element includes a first doping region, a second insulation layer, a third gate dielectric layer, and a third gate region; the first doping region is embedded into the second substrate from the third surface; one end of the first doping region is flush with the third surface; the first doping region is disposed between the third shallow trench isolation region and the fourth shallow trench isolation region; one end of the first doping region is in contact with the third shallow trench isolation region, and the other end of the first doping region is in contact with the fourth shallow trench isolation region; the second insulation layer is disposed in the middle of the first doping region, and the second insulation layer does not cover the both ends of the first doping region; the third gate dielectric layer is stacked on the second insulation layer; and the third gate region is stacked on the third gate dielectric layer.

With reference to the fourteenth implementation, in a fifteenth implementation, the second electrical element further includes a first electrode, a second electrode, and a third electrode; the first electrode and the second electrode are correspondingly connected to the both ends of the first doping region, respectively; and the third electrode is connected to the third gate region.

Further, the second electrical element further includes a third isolation layer, where the third isolation layer is disposed on a surface of the first doping region that is not covered by the second insulation layer and a surface of the third gate region; a tenth through hole, an eleventh through hole, and a twelfth through hole are disposed at the third isolation layer; the tenth through hole is disposed corresponding to one end of the first doping region, and the first electrode is connected to one end of the first doping region by using the tenth through hole; the eleventh through hole is disposed corresponding to the other end of the first doping region, and the second electrode is connected to the other end of the first doping region by using the eleventh through hole; and the twelfth through hole is disposed corresponding to the third gate region, and the third electrode is connected to the third gate region by using the twelfth through hole.

With reference to the ninth implementation, in a sixteenth implementation, when the planar device is the resistor, the second electrical element includes a second doping region; the second doping region is embedded into the second substrate from the third surface; one end of the second doping region is flush with the third surface; the second doping region is disposed between the third shallow trench isolation region and the fourth shallow trench isolation region; and one end of the second doping region is in contact with the third shallow trench isolation region, and the other end of the second doping region is in contact with the fourth shallow trench isolation region.

With reference to the sixteenth implementation, in a seventeenth implementation, the second electrical element further includes a fourth electrode and a fifth electrode; and the fourth electrode and the fifth electrode are correspondingly connected to the both ends of the second doping region, respectively.

Further, the second electrical element further includes a fourth isolation layer, where the fourth isolation layer covers the second doping region; a twelfth through hole and a thirteenth through hole are disposed at the fourth isolation layer; the twelfth through hole and the thirteenth through hole are disposed respectively corresponding to the both ends of the second doping region; the fourth electrode is connected to one end of the second doping region by using the twelfth through hole; and the fifth electrode is connected to the other end of the second doping region by using the thirteenth through hole.

Compared with that in the prior art, the semiconductor device in the present disclosure includes the tunnel field-effect transistor and the planar device; the tunnel field-effect transistor includes the first substrate and the first electrical element formed on one side of the first substrate; and the planar device includes the second substrate and the second electrical element formed on one side of the second substrate. The first substrate and the second substrate are an integrated structure and form the main substrate, and the first electrical element in the tunnel field-effect transistor is disposed at a same surface of the main substrate as the second electrical element in the planar device. Compared with the prior art that a tunnel field-effect transistor and a planar device are fabricated on different baseplates and then integrated on a same substrate, the semiconductor device in the present disclosure is smaller in size, and process complexity and implementation costs are reduced.

Further, the first insulation layer is used to block the control of the first gate region over the first substrate, to prevent electric current leakage from the first drain region and the second drain region.

According to a second aspect, the present disclosure further provides a method for fabricating a semiconductor device, where the method for fabricating a semiconductor device includes:

S110: providing a main substrate, where the main substrate includes a first substrate and a second substrate that are adjacent to each other; the first substrate includes a first surface and a second surface that are disposed opposite to each other; the second substrate includes a third surface and a fourth surface that are disposed opposite to each other; the third surface is flush with the first surface; and the fourth surface is flush with the second surface; and S120: forming a first electrical element on one side of the first substrate, and forming a second electrical element on one side of the second substrate, where the second electrical element and the first electrical element are disposed on a same side of the main substrate; the first substrate and the first electrical element constitute a tunnel field-effect transistor; and the second substrate and the second electrical element constitute a planar device, where the planar device includes any one of a metal oxide semiconductor transistor, a capacitor, and a resistor.

In a first implementation, the step S120 includes:

step S130: forming, from the first surface, a first shallow trench isolation region and the second shallow trench isolation region that are embedded into the first substrate, and forming, from the third surface, a third shallow trench isolation region and a fourth shallow trench isolation region that are embedded into the second substrate, where one end of the first shallow trench isolation region is flush with the first surface; one end of the second shallow trench isolation region is flush with the first surface; the second shallow trench isolation region and the first shallow trench isolation region are disposed opposite to each other and separated by a part of the first substrate; one end of the third shallow trench isolation region is flush with the third surface; one end of the fourth shallow trench isolation region is flush with the third surface; and the fourth shallow trench isolation region and the third shallow trench isolation region are disposed opposite to each other and separated by a part of the second substrate.

With reference to the first implementation, in a second implementation, after the step S130, the step S120 further includes:

step S131a: forming, from the first surface, a first drain region and a second drain region that are embedded into the first surface, and forming, from the second surface, a second source region and a third drain region that are embedded into the second surface, where one end of the first drain region is flush with the first surface; one end of the second drain region is flush with the first surface; the first drain region and the second drain region are opposite to each other, separated by a part of the first substrate, and disposed between the first shallow trench isolation region and the second shallow trench isolation region; the first drain region is in contact with the first shallow trench isolation region; the second drain region is in contact with the second shallow trench isolation region; one end of the second source region is flush with the third surface; one end of the third drain region is flush with the third surface; the second source region and the third drain region are opposite to each other, separated by a part of the second substrate, and disposed between the third shallow trench isolation region and the fourth shallow trench isolation region; the second source region is in contact with the third shallow trench isolation region; and the third drain region is in contact with the fourth shallow trench isolation region;

step S132a: forming a first source region, where the first source region is disposed in a protruding manner on the first surface, and the first source region is located between the first drain region and the second drain region;

step S133a: forming a first insulation layer, where the first insulation layer is disposed in a protruding manner on a surface of the substrate; and the first insulation layer is symmetrically disposed on both sides of the first source region, and connected to a region between the first drain region and the first source region and a region between the second drain region and the first source region, and a thickness of the first insulation layer is less than a height of the first source region;

step S134a: forming a first gate dielectric layer and a second gate dielectric layer that are disposed at intervals, where the first gate dielectric layer is symmetrically disposed on the both sides of the first source region and is attached to a surface of the first source region and a surface of the first insulation layer; and the second gate dielectric layer is disposed in a protruding manner on the surface of the substrate, and the second gate dielectric layer is disposed between the second source region and the third drain region; and step S135a: forming a first gate region and a second gate region, where the first gate region is disposed around the first gate dielectric layer; and the second gate region is disposed at the second gate dielectric layer, and the second gate region is in contact with the second gate dielectric layer.

With reference to the second implementation, in a third implementation, the step S131a includes:

step S131a-I: stacking an oxide layer and a first hard mask layer in sequence on a same surface of the main substrate;

step S131a-II: patterning the oxide layer and the first hard mask layer, to retain a first oxide portion and a first hard mask portion, and a second oxide portion and a second hard mask portion, where the first oxide portion, the first shallow trench isolation region, and the second shallow trench isolation region are disposed at intervals; the first hard mask portion is stacked on the first oxide portion; the second oxide portion, the third shallow trench isolation region, and the fourth shallow trench isolation region are disposed at intervals; and the second hard mask portion is stacked on the second oxide portion;

step S131a-III: using the first oxide portion and the first hard mask portion, and the second oxide portion 2 and the second hard mask portion, as a mask to perform a first-type ion heavy-doping on the surface of the main substrate, to from the first drain region, the second drain region, the second source region, and the third drain region; and step S131a-IV: stripping off the first oxide portion and the first hard mask portion, and the second oxide portion and the second hard mask portion.

With reference to the first implementation, in a fourth implementation, between the step S132a and the step S133a, the method for fabricating a semiconductor device further includes:

performing annealing processing on the main substrate.

With reference to the third implementation, in a fifth implementation, the step S132a includes:

step S132a-I: depositing, on the surface of the main substrate, a second-type ion heavily-doped semiconductor layer; and step S132a-II: patterning the second-type ion heavily-doped semiconductor layer, to form the first source region.

With reference to the fifth implementation, in a sixth implementation, the step S132a-II includes:

step a1: depositing, at the second-type ion heavily-doped semiconductor layer, a second hard mask layer and a photoresist;

step b1: patterning the second hard mask layer and the photoresist, to retain a second hard mask layer and a photoresist that are corresponding to a middle region between the first source region and the second source region;

step c1: using the retained second hard mask layer and photoresist as a mask to etch the second-type ion heavily-doped semiconductor layer, to retain a second-type ion heavily-doped semiconductor layer covered by the second hard mask layer and the photoresist, so that the first source region is formed; and step d1: stripping off the photoresist corresponding to the middle of the first region.

With reference to the sixth implementation, in a seventh implementation, the step S133a includes:

step S133a-I: depositing an insulation layer, where a thickness of the insulation layer is less than the height of the first source region; and step S133a-II: patterning the insulation layer, to retain a part of the insulation layer that is connected to a region between the first drain region and the first source region and a region between the second drain region and the first source region, to form the first insulation layer.

With reference to the seventh implementation, in an eighth implementation, the step S134a includes:

step S134a-I: depositing an entire gate dielectric material layer; and step S134a-II: patterning the gate dielectric material layer, to retain a gate dielectric material layer that is attached to the surface of the first insulation layer and the surface of the first source region and that is symmetrically disposed on the both sides of the first source region, and retain a gate dielectric material layer that is disposed between the second source region and the third drain region and that is in contact with the second source region and the third drain region, where the gate dielectric material layer that is attached to the surface of the first insulation layer and the surface of the first source region and that is symmetrically disposed on the both sides of the first source region is defined as the first gate dielectric layer; the gate dielectric material layer that is disposed between the second source region and the third drain region is defined as the second gate dielectric layer; the first gate dielectric layer includes a first gate dielectric portion and a second gate dielectric portion; the first gate dielectric portion is stacked on the first insulation layer; and one end of the second gate dielectric portion is connected to the first gate dielectric portion, and the second gate dielectric portion is attached to the surface of the first source region.

With reference to the eighth implementation, in a ninth implementation, the step S135a includes:

step S135a-I: depositing an entire gate material layer; and step S135a-II: patterning the gate material layer, to retain a gate material layer that surrounds the first gate dielectric layer and that is disposed at the second gate dielectric layer, where the gate material layer disposed at the first gate dielectric layer is defined as the first gate region; the gate material layer disposed at the second gate dielectric layer is defined as the second gate region; the gate region includes a first part and a second part; the first part is stacked on the first gate dielectric layer; and one end of the second part is connected to one end of the first part, and the second part is attached to a surface of the second gate dielectric portion.

With reference to the ninth implementation, in a tenth implementation, the method for fabricating a semiconductor device further includes:

step I: forming a first drain, a second drain, a first source, two first gates, a second source, a third drain, and a second gate, respectively corresponding to the first drain region, the second drain region, the first source region, the first gate region, the second source region, the third drain region, and the second gate region, where the first drain, the second drain, the first source, the two first gates, the second source, the third drain, and the second gate are electrically connected to the first drain region, the second drain region, the first source region, the second part of the first gate region, the second source region, the third drain region, and the second gate region, respectively.

Further, before the step I, the method for fabricating a semiconductor device further includes:

step S136a: forming, on the first drain region, the second drain region, the first source region, and the first gate region, and on the second source region, the third drain region, and the second gate region, an insulation isolation layer, where the insulation isolation layer covering the first drain region, the second drain region, the first source region, and the first gate region is defined as a first isolation layer; and the insulation isolation layer covering the second source region, the third drain region, and the second gate region is defined as a second isolation layer;

step S137a: providing, at the first isolation layer, a first through hole, a second through hole, a third through hole, a fourth through hole, and a fifth through hole, where the fourth through hole and the fifth through hole are respectively disposed on both sides of the third through hole; the first through hole is disposed corresponding to the first drain region, and the first drain is connected to the first drain region by using the first through hole; the second through hole is disposed corresponding to the second drain region, and the second drain is connected to the second drain region by using the second through hole; the third through hole is disposed corresponding to the first source region, and the first source is connected to the first source region by using the third through hole; and the fourth through hole and the fifth through hole are separately disposed corresponding to the second part of the first gate region, and the two first gates are connected to the second part of the first gate region respectively by using the fourth through hole and the fifth through hole; and step S138a: providing, at the second isolation layer, a seventh through hole, an eighth through hole, and a ninth through hole, where the seventh through hole is disposed corresponding to the second source region, and the second source is connected to the second source region by using the seventh through hole; the eighth through hole is disposed corresponding to the third drain region, and the third drain is connected to the third drain region by using the eighth through hole; and the ninth through hole is disposed corresponding to the second gate region, and the second gate is connected to the second gate region by using the ninth through hole.

Further, the method for fabricating a semiconductor device further includes at least one of the following steps:

step S139a-I: forming, between the first drain and the first drain region, a first ohmic contact layer, where the first drain is connected to the first drain region by using the first ohmic contact layer;

step S139a-II: forming, between the second drain and the second drain region, a second ohmic contact layer, where the second drain is connected to the second drain region by using the second ohmic contact layer;

step S139a-III: forming, between the first source and the first source region, a third ohmic contact layer, where the first source is connected to the first source region by using the third ohmic contact layer;

step S139a-IV: forming, between a first first-gate and the second part of the first gate region, a fourth ohmic contact layer, where the first first-gate is connected to the second part of the first gate region by using the fourth ohmic contact layer;

step S139a-V: forming, between a second first-gate and the second part of the first gate region, a fifth ohmic contact layer, where the second first-gate is connected to the second part of the first gate region by using the fifth ohmic contact layer;

step S139a-VI: forming, between the second source and the second source region, a seventh ohmic contact layer, where the second source is connected to the second source region by using the seventh ohmic contact layer;

step S139a-VII: forming, between the third drain and the third drain region, an eighth ohmic contact layer, where the third drain is connected to the third drain region by using the eighth ohmic contact layer; or step S139a-VIII: forming, between the second gate and the second gate region, a ninth ohmic contact layer, where the second gate is connected to the second gate region by using the ninth ohmic contact layer.

With reference to the sixth implementation, in an eleventh implementation, after the step S130, the step S120 further includes:

step a2: depositing, at the second-type ion heavily-doped semiconductor layer, a second hard mask layer and a photoresist;

step b2: patterning the second hard mask layer and the photoresist, to retain a second hard mask layer and a photoresist that are corresponding to a middle region between the first source region and the second source region;

step c2: using the retained second hard mask layer and photoresist as a mask to etch the second-type ion heavily-doped semiconductor layer, to retain a second-type ion heavily-doped semiconductor layer covered by the second hard mask layer and the photoresist, so that the first source region is formed; and step d2: stripping off the second hard mask layer and the photoresist that are corresponding to the middle of the first region.

With reference to the eleventh implementation, in a twelfth implementation, the step S134a and the step S135a include:

step S134a-I': depositing an entire gate dielectric material layer;

step S134a-II': depositing, at the entire gate dielectric material layer, a gate material layer; and step S134a-III': patterning the gate dielectric material layer and the gate material layer, to remove a gate dielectric material layer and a gate material layer that cover the first drain region, the second drain region, the second source region, and the third drain region, with the remaining gate dielectric material layer being the first gate dielectric layer, where the first gate dielectric layer includes a first gate dielectric portion, a second gate dielectric portion, and a third gate dielectric portion; the first gate dielectric portion is stacked on the first insulation layer; one end of the second gate dielectric portion is connected to the first gate dielectric portion, and the second gate dielectric portion is attached to the surface of the first source region; the third dielectric portion is connected to one end, of the second gate dielectric portion, that is away from the first gate dielectric portion, and the third dielectric portion covers one end, of the first source region, that is away from the substrate; the first gate region includes a first part, a second part, and a third part; the first part is stacked on the first gate dielectric layer; one end of the second part is connected to one end of the first part, and the second part is attached to a surface of the second gate dielectric portion; and the third part is connected to one end, of the second part, that is away from the first part, and the third part covers the third gate dielectric portion.

With reference to the twelfth implementation, in a thirteenth implementation, the method for fabricating a semiconductor device further includes:

step II: forming a first drain, a second drain, a first source, three first gates, a second source, a third drain, and a second gate, respectively corresponding to the first drain region, the second drain region, the first source region, the first gate region, the second source region, the third drain region, and the second gate region, where the first drain, the second drain, the first source, the second source, the third drain, and the second gate are electrically connected to the first drain region, the second drain region, the first source region, the second source region, the third drain region, and the second gate region, respectively; and two of the first gates are connected to the second part and respectively disposed on both sides of the first source, and the other one first gate is connected to the third part.

With reference to the thirteenth implementation, in a fourteenth implementation, before the step II, the method for fabricating a semiconductor device further includes:

step S136b: forming, on the first drain region, the second drain region, the first source region, and the first gate region, and on the second source region, the third drain region, and the second gate region, an insulation isolation layer, where the insulation isolation layer covering the first drain region, the second drain region, the first source region, and the first gate region is defined as a first isolation layer; and the insulation isolation layer covering the second source region, the third drain region, and the second gate region is defined as a second isolation layer;

step S137b: providing, at the first isolation layer, a first through hole, a second through hole, a third through hole, a fourth through hole, a fifth through hole, and a sixth through hole, where the fourth through hole and the fifth through hole are respectively disposed on both sides of the third through hole; the first drain is connected to the first drain region by using the first through hole; the second drain is connected to the second drain region by using the second through hole; the first source is connected to the first source region by using the third through hole; and two of the first gates are connected to the second part of the first gate respectively by using the fourth through hole and the fifth through hole, and the other one first gate is connected to the third part of the first gate region by using the sixth through hole; and step S138b: providing, at the second isolation layer, a seventh through hole, an eighth through hole, and a ninth through hole, where the second source is connected to the second source region by using the seventh through hole; the third drain is connected to the third drain region by using the eighth through hole; and the second gate is connected to the second gate region by using the ninth through hole.

Further, the method for fabricating a semiconductor device further includes at least one of the following steps:

step S139b-I: forming, between the first drain and the first drain region, a first ohmic contact layer, where the first drain is connected to the first drain region by using the first ohmic contact layer;

step S139b-II: forming, between the second drain and the second drain region, a second ohmic contact layer, where the second drain is connected to the second drain region by using the second ohmic contact layer;

step S139b-III: forming, between the first source and the first source region, a third ohmic contact layer, where the first source is connected to the first source region by using the third ohmic contact layer;

step S139b-IV: forming, between a first first-gate and the second part of the first gate region, a fourth ohmic contact layer, where the first first-gate is connected to the second part of the first gate region by using the fourth ohmic contact layer;

step S139b-V: forming, between a second first-gate and the second part of the first gate region, a fifth ohmic contact layer, where the second first-gate is connected to the second part of the first gate region by using the fifth ohmic contact layer;

step S139b-VI: forming, between a third first-gate and the third part of the first gate region, a sixth ohmic contact layer, where the third first-gate is connected to the third part of the first gate region by using the sixth ohmic contact layer;

step S139b-VII: forming, between the second source and the second source region, a seventh ohmic contact layer, where the second source is connected to the second source region by using the seventh ohmic contact layer;

step S139b-VIII: forming, between the third drain and the third drain region, an eighth ohmic contact layer, where the third drain is connected to the third drain region by using the eighth ohmic contact layer; or step S139b-V-IX: forming, between the second gate and the second gate region, a ninth ohmic contact layer, where the second gate is connected to the second gate region by using the ninth ohmic contact layer.

With reference to the second implementation, in a fifteenth implementation, the first drain region, the second drain region, the second source region, and the third drain region are regions obtained by performing first-type ion heavy-doping on the substrate, and the first source region is a second-type ion heavily-doped region, where the first-type ion heavy-doping is N-type ion heavy-doping, and the second-type ion heavy-doping is P-type ion heavy-doping; or the first-type ion heavy-doping is P-type ion heavy-doping, and the second-type ion heavy-doping is N-type ion heavy-doping.

With reference to the first implementation, in a sixteenth implementation, after the step S130, the step S120 includes:

step S131c: forming, from the first surface, a first drain region and a second drain region that are embedded into the first surface, and forming, from the second surface, a first doping region embedded into the second surface, where one end of the first drain region is flush with the first surface; one end of the second drain region is flush with the first surface; the first drain region and the second drain region are opposite to each other, separated by a part of the first substrate, and disposed between the first shallow trench isolation region and the second shallow trench isolation region; the first drain region is in contact with the first shallow trench isolation region; the second drain region is in contact with the second shallow trench isolation region; one end of the first doping region is flush with the third surface; the first doping region is disposed between the third shallow trench isolation region and the fourth shallow trench isolation region; and one end of the first doping region is in contact with the third shallow trench isolation region, and the other end of the first doping region is in contact with the fourth shallow trench isolation region;

step S132c: forming a first source region, where the first source region is disposed in a protruding manner on a surface of the first substrate, and the first source region is located between the first drain region and the second drain region;

step S133c: forming a first insulation layer and a second insulation layer, where the first insulation layer is disposed in a protruding manner on a surface of the substrate; and the first insulation layer is symmetrically disposed on both sides of the first source region, and connected to a region between the first drain region and the first source region and a region between the second drain region and the first source region, and a thickness of the first insulation layer is less than a height of the first source region;

step S134c: forming a first gate dielectric layer and a third gate dielectric layer that are disposed at intervals, where the first gate dielectric layer is symmetrically disposed on the both sides of the first source region and is attached to a surface of the first source region and a surface of the first insulation layer; the third gate dielectric layer is stacked on the second insulation layer; the second insulation layer is disposed in the middle of the first doping region, and the second insulation layer does not cover both ends of the first doping region; and the second insulation layer is located at a same layer as the first insulation layer; and step S135c: forming a first gate region and a third gate region, where the first gate region is disposed around the first gate dielectric layer; and the third gate region is stacked on the third gate dielectric layer.

With reference to the fifteenth implementation, in a seventeenth implementation, the step S131c includes:

step S131c-I: forming, in sequence on a same surface of the substrate, an oxide layer and a third hard mask layer that are stacked;

step S131c-II: patterning the oxide layer and the third hard mask layer, to remove an oxide layer and a third hard mask layer that are located at both ends of the first region and on the second region;

step S131c-III: using the patterned oxide layer and third hard mask layer as a mask to perform first-type ion heavy-doping on the surface of the substrate, to form, in the first region, the first drain region and the second drain region that are disposed at intervals, and form, in the second region, the first doping region; and step S131c-IV: stripping off the remaining oxide layer and third hard mask layer.

With reference to the sixteenth implementation, in an eighteenth implementation, between the step S131c and the step S132c, the method for fabricating a semiconductor device further includes:

performing annealing processing on the main substrate.

With reference to the eighteenth implementation, in a nineteenth implementation, the step S132c includes:

step S132c-I: depositing a second-type ion heavily-doped semiconductor layer; and step S132c-II: patterning the second-type ion heavily-doped semiconductor layer, to form the first source region.

With reference to the nineteenth implementation, in a twentieth implementation, the step S132c-II includes:

step a3: depositing, at the second-type ion heavily-doped semiconductor layer, a fourth hard mask layer and a photoresist;

step b3: patterning the fourth hard mask layer and the photoresist, to retain a fourth hard mask layer and a photoresist that are corresponding to a middle region between the first source region and the second source region;

step c3: using the retained fourth hard mask layer and photoresist as a mask to etch the second-type ion heavily-doped semiconductor layer, to retain a second-type ion heavily-doped semiconductor layer covered by the fourth hard mask layer and the photoresist, so that the first source region is formed; and step d3: stripping off the photoresist corresponding to the middle of the first region.

With reference to the twentieth implementation, in a twenty-first implementation, the step S133c includes:

step S133c-I: depositing an insulation layer, where a thickness of the insulation layer is less than the height of the first source region; and step S133c-II: patterning the insulation layer, to retain a part, of the insulation layer, that surrounds the first source region, and a part, of the insulation layer, that is disposed in the middle of the first doping region, where the part, of the insulation layer, that surrounds the first source region is the first insulation layer, and the part, of the insulation layer, that is disposed in the middle of the first doping region is the second insulation layer.

With reference to the twentieth implementation, in a twenty-second implementation, the step S134c includes:

step S134c-I: depositing an entire gate dielectric material layer; and step S134c-II: patterning the gate dielectric material layer, to retain a gate dielectric material layer that is attached to the surface of the first insulation layer and the surface of the first source region and that is symmetrically disposed on the both sides of the first source region, and retain a gate dielectric material layer disposed at the second insulation layer, where the gate dielectric material layer that is attached to the surface of the first insulation layer and the surface of the first source region and that is symmetrically disposed on the both sides of the first source region is defined as the first gate dielectric layer; the gate dielectric material layer disposed at the second insulation layer is defined as the third gate dielectric layer; the first gate dielectric layer includes a first gate dielectric portion and a second gate dielectric portion; the first gate dielectric portion is stacked on the first insulation layer; and one end of the second gate dielectric portion is connected to the first gate dielectric portion, and the second gate dielectric portion is attached to the surface of the first source region.

With reference to the twenty-second implementation, in a twenty-third implementation, the step S135c includes:

step S135c-I: depositing an entire gate material layer; and step S135c-II: patterning the gate material layer, to retain a gate material layer that surrounds the first gate dielectric layer and that is disposed at the third gate dielectric layer, where the gate material layer disposed at the first gate dielectric layer is defined as the first gate region; the gate material layer disposed at the third gate dielectric layer is defined as the third gate region; the first gate region includes a first part and a second part; the first part is stacked on the first gate dielectric layer; and one end of the second part is connected to one end of the first part, and the second part is attached to a surface of the second gate dielectric portion.

With reference to the sixteenth implementation, in a twenty-fourth implementation, the method for fabricating a semiconductor device further includes:

step III: forming a first drain, a second drain, a first source, and a first gate, respectively corresponding to the first drain region, the second drain region, the first source region, and the first gate region, forming a first electrode corresponding to one end of the first doping region, forming a second electrode corresponding to the other end of the first doping region, and forming a third electrode corresponding to the third gate region.

With reference to the twenty-third implementation, in a twenty-fifth implementation, before the step III, the method for fabricating a semiconductor device further includes:

step S136c: forming, on the first drain region, the second drain region, the first source region, the first gate region, and the third gate region, an insulation isolation layer, where the insulation isolation layer covering the first drain region, the second drain region, the first source region, and the first gate region is defined as a first isolation layer; and the insulation isolation layer covering the third gate region is defined as a third isolation layer;

step S137c: providing, at the first isolation layer, a first through hole, a second through hole, a third through hole, a fourth through hole, and a fifth through hole, where the fourth through hole and the fifth through hole are respectively disposed on both sides of the third through hole; the first through hole is disposed corresponding to the first drain region, and the first drain is connected to the first drain region by using the first through hole; the second through hole is disposed corresponding to the second drain region, and the second drain is connected to the second drain region by using the second through hole; the third through hole is disposed corresponding to the first source region, and the first source is connected to the first source region by using the third through hole; and the fourth through hole and the fifth through hole are separately disposed corresponding to the second part of the first gate region, and the two first gates are connected to the first gate region respectively by using the fourth through hole and the fifth through hole; and step S138c: providing, at the third isolation layer, a tenth through hole, an eleventh through hole, and a twelfth through hole, where the first electrode is connected to one end of the first doping region by using the tenth through hole; the second electrode is connected to the other end of the first doping region by using the eleventh through hole; and the third electrode is connected to the third gate region by using the twelfth through hole.

With reference to the first implementation, in a twenty-sixth implementation, after the step S130, the step S120 further includes:

step S131d: forming, from the first surface, a first drain region and a second drain region that are embedded into the first surface, and forming, from the second surface, a second doping region embedded into the second surface, where one end of the first drain region is flush with the first surface; one end of the second drain region is flush with the first surface; the first drain region and the second drain region are opposite to each other, separated by a part of the first substrate, and disposed between the first shallow trench isolation region and the second shallow trench isolation region; the first drain region is in contact with the first shallow trench isolation region; the second drain region is in contact with the second shallow trench isolation region; one end of the second doping region is flush with the third surface; the second doping region is disposed between the third shallow trench isolation region and the fourth shallow trench isolation region; and one end of the second doping region is in contact with the third shallow trench isolation region, and the other end of the second doping region is in contact with the fourth shallow trench isolation region;

step S132d: forming a first source region, where the first source region is disposed in a protruding manner on a surface of the first substrate, and the first source region is located between the first drain region and the second drain region;

step S133d: forming a first insulation layer, where the first insulation layer is disposed in a protruding manner on the surface of the first substrate; and the first insulation layer is symmetrically disposed on both sides of the first source region, and connected to a region between the first drain region and the first source region and a region between the second drain region and the first source region, and a thickness of the first insulation layer is less than a height of the first source region;

step S134d: forming a first gate dielectric layer, where the first gate dielectric layer is symmetrically disposed on the both sides of the first source region and is attached to a surface of the first source region and a surface of the first insulation layer; and step S135d: forming a first gate region, where the first gate region is disposed around the first gate dielectric layer.

With reference to the twenty-sixth implementation, in a twenty-seventh implementation, the method for fabricating a semiconductor device further includes:

step IV: forming a first drain, a second drain, a first source, and two first gates, respectively corresponding to the first drain region, the second drain region, the first source region, and the first gate region, and forming a fourth electrode and a fifth electrode, respectively corresponding to the both ends of the second doping region.

With reference to the twenty-seventh implementation, in a twenty-eighth implementation, before the step IV, the method for fabricating a semiconductor device further includes:

step S136d: forming, on the first drain region, the second drain region, the first source region, and the first gate region, and on the second doping region, an insulation isolation layer, where the insulation isolation layer covering the first drain region, the second drain region, the first source region, and the first gate region is defined as a first isolation layer; and the insulation isolation layer covering the second doping region is defined as a fourth isolation layer;

step S137d: providing, at the first isolation layer, a first through hole, a second through hole, a third through hole, a fourth through hole, and a fifth through hole, where the fourth through hole and the fifth through hole are respectively disposed on both sides of the third through hole; the first drain is connected to the first drain region by using the first through hole; the second drain is connected to the second drain region by using the second through hole; the first source is connected to the first source region by using the third through hole; and the two first gates are connected to the first gate region respectively by using the fourth through hole and the fifth through hole; and step S138d: providing, at the fourth isolation layer, a twelfth through hole and a thirteenth through hole, where the fourth electrode is connected to one end of the second doping region by using the twelfth through hole, and the fifth electrode is connected to the other end of the second doping region by using the thirteenth through hole.

Compared with that in the prior art, according to the method for fabricating a semiconductor device in the present disclosure, layers of a same material in the tunnel field-effect transistor and the planar device are formed in a same process. This reduces process complexity and implementation costs for fabricating the semiconductor device.

Compared with that in the prior art, according to the method for fabricating a semiconductor device in the present disclosure, a doping type of the first drain region and the second drain region that are in the first region is the same as a doping type of the second source region and the third drain region of the metal oxide semiconductor transistor in the second region, and the first drain region, the second drain region, the second source region, and the third drain region can be implemented by a single time of ion injection. This reduces process steps and process complexity for fabricating the semiconductor device, so that costs are reduced. In addition, the semiconductor device fabrication process in the present disclosure is compatible with the existing CMOS standard process, with no extra complicated process methods.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 1:
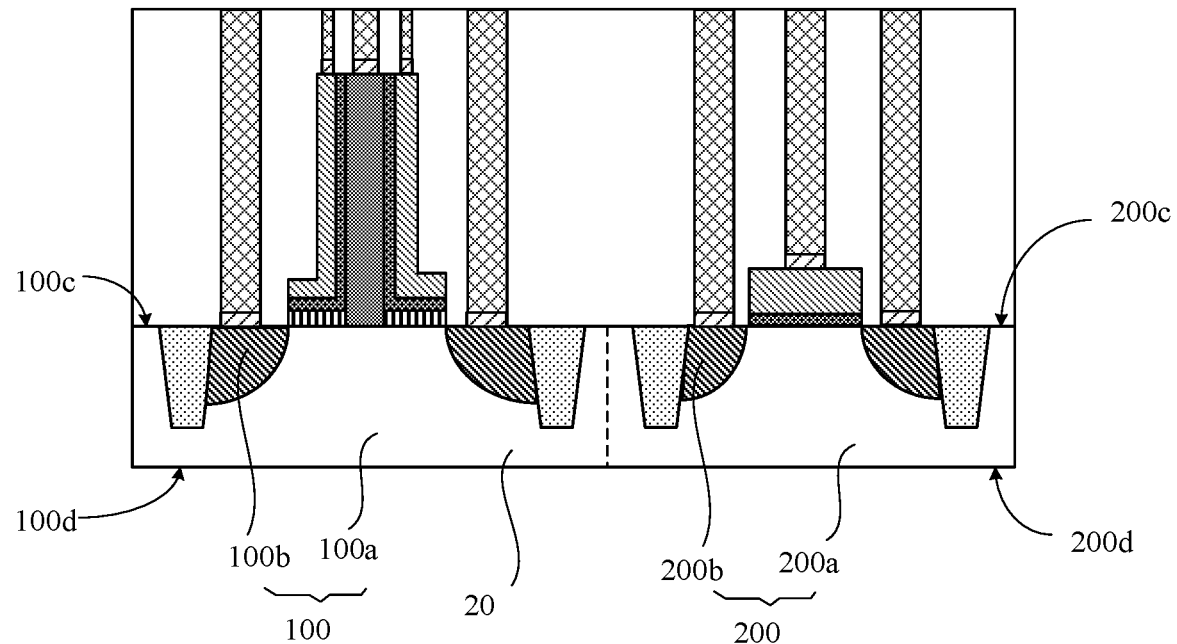
FIG. 1 is a schematic cross-sectional structural diagram of a semiconductor device according to an example implementation of the present disclosure.
Figure 2:
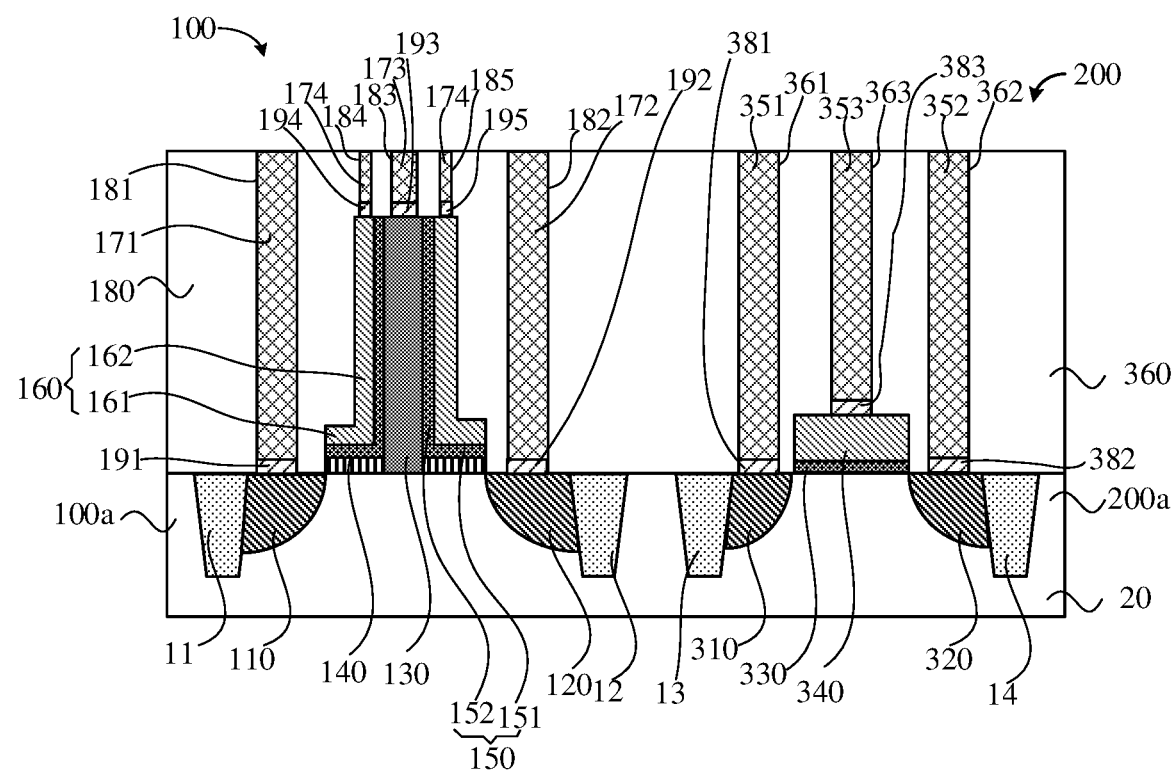
FIG. 2 is a schematic cross-sectional structural diagram of an example implementation when a planar device in the semiconductor device in FIG. 1 of the present disclosure is an MOS.

Referring to FIG. 1 and FIG. 2, FIG. 1 is a schematic cross-sectional structural diagram of a semiconductor device according to an example implementation of the present disclosure, and FIG. 2 is a schematic cross-sectional structural diagram of an example implementation when a planar device in the semiconductor device in FIG. 1 of the present disclosure is an MOS. The semiconductor device 10 includes a tunnel field-effect transistor 100 and a planar device 200. The tunnel field-effect transistor 100 includes a first substrate 100a and a first electrical element 100b. The first electrical element 100b is disposed on one side of the first substrate 100a. The planar device 200 includes a second substrate 200a and a second electrical element 200b. The second substrate 200a and the first substrate 100a are an integrated structure and form a main substrate 20. The second electrical element 200b is formed on a same side of the main substrate 20 as the first electrical element 100b. The planar device 200 includes any one of a metal oxide semiconductor (MOS) transistor, a capacitor, or a resistor. For ease of description, the metal oxide semiconductor transistor is marked as 300, the capacitor is marked as 400, and the resistor is marked as 500.

The first substrate 100a includes a first surface 100c and a second surface 100d that are disposed opposite to each other. The second substrate 200a includes a third surface 200c and a fourth surface 200d that are disposed opposite to each other. The second substrate 200a is in contact with the first substrate 100a. The third surface 200c is flush with the first surface 100c. The fourth surface 200d is flush with the second surface 100d. In this implementation, the first surface 100c is an upper surface of the first substrate 100a, and the second surface 100d is a lower surface of the first substrate 100a; the third surface 200c is an upper surface of the second substrate 200a, and the fourth surface 200d is a lower surface of the second substrate 200a.

In this implementation, the first electrical element 100b includes a first shallow trench isolation (STI) region 11 and a second shallow trench isolation region 12. The first shallow trench isolation region 11 and the second shallow trench isolation region 12 are embedded into the first substrate 100a from the first surface 100c. In addition, one end of the first shallow trench isolation region 11 is flush with the first surface 100c, and one end of the second shallow trench isolation region 12 is flush with the first surface 100c. The second shallow trench isolation region 12 and the first shallow trench isolation region 11 are disposed opposite to each other and separated by a part of the first substrate 100a.

The second electrical element 200b includes a third shallow trench isolation region 13 and a fourth shallow trench isolation region 14. The third shallow trench isolation region 13 and the fourth shallow trench isolation region 14 are embedded into the second substrate 200a from the third surface 200c. In addition, one end of the third shallow trench isolation region 13 is flush with the third surface 200c, and one end of the fourth shallow trench isolation region 14 is flush with the third surface 200c. The fourth shallow trench isolation region 14 and the third shallow trench isolation region 13 are disposed opposite to each other and separated by a part of the second substrate 200a. The first shallow trench isolation region 11, the second shallow trench isolation region 12, the third shallow trench isolation region 13, and the fourth shallow trench isolation region 14 may be formed by using a CMOS process on the first substrate 100a and the second substrate 200a to implement shallow trench isolation.

The first electrical element 100b in the tunnel field-effect transistor 100 further includes a first drain region 110, a second drain region 120, a first source region 130, a first insulation layer 140, a first gate dielectric layer 150, and a first gate region 160. The first drain region 110 and the second drain region 120 are embedded into the first substrate 100a from the first surface 100c. In addition, one end of the first drain region 110 is flush with the first surface 100c, and one end of the second drain region 120 is flush with the first surface 100c. The first drain region 110 and the second drain region 120 are opposite to each other, separated by a part of the first substrate 100a, and disposed between the first shallow trench isolation region 11 and the second shallow trench isolation region 12. The first drain region 110 is in contact with the first shallow trench isolation region 11. The second drain region 120 is in contact with the second shallow trench isolation region 12. The first source region 130 is disposed in a protruding manner on the first surface 100c, and the first source region 130 is located between the first drain region 110 and the second drain region 120. A structure of the first source region 130 in the present disclosure can improve a speed of controlling, by the tunnel field-effect transistor, enabling and disabling between the first drain region and the second drain region 120. The first insulation layer 140 is disposed in a protruding manner on the first surface 100c. The first insulation layer 140 is symmetrically disposed on both sides of the first source region 130, and connected to a region between the first drain region 110 and the first source region 130 and a region between the second drain region 120 and the first source region 130. A thickness of the first insulation layer 140 is less than a height of the first source region 130. The first insulation layer 140 is used to block the control of the first gate region 160 over the first substrate 100a, to prevent leakage of an electric current in the first drain region 110 and the second drain region 120. The first gate dielectric layer 150 is symmetrically disposed on the both sides of the first source region 130 and is attached to a surface of the first source region 130 and a surface of the first insulation layer 140. The first gate region 160 is disposed around the first gate dielectric layer 150.

In this implementation, the first substrate 100a and the second substrate 200a may be silicon (Si) substrates. In another implementation, the first substrate 100a and the second substrate 200a may be any one of: germanium (Ge), a binary II-IV, III-V, or IV-IV compound semiconductor such as silicon germanium or gallium arsenide, a ternary compound semiconductor, silicon on insulator (SOI), or germanium on insulator.

The first drain region 110 and the second drain region 120 may be formed by injecting first-type ion heavy doping into the first surface 100c of the first substrate 100a.

The first gate dielectric layer 150 includes a first gate dielectric portion 151 and a second gate dielectric portion 152. The first gate dielectric portion 151 is stacked on the first insulation layer 140. One end of the second gate dielectric portion 152 is connected to the first gate dielectric portion 151, and the second gate dielectric portion 152 is attached to a surface of the first source region 130.

The first gate region 160 includes a first part 161 and a second part 162. The first part 161 is stacked on the first gate dielectric portion 150. One end of the second part 162 is connected to one end of the first part 161, and the second part 162 is attached to a surface of the second gate dielectric portion 152.

The first electrical element 100b in the tunnel field-effect transistor 100 further includes a first drain 171, a second drain 172, a first source 173, and two first gates 174. The first drain 171, the second drain 172, the first source 173, and the two first gates 174 are correspondingly connected to the first drain region 110, the second drain region 120, the first source region 130, and the first gate region 160, respectively. In this implementation, the two first gates 174 are connected to the second part 162 and respectively disposed on both sides of the first source 173. In other words, the first electrical element 100b in the tunnel field-effect transistor 100 includes the first drain 171, the second drain 172, the first source 173, and the two first gates 174. The first drain 171 is connected to the first drain region 110. The second drain 172 is connected to the second drain region 120. The first source 173 is connected to the first source region 130. The two first gates 174 are connected to the second part 162 of the first gate region 160, and the two first gates 174 are located on the both sides of the first source 173.

The first electrical element 100b in the tunnel field-effect transistor 100 further includes a first isolation layer 180. The first isolation layer 180 covers the first drain region 110, the second drain region 120, the first source region 130, and the first gate region 160. A first through hole 181, a second through hole 182, a third through hole 183, a fourth through hole 184, and a fifth through hole 185 are disposed at the first isolation layer 180. The fourth through hole 184 and the fifth through hole 185 are disposed on both sides of the third through hole 183. The first through hole 181 is disposed corresponding to the first drain region 110, and the first drain 171 is connected to the first drain region 110 by using the first through hole 181. The second through hole 182 is disposed corresponding to the second drain region 120, and the second drain 172 is connected to the second drain region 120 by using the second through hole 182. The third through hole 183 is disposed corresponding to the first source region 130, and the first source 173 is connected to the first source region 130 by using the third through hole 183. The fourth through hole 184 and the fifth through hole 185 are separately disposed corresponding to the second part 162 of the first gate region 160, and the two first gates 174 are connected to the second part 162 of the first gate region 160 respectively by using the fourth through hole 184 and the fifth through hole 185.

The first electrical element 100b in the tunnel field-effect transistor 100 further includes at least one of a first ohmic contact layer 191, a second ohmic contact layer 192, a third ohmic contact layer 193, a fourth ohmic contact layer 194, or a fifth ohmic contact layer 195. The first ohmic contact layer 191 is disposed between the first drain 171 and the first drain region 110, to connect the first drain 171 and the first drain region 110. The first ohmic contact layer 191 is used to reduce contact resistance between the first drain 171 and the first drain region 110. The second ohmic contact layer 192 is disposed between the second drain 172 and the second drain region 120, to connect the second drain 172 and the second drain region 120. The second ohmic contact layer 192 is used to reduce contact resistance between the second drain 172 and the second drain region 120. The third ohmic contact layer 193 is disposed between the first source 173 and the first source region 130, to connect the first source 173 and the first source region 130. The third ohmic contact layer 193 is used to reduce contact resistance between the first source 173 and the first source region 130. The fourth ohmic contact layer 194 is disposed between a first first-gate 174 and the second part 162 of the first gate region 160, to connect the first first-gate 174 and the second part 162 of the first gate region 160. The fourth ohmic contact layer 194 is used to reduce contact resistance between the first first-gate 174 and the second part 162 of the first gate region 160. The fifth ohmic contact layer 195 is disposed between a second first-gate 174 and the second part 162 of the first gate region 160, to connect the second first-gate 174 and the second part 162 of the first gate region 160. The fifth ohmic contact layer 195 is used to reduce contact resistance between the second first-gate 174 and the second part 162 of the first gate region 160.

Figure 3:
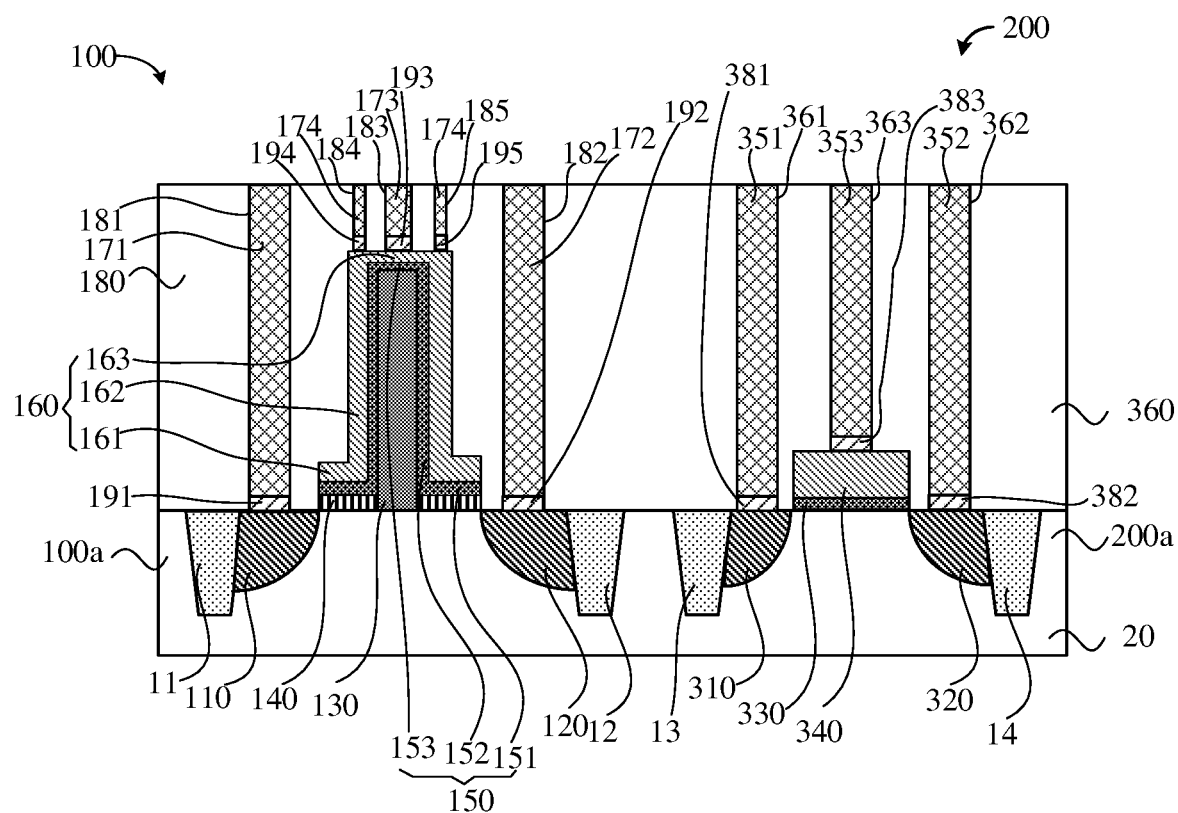
FIG. 3 is a schematic cross-sectional structural diagram of another example implementation when a planar device in the semiconductor device in FIG. 1 of the present disclosure is an MOS.

In another implementation, referring to FIG. 3, FIG. 3 is a schematic cross-sectional structural diagram of another example implementation when a planar device in the semiconductor device in FIG. 1 of the present disclosure is an MOS. The first gate dielectric layer 150 further includes a third gate dielectric portion 153. The third gate dielectric portion 153 is connected to one end, of the second gate dielectric portion 152, that is away from the first gate dielectric portion 151, and the third gate dielectric portion 153 covers one end, of the first source region 130, that is away from the first substrate 100a. Correspondingly, the first gate region 160 includes a third part 163. The third part 163 is connected to one end, of the second part 162, that is away from the first part 161, and the third part 163 covers the third gate dielectric portion 153.

Correspondingly, the first electrical element 100b in the tunnel field-effect transistor 100 further includes a first drain 171, a second drain 172, a first source 173, and three first gates 174. The first drain 171, the second drain 172, the first source 173, and the three first gates 174 are correspondingly connected to the first drain region 110, the second drain region 120, the first source region 130, and the first gate region 160, respectively. In this implementation, two of the three first gates 174 are connected to the second part 162 and respectively disposed on both sides of the first source 173, and the other one first gate 174 is connected to the third part 163. In other words, the tunnel field-effect transistor 100 includes the first drain 171, the second drain 172, the first source 173, and the three first gates 174. The first drain 171 is connected to the first drain region 110. The second drain 172 is connected to the second drain region 120. The first source 173 is connected to the first source region 130. The two first gates 174 are connected to the second part 162 of the first gate region 160, and the two first gates 174 are located on the both sides of the first source 173. The third first-gate 174 is connected to the third part 163.

In this implementation, the first electrical element 100b in the tunnel field-effect transistor 100 further includes a first isolation layer 180. The first isolation layer 180 covers the first drain region 110, the second drain region 120, the first source region 130, and the first gate region 160. A first through hole 181, a second through hole 182, a third through hole 183, a fourth through hole 184, a fifth through hole 185, and a sixth through hole 186 are disposed at the first isolation layer 180. The first through hole 181 is disposed corresponding to the first drain region 110, and the first drain 171 is connected to the first drain region 110 by using the first through hole 181. The second through hole 182 is disposed corresponding to the second drain region 120, and the second drain 172 is connected to the second drain region 120 by using the second through hole 182. The third through hole 183 is disposed corresponding to the first source region 130, and the first source 173 is connected to the first source region 130 by using the third through hole 183. The fourth through hole 184 and the fifth through hole 185 are respectively disposed on both sides of the third through hole 183. The fourth through hole 184 and the fifth through hole 185 are separately disposed corresponding to the second part 162 of the first gate region 160. The sixth through hole 186 is disposed corresponding to the third part 163. The two first gates 174 are connected to the second part 162 of the first gate region 160 respectively by using the fourth through hole 184 and the fifth through hole 185, and the other one first gate 174 is connected to the third part 163 by using the sixth through hole 186.

The first electrical element 100b in the tunnel field-effect transistor 100 further includes at least one of a first ohmic contact layer 191, a second ohmic contact layer 192, a third ohmic contact layer 193, a fourth ohmic contact layer 194, a fifth ohmic contact layer 195, or a sixth ohmic contact layer 196. The first ohmic contact layer 191 is disposed between the first drain 171 and the first drain region 110, to connect the first drain 171 and the first drain region 110. The first ohmic contact layer 191 is used to reduce contact resistance between the first drain 171 and the first drain region 110. The second ohmic contact layer 192 is disposed between the second drain 172 and the second drain region 120, to connect the second drain 172 and the second drain region 120. The second ohmic contact layer 192 is used to reduce contact resistance between the second drain 172 and the second drain region 120. The third ohmic contact layer 193 is disposed between the first source 173 and the first source region 130, to connect the first source 173 and the first source region 130. The third ohmic contact layer 193 is used to reduce contact resistance between the first source 173 and the first source region 130. The fourth ohmic contact layer 194 is disposed between a first first-gate 174 and the second part 162 of the first gate region 160, to connect the first first-gate 174 and the second part 162 of the first gate region 160. The fourth ohmic contact layer 194 is used to reduce contact resistance between the first first-gate 174 and the second part 162 of the first gate region 160. The fifth ohmic contact layer 195 is disposed between a second first-gate 174 and the second part 162 of the first gate region 160, to connect the second first-gate 174 and the second part 162 of the first gate region 160. The fifth ohmic contact layer 195 is used to reduce contact resistance between the second first-gate 174 and the second part 162 of the first gate region 160. The sixth ohmic contact layer is disposed between a third first-gate 174 and the third part 163 of the first gate region 160, to connect the third first-gate 174 and the third part 163 of the first gate region 160. The sixth ohmic contact layer 196 is used to reduce contact resistance between the third first-gate 174 and the third part 163 of the first gate region 160.

Referring to FIG. 2 and FIG. 3, when the planar device 200 is the metal oxide semiconductor transistor, the second electrical element 200b includes a second source region 310, a third drain region 320, a second gate dielectric layer 330, and a second gate region 340.

The second source region 310 and the third drain region 320 are embedded into the second substrate 200a from the third surface 200c. One end of the second source region 310 is flush with the third surface 200c. One end of the third drain region 320 is flush with the third surface 200c. The second source region 310 and the third drain region 320 are opposite to each other, separated by a part of the second substrate 200a, and disposed between the third shallow trench isolation region 13 and the fourth shallow trench isolation region 14. The second source region 310 is in contact with the third shallow trench isolation region 13. The third drain region 320 is in contact with the fourth shallow trench isolation region 14. In this implementation, the second source region 310 and the third drain region 320 are located at a same layer as the first drain region 110 and the second drain region 120. The second gate dielectric layer 330 is disposed in a protruding manner on the third surface 200c, and the second gate dielectric layer 330 is disposed between the second source region 310 and the third drain region 320. The second gate region 340 is disposed at the second gate dielectric layer 330, and the second gate region 340 is in contact with the second gate dielectric layer 330.

The second electrical element 200b further includes a second source 351, a third drain 352, and a second gate 353. The second source 351, the third drain 352, and the second gate 353 are correspondingly connected to the second source region 310, the third drain region 320, and the second gate region 340. In other words, the second electrical element 200b in the metal oxide semiconductor transistor 300 includes the second source 351, the third drain 352, and the second gate 353. The second source 351 is connected to the second source region 310. The third drain 352 is connected to the third drain region 320. The second gate 353 is connected to the second gate region 340.

The second electrical element 200b further includes a second isolation layer 360. The second isolation layer 360 and the first isolation layer 180 are located at a same layer. The second isolation layer 360 covers the second source region 310, the third drain region 320, and the second gate region 340. A seventh through hole 361, an eighth through hole 362, and a ninth through hole 363 are disposed at the second isolation layer 360. The seventh through hole 361 is disposed corresponding to the second source region 310, and the second source 351 is connected to the second source region 310 by using the seventh through hole 361. The eighth through hole 362 is disposed corresponding to the third drain region 320, and the third drain 352 is connected to the third drain region 320 by using the eighth through hole 362. The ninth through hole 363 is disposed corresponding to the second gate region 340, and the second gate 353 is connected to the second gate region 340 by using the ninth through hole 363.

Preferably, the second electrical element 200b further includes at least one of a seventh ohmic contact layer 381, an eighth ohmic contact layer 382, or a ninth ohmic contact layer 383. The seventh ohmic contact layer 381 is disposed between the second source 351 and the second source region 310, and used to reduce contact resistance between the second source 351 and the second source region 310. The eighth ohmic contact layer 382 is disposed between the third drain 352 and the third drain region 320. The eighth ohmic contact layer 382 is used to reduce contact resistance between the third drain 352 and the third drain region 320. The ninth ohmic contact layer 383 is disposed between the second gate 353 and the second gate region 340. The ninth ohmic contact layer 383 is used to reduce contact resistance between the second gate 353 and the second gate region 340.

The first drain region 110, the second drain region 120, the second source region 310, and the third drain region 320 are first-type ion heavily-doped regions. The first source region 130 is a second-type ion heavily-doped region. The first-type ion heavily-doped region is an N-type ion heavily-doped region, and the second-type ion heavily-doped region is a P-type ion heavily-doped region. Alternatively, the first-type ion heavily-doped region is a P-type ion heavily-doped region, and the second-type ion heavily-doped region is an N-type ion heavily-doped region.

Figure 4:
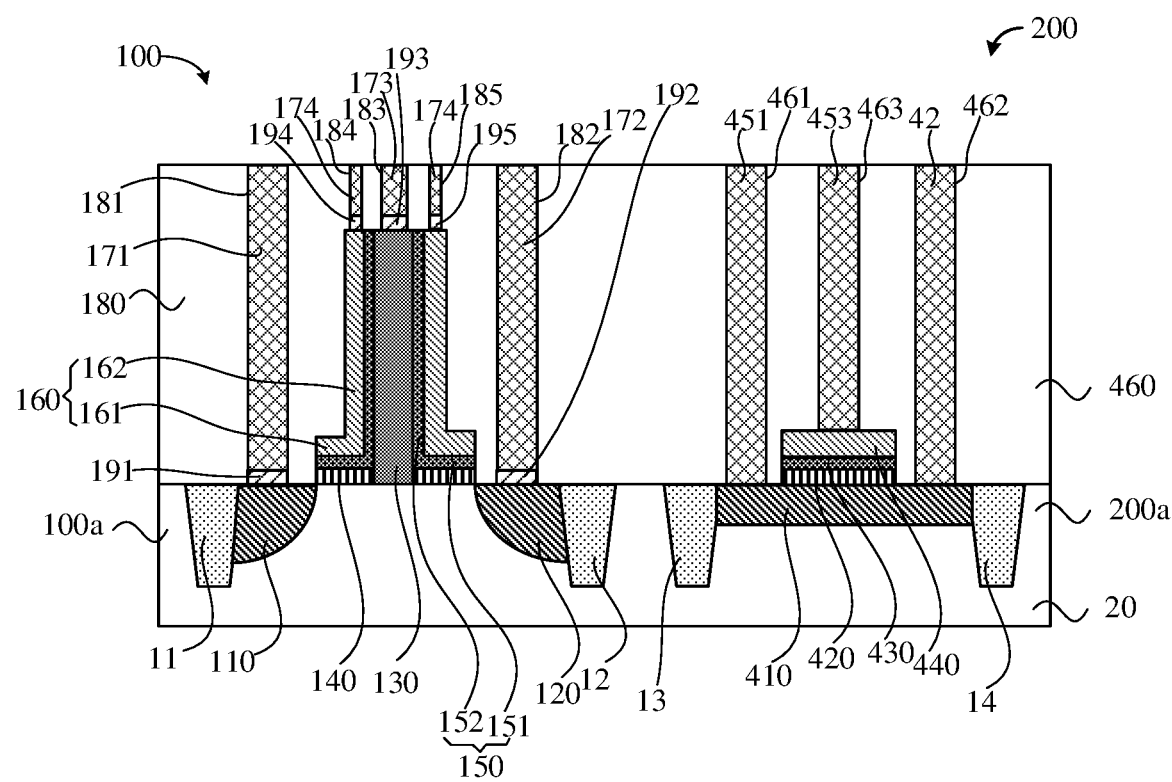
FIG. 4 is a schematic structural diagram of an I-I cross section in an example implementation when a planar device in the semiconductor device in FIG. 1 of the present disclosure is a capacitor.
Figure 5:
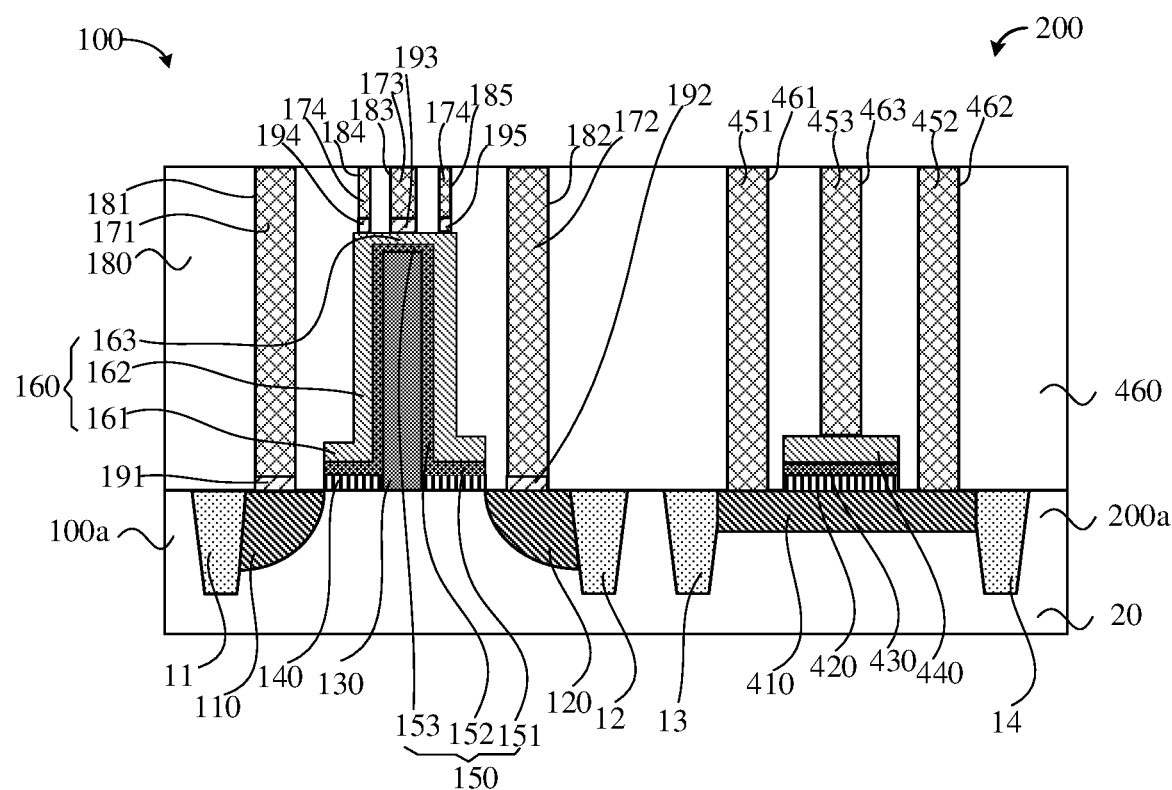
FIG. 5 is a schematic structural diagram of an I-I cross section in another example implementation when a planar device in the semiconductor device in FIG. 1 of the present disclosure is a capacitor.

Referring to FIG. 4 and FIG. 5, FIG. 4 is a schematic structural diagram of an I-I cross section in an example implementation when a planar device in the semiconductor device in FIG. 1 of the present disclosure is a capacitor, and FIG. 5 is a schematic structural diagram of an I-I cross section in another example implementation when a planar device in the semiconductor device in FIG. 1 of the present disclosure is a capacitor. When the planar device 200 is a capacitor, the second electrical element 200b includes a first doping region 410, a second insulation layer 420, a third gate dielectric layer 430, and a third gate region 440. The first doping region 410 is embedded into the second substrate 200a from the third surface 200c. One end of the first doping region 410 is flush with the third surface 200c. The first doping region 410 is disposed between the third shallow trench isolation region 13 and the fourth shallow trench isolation region 14. One end of the first doping region 410 is in contact with the third shallow trench isolation region 13, and the other end of the first doping region 410 is in contact with the fourth shallow trench isolation region 14. In addition, the first doping region 410 is located at a same layer as the first drain region 110 and the second drain region 120. The second insulation layer 420 is disposed in the middle of the first doping region 410, and the second insulation layer 420 does not cover the both ends of the first doping region 410. The second insulation layer 420 is located at a same layer as the first insulation layer 140. The third gate dielectric layer 430 is stacked on the second insulation layer 420. The third gate region 440 is stacked on the third gate dielectric layer 430. In this implementation, the first doping region 410 and the third gate region 440 constitute two opposite plates of the capacitor 400, and the second insulation layer 420 and the third gate dielectric layer 430 constitute a dielectric layer of the capacitor 400. The first doping region 410 may be formed by performing first-type ion heavy doping on the substrate 20.

The second electrical element 200b further includes a first electrode 451, a second electrode 452, and a third electrode 453. The first electrode 451 and the second electrode 452 are correspondingly connected to the both ends of the first doping region 410. The third electrode 453 is connected to the third gate region 440. In this implementation, the first electrode 451 and the second electrode 452 are respectively disposed on both sides of the third electrode 453. The first electrode 451 and the second electrode 452 are disposed to connect to the both ends of the first doping region 410, so that when the capacitor 400 is applied, the first electrode 451 and the third electrode 453, or the second electrode 452 and the third electrode 453 are chosen to be connected depending on a location relationship between the capacitor 400 and another device.

The second electrical element 200b further includes a third isolation layer 460. The third isolation layer 460 is disposed on a surface of the first doping region 410 that is not covered by the second insulation layer 420 and a surface of the third gate region 440. A tenth through hole 461, an eleventh through hole 462, and a twelfth through hole 463 are disposed at the third isolation layer 460. The tenth through hole 461 is disposed corresponding to one end of the first doping region 410, and the first electrode 451 is connected to one end of the first doping region 410 by using the tenth through hole 461. The eleventh through hole 462 is disposed corresponding to the other end of the first doping region 410, and the second electrode 452 is connected to the other end of the first doping region 410 by using the eleventh through hole 462. The twelfth through hole 463 is disposed corresponding to the third gate region 440, and the third electrode 453 is connected to the third gate region 440 by using the twelfth through hole 463.

It can be understood that in this implementation, the second electrical element 200b further includes at least one ohmic contact layer. The ohmic contact layer is disposed between the first electrode 451, the second electrode 452, and the third electrode 453, and layers corresponding to the electrodes, so as to reduce contact resistance between the electrodes and the corresponding connected-to layers. For example, the ohmic contact layer is disposed between the first electrode 451 and the first doping region 410, to connect the first electrode 451 and the first doping region 410, so as to reduce contact resistance between the first electrode 451 and the first doping region 410.

Figure 6:
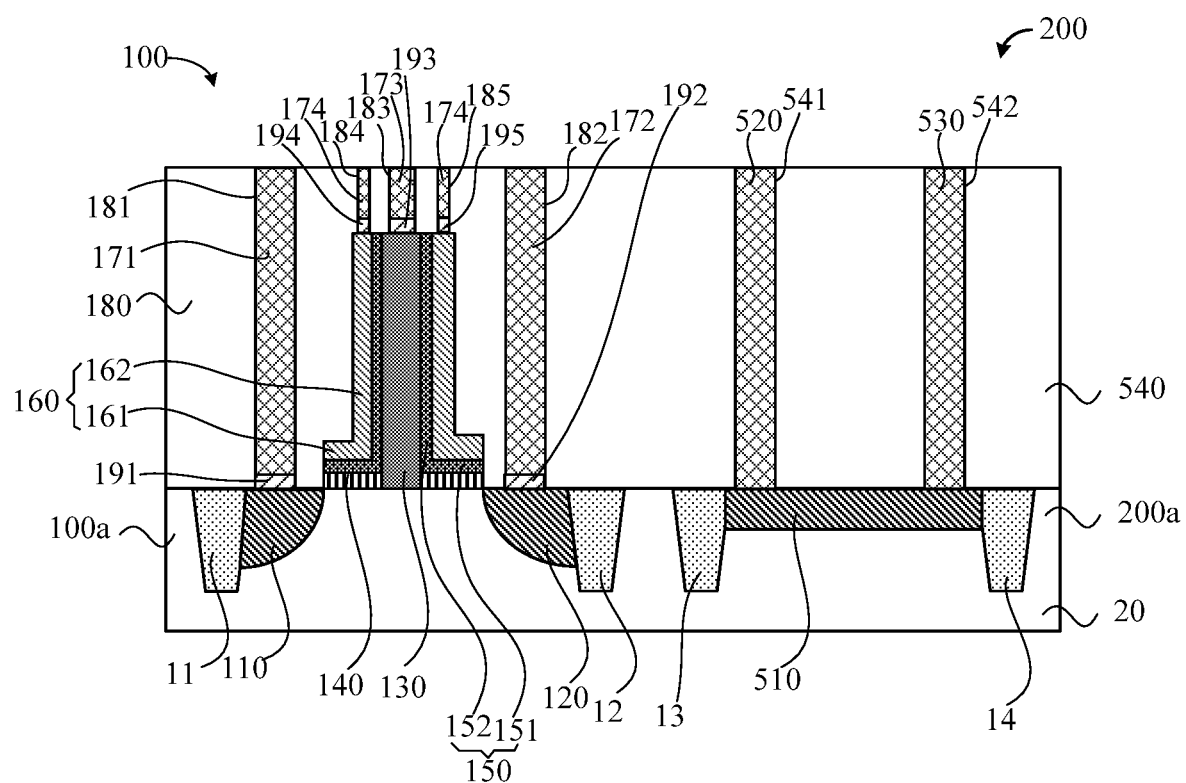
FIG. 6 is a schematic structural diagram of an I-I cross section in an example implementation when a planar device in the semiconductor device in FIG. 1 of the present disclosure is a resistor.
Figure 7:
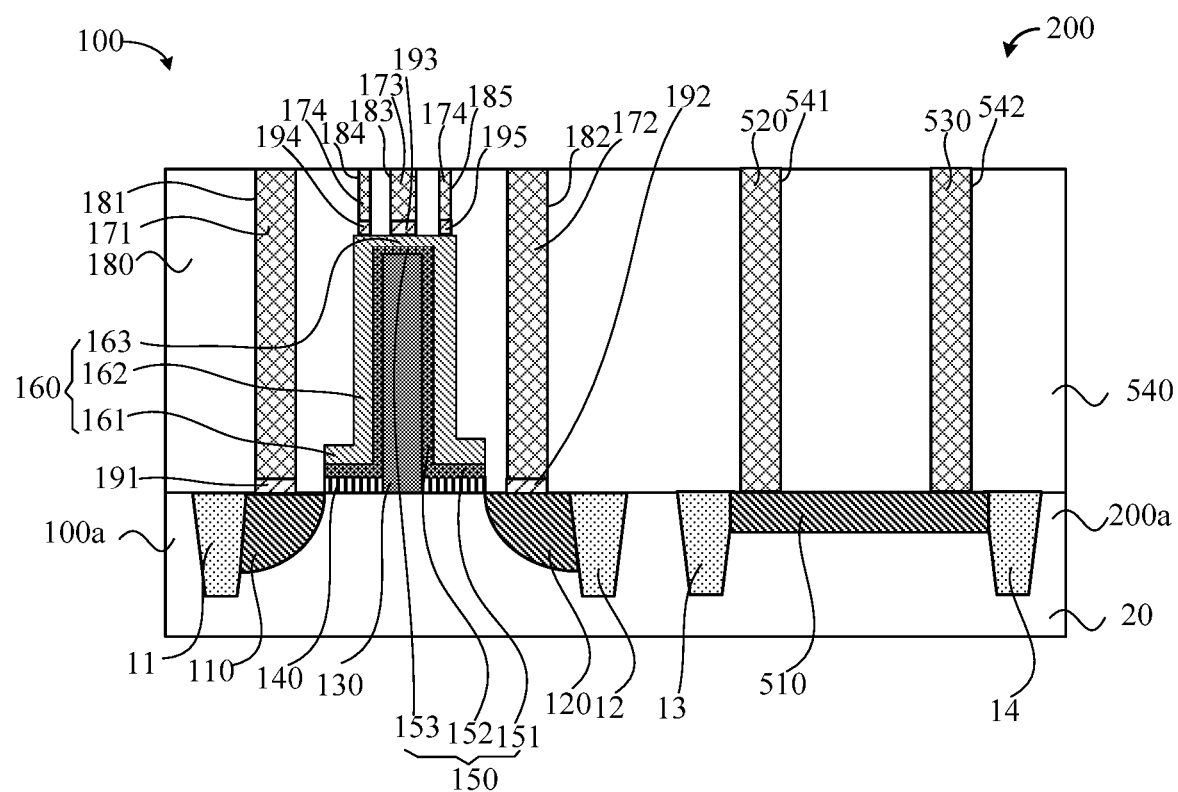
FIG. 7 is a schematic structural diagram of an I-I cross section in another example implementation when a planar device in the semiconductor device in FIG. 1 of the present disclosure is a resistor.

Referring to FIG. 6 and FIG. 7, FIG. 6 is a schematic structural diagram of an I-I cross section in an example implementation when a planar device in the semiconductor device in FIG. 1 of the present disclosure is a resistor, and FIG. 7 is a schematic structural diagram of an I-I cross section in another example implementation when a planar device in the semiconductor device in FIG. 1 of the present disclosure is a resistor. When the planar device 200 is a resistor, the second electrical element 200b includes a second doping region 510. The second doping region 510 is embedded into the second substrate 200a from the third surface 200c. One end of the second doping region 510 is flush with the third surface 200c. The second doping region 510 is disposed between the third shallow trench isolation region 13 and the fourth shallow trench isolation region 14. One end of the second doping region 510 is in contact with the third shallow trench isolation region 13, and the other end of the second doping region 510 is in contact with the fourth shallow trench isolation region 14. In addition, the second doping region 510 is located at a same layer as the first drain region 110 and the second drain region 120. A resistance value of the resistor 500 can be controlled by controlling a concentration of ions doped in the second doping region 510. The second doping region 510 may be formed by performing first-type ion heavy doping on the substrate 20.

The second electrical element 200b further includes a fourth electrode 520 and a fifth electrode 530. The fourth electrode 520 and the fifth electrode 530 are correspondingly connected to the both ends of the second doping region 510, respectively. The fourth electrode 520 and the fifth electrode 530 are used to electrically connect the resistor 500 and another element.

The second electrical element 200b further includes a fourth isolation layer 540. The fourth isolation layer 540 covers the second doping region 510. A twelfth through hole 541 and a thirteenth through hole 542 are disposed at the fourth isolation layer 540. The twelfth through hole 541 and the thirteenth through hole 542 are disposed corresponding to the both ends of the second doping region 510. The fourth electrode 520 is connected to one end of the second doping region 510 by using the twelfth through hole 541. The fifth electrode 530 is connected to the other end of the second doping region 510 by using the thirteenth through hole 542.

Compared with that in the prior art, the semiconductor device 10 in the present disclosure includes the tunnel field-effect transistor 100 and the planar device 200. The tunnel field-effect transistor 100 includes the first substrate 100a and the first electrical element 100b formed on one side of the first substrate 100a. The planar device 200 includes the second substrate 200a and the second electrical element 200b formed on one side of the second substrate 200a. The first substrate 100a and the second substrate 200a are an integrated structure and form the main substrate 20, and the first electrical element 100b in the tunnel field-effect transistor 100 and the second electrical element 200b in the planar device 200 are disposed on the same surface of the main substrate 20. Compared with the prior art that a tunnel field-effect transistor 100 and a planar device 200 are fabricated on different baseplates and then integrated on a same substrate, the semiconductor device 10 in the present disclosure is smaller in size, and process complexity and implementation costs are reduced.

Figure 8:
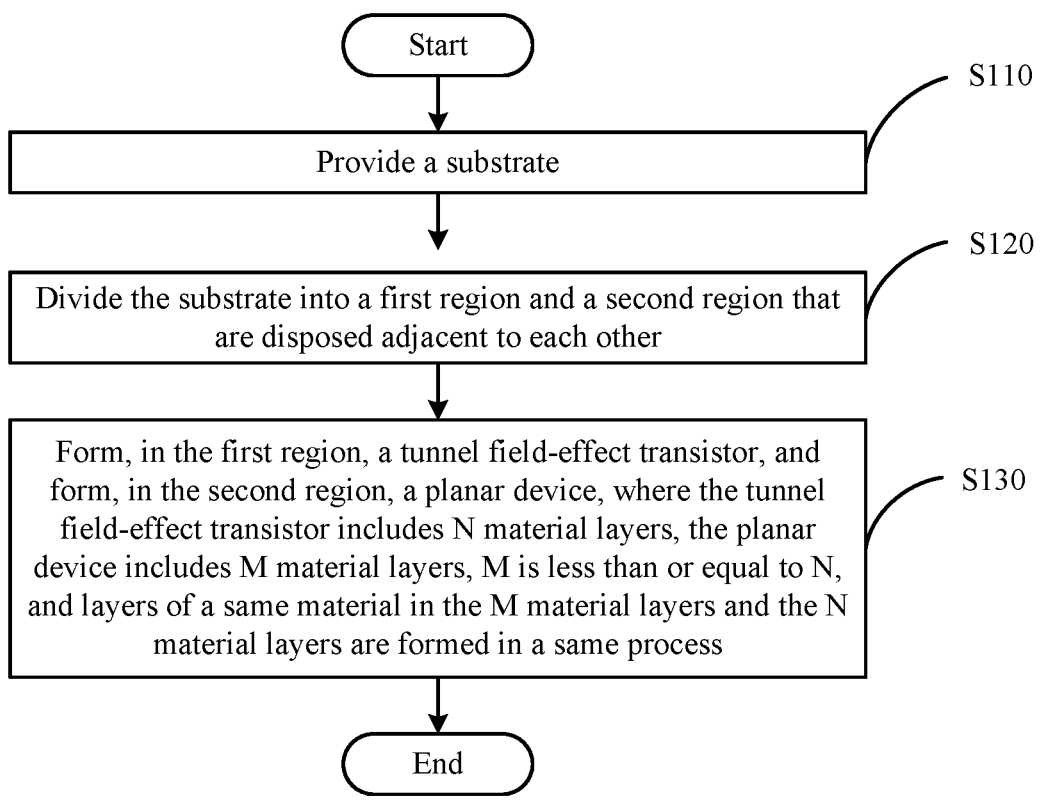
FIG. 8 is a flowchart of a method for fabricating a semiconductor device according to an example implementation of the present disclosure.

The following describes a method for fabricating a semiconductor device in an example implementation of the present disclosure with reference to FIG. 1, FIG. 2, and FIG. 3. Referring to FIG. 8, FIG. 8 is a flowchart of the method for fabricating a semiconductor device according to the example implementation of the present disclosure. In short, a process solution of implementing integration of the tunnel field-effect transistor (Tunnel Field Effect Transistor, TFET) 100 and the planar device 200 in the method for fabricating a semiconductor device of the present disclosure is referred to as a drain-first process solution. In the drain-first process solution, anion injection process is first used to implement the first drain region 110 and the second drain region 120 that are in the tunnel field-effect transistor 100, and the second source region 310 and the third drain region 320 that are in the metal oxide semiconductor transistor 300 in a second region 20b. Then, an in-situ doping process and an etching process are used to implement the first source region 130. A dielectric material layer 217 and a gate material layer 218 are deposited and an etching process is used, to implement the first gate region 160 and the second gate region 340. Finally, a contact process in a CMOS standard process is used to implement metal contact in the entire semiconductor device 10. Specifically, the method for fabricating a semiconductor device includes, but is not limited to, the following steps.

Figure 9:
FIG. 9 to FIG. 34 are schematic diagrams of fabrication steps in a fabrication method of a semiconductor device in which a planar device is an MOS according to an example implementation of the present disclosure.
Figure 10:
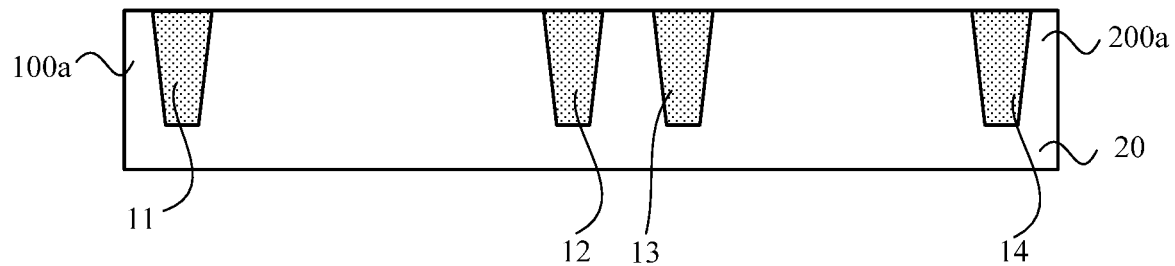

Step S110: Provide the main substrate 20, where the main substrate includes the first substrate 100a and the second substrate 200a that are adjacent to each other; the first substrate 100a includes the first surface 100c and the second surface 100d that are disposed opposite to each other; the second substrate 200a includes the third surface 200c and the fourth surface 200d that are disposed opposite to each other; the third surface 200c is flush with the first surface 100c; and the fourth surface 200d is flush with the second surface 100d. Referring to FIG. 9, the main substrate 20 may be a silicon (Si) substrate. In another implementation, the main substrate 20 may be any one of: germanium (Ge), a binary II-IV, III-V, or IV-IV compound semiconductor such as silicon germanium or gallium arsenide, a ternary compound semiconductor, silicon on insulator (SOI), or germanium on insulator.

Step S120: Form the first electrical element 100b on one side of the first substrate 100a, and form the second electrical element 200b on one side of the second substrate 200a, where the second electrical element 200b and the first electrical element 100b are disposed on a same side of the main substrate 20; the first substrate 100a and the first electrical element 100b constitute the tunnel field-effect transistor 100; and the second substrate 200a and the second electrical element 200b constitute the planar device 200, where the planar device 200 includes any one of a metal oxide semiconductor transistor, a capacitor, and a resistor.

The first electrical element 100b includes N material layers, and the second electrical element 200b includes M material layers, where M is less than or equal to N. Layers of a same material in the M material layers and the N material layers are formed in a same process.

The step S120 in the method for fabricating a semiconductor device further includes step S130.

Step S130: Form, from the first surface 100c, the first shallow trench isolation region 11 and the second shallow trench isolation region 12 that are embedded into the first substrate 100a, and form, from the third surface 200c, the third shallow trench isolation region 13 and the fourth shallow trench isolation region 14 that are embedded into the second substrate 200a, where one end of the first shallow trench isolation region 11 is flush with the first surface 100c; one end of the second shallow trench isolation region 12 is flush with the first surface 100c; the second shallow trench isolation region 12 and the first shallow trench isolation region 11 are disposed opposite to each other and separated by a part of the first substrate 100a; one end of the third shallow trench isolation region 13 is flush with the third surface 200c; one end of the fourth shallow trench isolation region 14 is flush with the third surface 200c; and the fourth shallow trench isolation region 14 and the third shallow trench isolation region 13 are disposed opposite to each other and separated by a part of the second substrate.

The planar device 200 may be the metal oxide semiconductor transistor 300, the capacitor 400, or the resistor 500. When the planar device 200 is the metal oxide semiconductor transistor, after the step S130, the step S120 further includes the following steps:

Step S131a: Form, from the first surface 100c, the first drain region 110 and the second drain region 120 that are embedded into the first surface 100c, and form, from the second surface 200c, the second source region 310 and the third drain region 320 that are embedded into the second surface 200c, where one end of the first drain region is flush with the first surface 100c, one end of the second drain region 120 is flush with the first surface 100c, the first drain region 110 and the second drain region 120 are opposite to each other, separated by a part of the first substrate 100a, and disposed between the first shallow trench isolation region 11 and the second shallow trench isolation region 12, the first drain region 110 is in contact with the first shallow trench isolation region 11, and the second drain region 120 is in contact with the second shallow trench isolation region 12; and one end of the second source region 310 is flush with the third surface 200c, one end of the third drain region 320 is flush with the third surface 200c, the second source region 310 and the third drain region 320 are opposite to each other, separated by apart of the second substrate 200a, and disposed between the third shallow trench isolation region 13 and the fourth shallow trench isolation region 14, the second source region 310 is in contact with the third shallow trench isolation region 13, and the third drain region 320 is in contact with the fourth shallow trench isolation region 14.

Step S132a: Form the first source region 130. The first source region 130 is disposed in a protruding manner on the first surface 100c, and the first source region 130 is located between the first drain region 110 and the second drain region 120.

Step S133a: Form the first insulation layer 140. The first insulation layer 140 is disposed in a protruding manner on a surface of the substrate. The first insulation layer 140 is symmetrically disposed on both sides of the first source region 130, and connected to a region between the first drain region 110 and the first source region 130 and a region between the second drain region 120 and the first source region 130. A thickness of the first insulation layer 140 is less than a height of the first source region 130.

Step S134a: Form the first gate dielectric layer 150 and the second gate dielectric layer 330 that are disposed at intervals. The first gate dielectric layer 150 is symmetrically disposed on the both sides of the first source region 130 and is attached to a surface of the first source region 130 and a surface of the first insulation layer 140. The second gate dielectric layer 330 is disposed in a protruding manner on the surface of the substrate 20, and the second gate dielectric layer 330 is disposed between the second source region 310 and the third drain region 320.

Step S135a: Form the first gate region 160 and the second gate region 340. The first gate region 160 is disposed around the first gate dielectric layer 150. The second gate region 340 is disposed at the second gate dielectric layer 330, and the second gate region 340 is in contact with the second gate dielectric layer 330.

In an implementation, the first drain region 110, the second drain region 120, the second source region 310, and the third drain region 320 are regions obtained by performing first-type ion heavy-doping on the main substrate 20; and the first source region 130 is a second-type ion heavily-doped region. The first-type ion heavy-doping is N-type ion heavy-doping, and the second-type ion heavy-doping is P-type ion heavy-doping. Alternatively, the first-type ion heavy-doping is P-type ion heavy-doping, and the second-type ion heavy-doping is N-type ion heavy-doping.

If a material of the main substrate 20 is silicon, an impurity used during the N-type ion doping may be any one or more of Li, Sb, P, As, Bi, Te, Ti, C, Mg, Se, Cr, Ta, Cs, Ba, S, Mn, Ag, Cd, or Pt, and an impurity used during the P-type ion doping may be any one or more of B, Al, Ga, In, Ti, Pd, Na, Be, Zn, Au, Co, V, Ni, MO, Hg, Sr, Ge, W, Pb, O, or Fe. If a material of the substrate 20 is germanium, an impurity used during the N-type ion doping may be any one or more of Li, Sb, P, As, S, Se, Te, Cu, Au, or Ag, and an impurity used during the P-type ion doping may be any one or more of B, Al, In, Ga, In, Be, Zn, Cr, Cd, Hg, Co, Ni, Mn, Fe, or Pt. During the P-type ion doping, an ion doping concentration ranges from 1e18 to 1e21 cm−3. During the N-type ion doping, an ion doping concentration ranges from 1e18 to 1e20 cm−3.

Preferably, between the step S131a and the step S132a, the method for fabricating a semiconductor device further includes: performing annealing processing on the main substrate 20. The performing annealing processing on the main substrate 20 may be processing the main substrate 20 by using a rapid annealing process or a laser annealing process, to activate ions doped in the first drain region 110, the second drain region 120, the second source region 310, and the third drain region 320.

Figure 11:
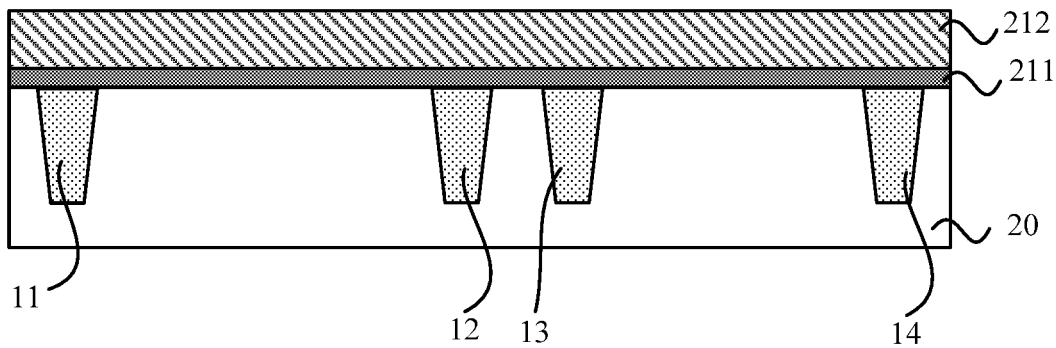

In an implementation of the present disclosure, specifically, the step S131a includes the following steps:

Step S131a-I: Stack an oxide layer 211 and a first hard mask layer 212 in sequence on a same surface of the main substrate 20. Refer to FIG. 11.

Figure 12:
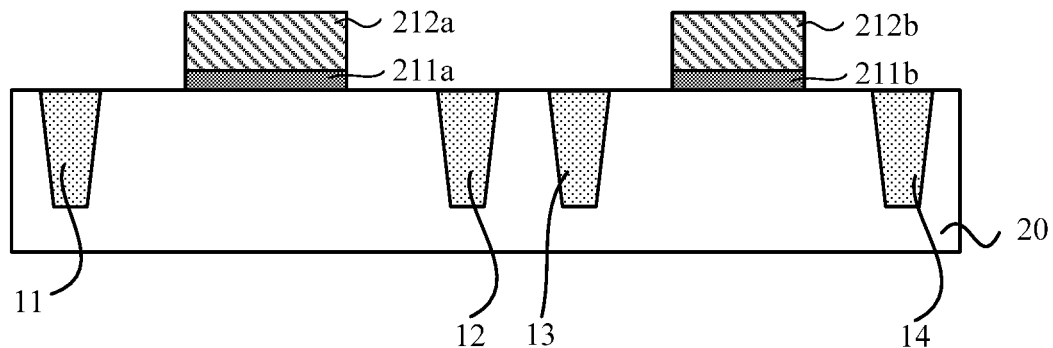

Step S131a-II: Pattern the oxide layer 211 and the first hard mask layer 212, to retain a first oxide portion 211a and a first hard mask portion 212a, and a second oxide portion 211b and a second hard mask portion 212b, where the first oxide portion 211a, the first shallow trench isolation region 11, and the second shallow trench isolation region 12 are disposed at intervals; the first hard mask portion 212a is stacked on the first oxide portion 211a; the second oxide portion 211b, the third shallow trench isolation region 13, and the fourth shallow trench isolation region 14 are disposed at intervals; and the second hard mask portion 212b is stacked on the second oxide portion 211b. Refer to FIG. 12.

Figure 13:
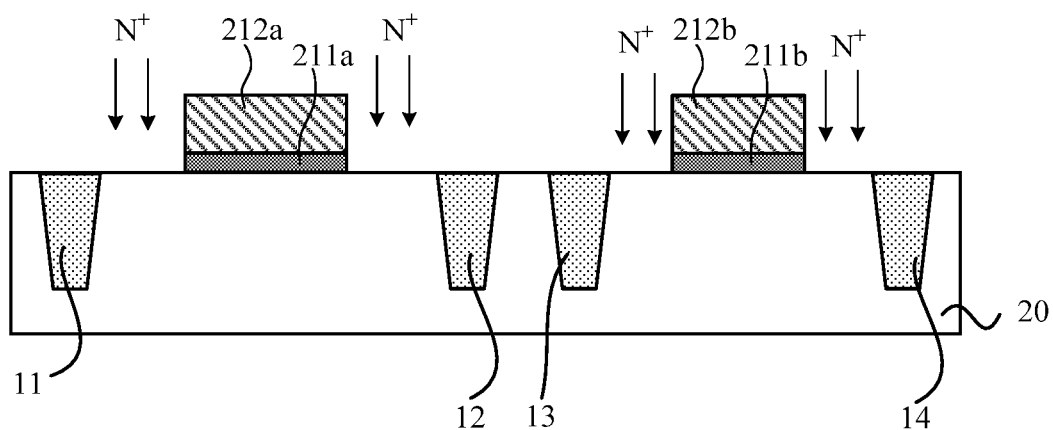
Figure 14:
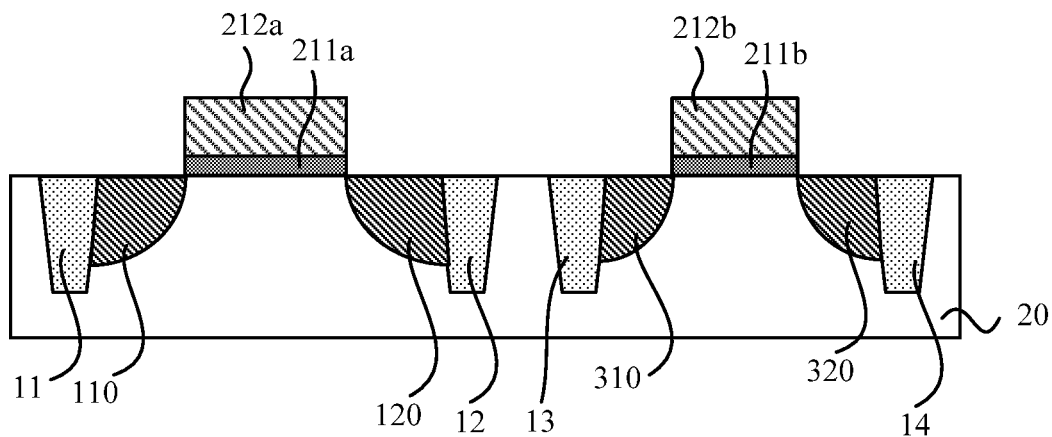

Step S131a-III: Use the first oxide portion 211a and the first hard mask portion 212a, and the second oxide portion 211b and the second hard mask portion 212b, as a mask to perform a first-type ion heavy-doping on the surface of the main substrate 20, to from the first drain region 110, the second drain region 120, the second source region 310, and the third drain region 320. Referring to FIG. 13 and FIG. 14, in this implementation, for example, the first-type ion heavy doping is N-type ion heavy doping, indicated by N+ in the figure. FIG. 13 shows that the first oxide portion 211a and the first hard mask portion 212a, the second oxide portion 211b and the second hard mask portion 212b are used as a mask to perform the first-type ion heavy-doping on the surface of the substrate 20. FIG. 14 shows the formed first drain region 110, second drain region 120, second source region 310, and third drain region 320.

Figure 15:
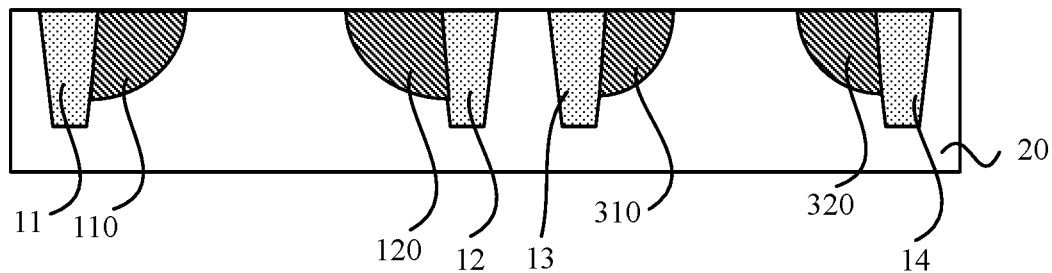

Step S131a-IV: Strip off the first oxide portion 211a and the first hard mask portion 212a, and the second oxide portion 211b and the second hard mask portion 212b. Refer to FIG. 15.

Figure 16:
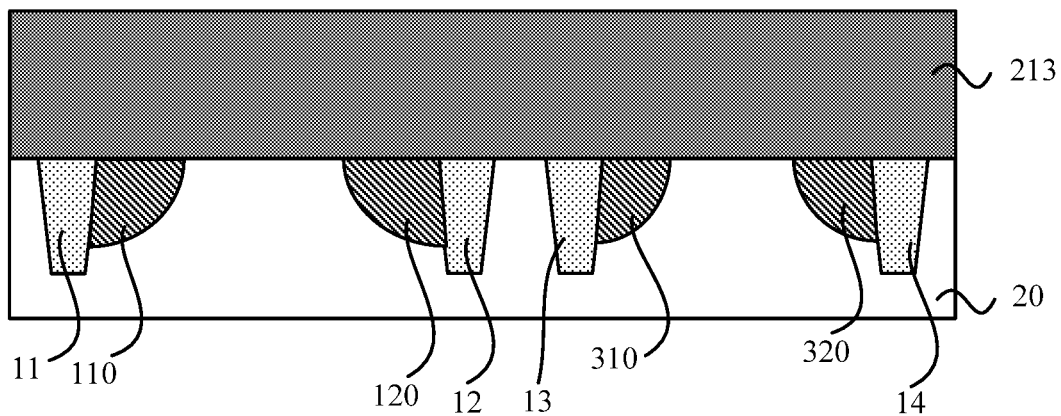

Correspondingly, the step S132a includes the following steps:

Step S132a-I: Deposit, on the surface of the main substrate 20, a second-type ion heavily-doped semiconductor layer 213. Refer to FIG. 16. The depositing step may be performed by using low pressure chemical vapor deposition (LPCVD) or physical vapor deposition (PVD).

Figure 17:
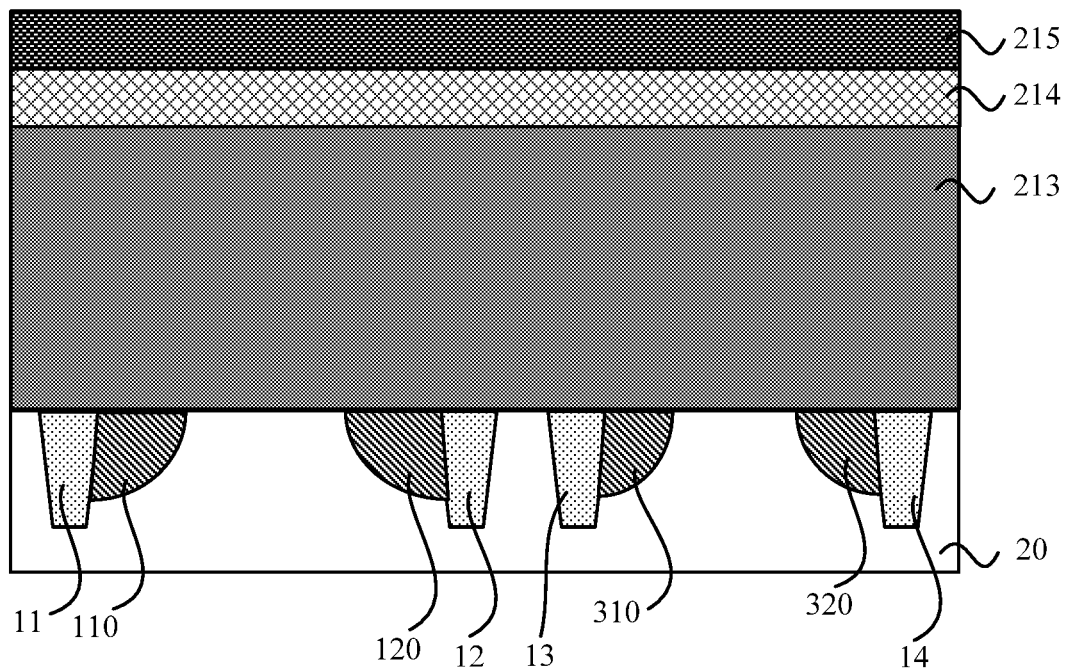

Step S132a-II: Pattern the second-type ion heavily-doped semiconductor layer 213, to form the first source region 130. Specifically, the step S132a-II includes the following steps:

Step a1: Deposit, at the second-type ion heavily-doped semiconductor layer 213, a second hard mask layer 214 and a photoresist 215. Refer to FIG. 17.

Figure 18:
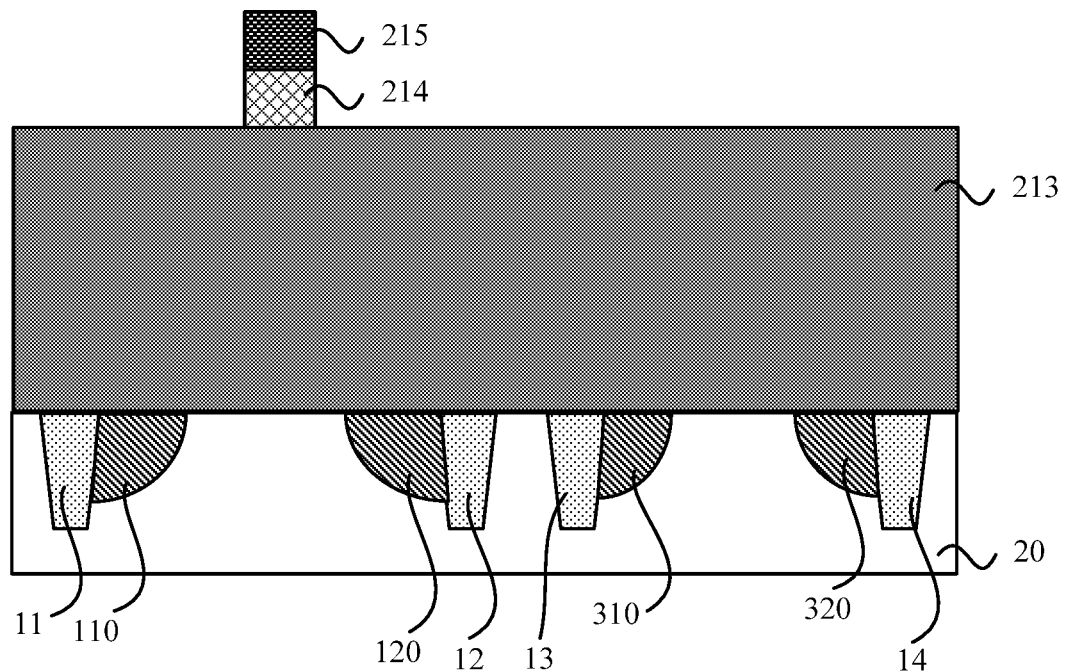

Step b1: Pattern the second hard mask layer 214 and the photoresist 215, to retain a second hard mask layer 214 and a photoresist 215 that are corresponding to a middle region between the first drain region 110 and the second drain region 120. Refer to FIG. 18.

Figure 19:
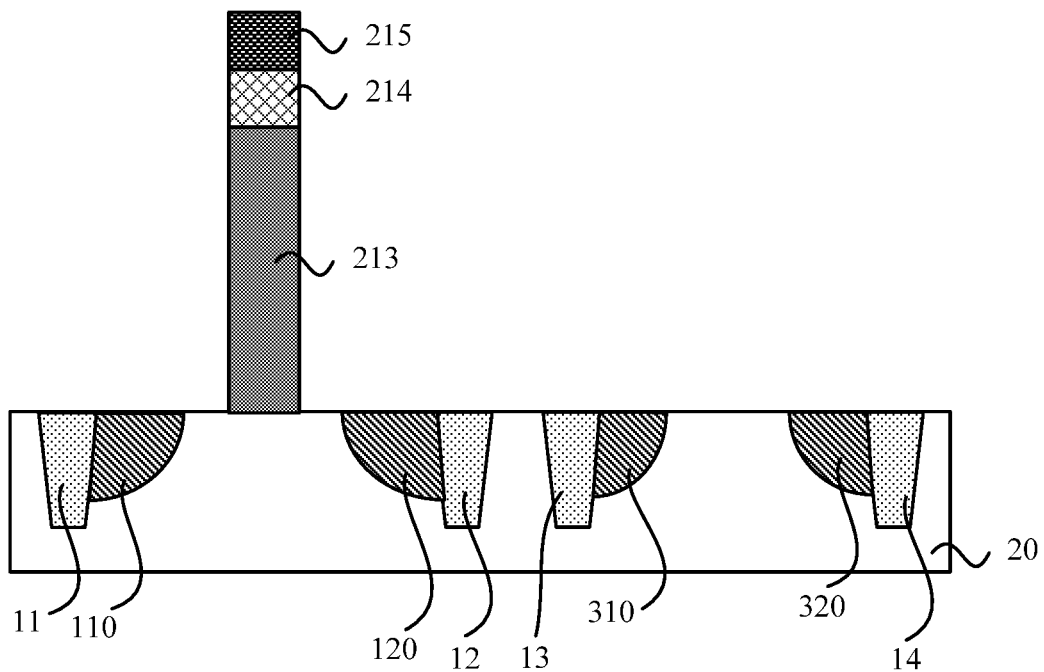

Step c1: Use the retained second hard mask layer 214 and photoresist 215 as a mask to etch the second-type ion heavily-doped semiconductor layer 213, to retain a second-type ion heavily-doped semiconductor layer 213 covered by the second hard mask layer 214 and the photoresist 215, so that the first source region 130 is formed. Refer to FIG. 19.

Figure 20:
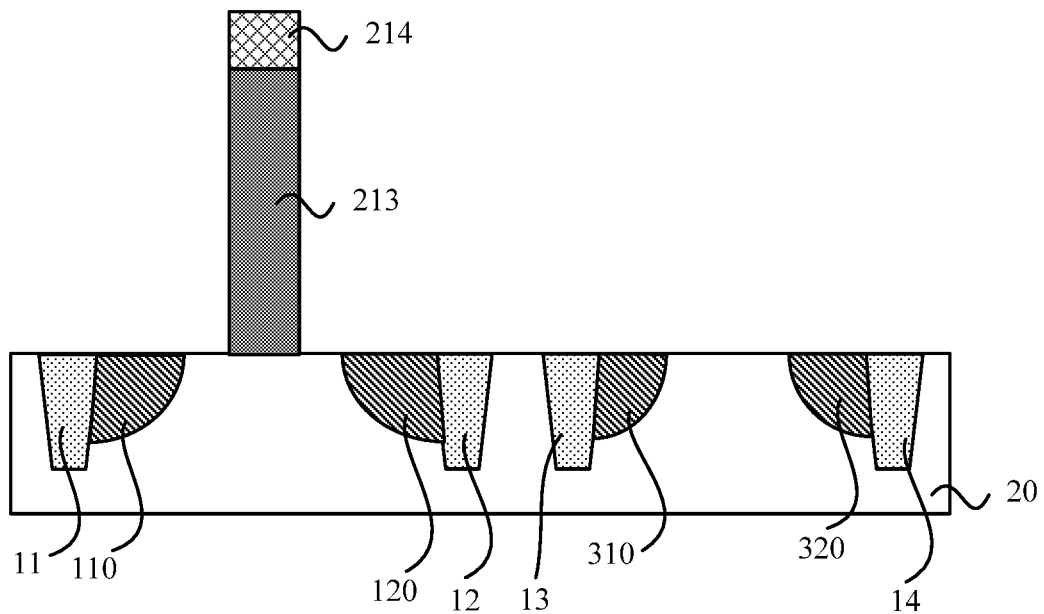

Step d1: Strip off the photoresist 215 corresponding to the middle of the first region 20a. Refer to FIG. 20.

Figure 21:
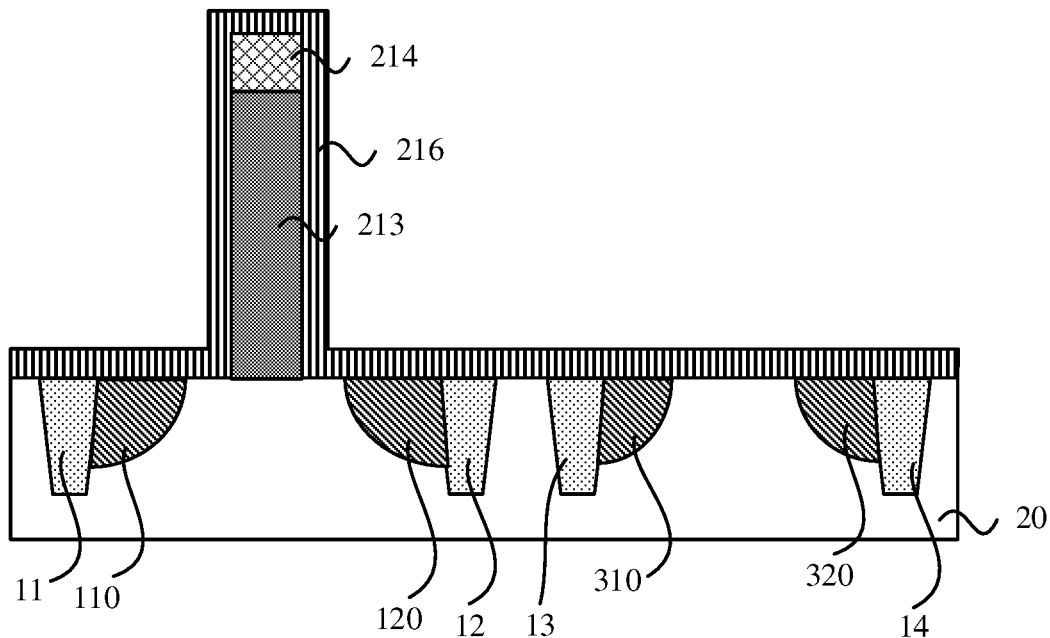

Correspondingly, in an implementation, the step S133a includes the following steps:

Step S133a-I: Deposit an insulation layer 216, where a thickness of the insulation layer 216 is less than the height of the first source region 130. Refer to FIG. 21.

Figure 22:
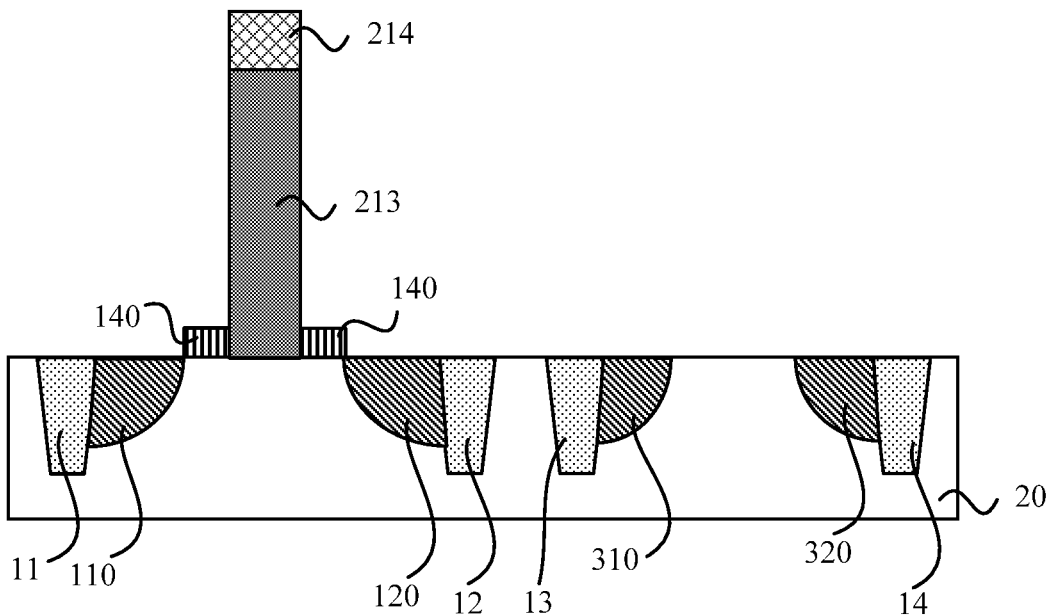

Step S133a-II: Pattern the insulation layer 216, to retain apart of the insulation layer 216 that is connected to a region between the first drain region 110 and the first source region 130 and a region between the second drain region 120 and the first source region 130, to form the first insulation layer 140. Refer to FIG. 22.

Figure 23:
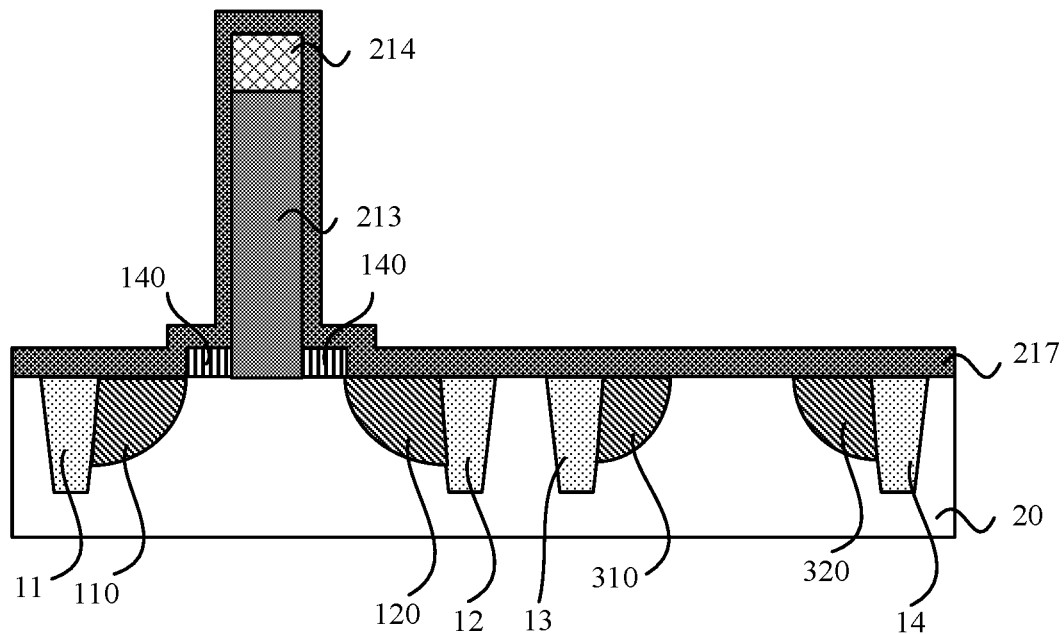

Correspondingly, in an implementation, the step S134a includes the following steps:

Step S134a-I: Deposit an entire gate dielectric material layer 217. Refer to FIG. 23.

Figure 24:
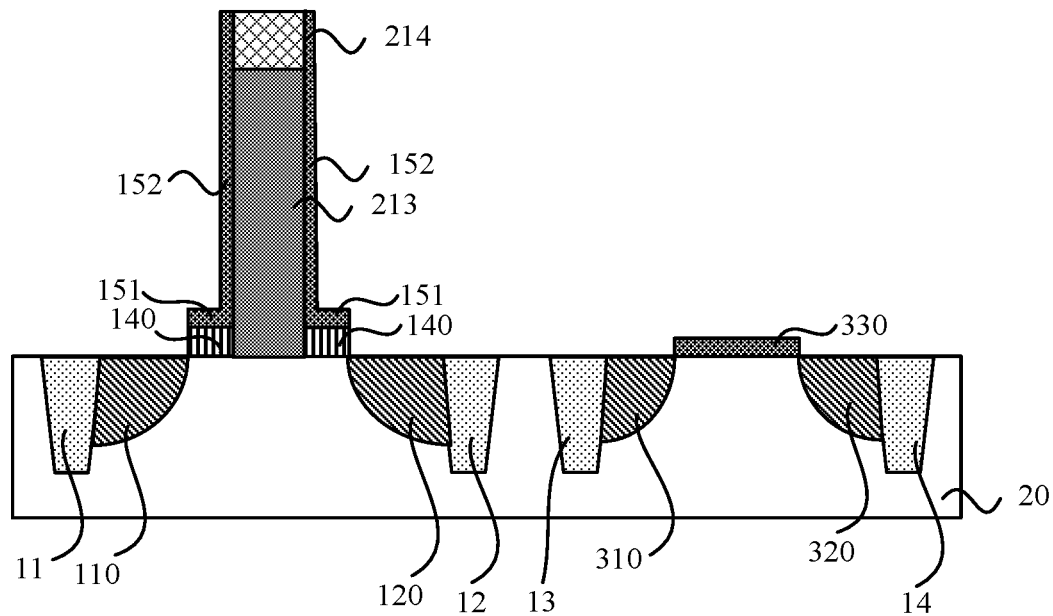

Step S134a-II: Pattern the gate dielectric material layer 217, to retain a gate dielectric material layer 217 that is attached to the surface of the first insulation layer 140 and the surface of the first source region 130 and that is symmetrically disposed on the both sides of the first source region 130, and retain agate dielectric material layer 217 that is disposed between the second source region 310 and the third drain region 320 and that is in contact with the second source region 310 and the third drain region 320, where the gate dielectric material layer 217 that is attached to the surface of the first insulation layer 140 and the surface of the first source region 130 and that is symmetrically disposed on the both sides of the first source region 130 is defined as the first gate dielectric layer 150; the gate dielectric material layer 217 that is disposed between the second source region 310 and the third drain region 320 is defined as the second gate dielectric layer 330; the first gate dielectric layer 150 includes a first gate dielectric portion 151 and a second gate dielectric portion 152; the first gate dielectric portion 151 is stacked on the first insulation layer 140; and one end of the second gate dielectric portion 152 is connected to the first gate dielectric portion 151, and the second gate dielectric portion 152 is attached to the surface of the first source region 130. Refer to FIG. 24.

Figure 25:
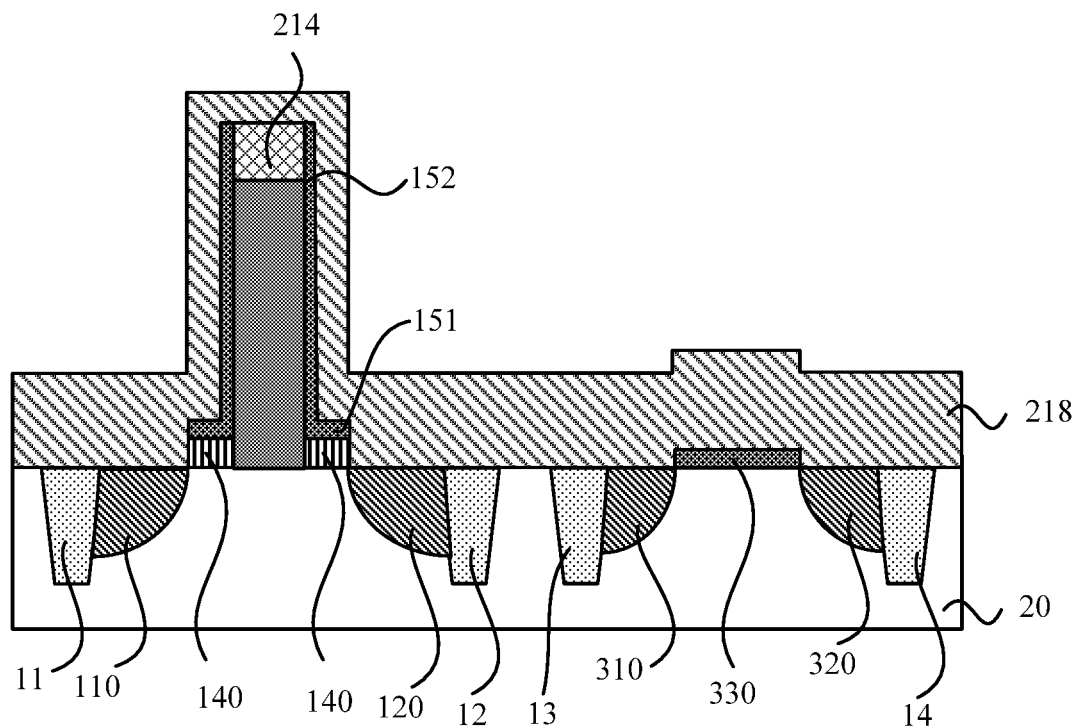

Correspondingly, in an implementation, the step S135a includes the following steps:

Step S135a-I: Deposit an entire gate material layer 218. Refer to FIG. 25.

Figure 26:
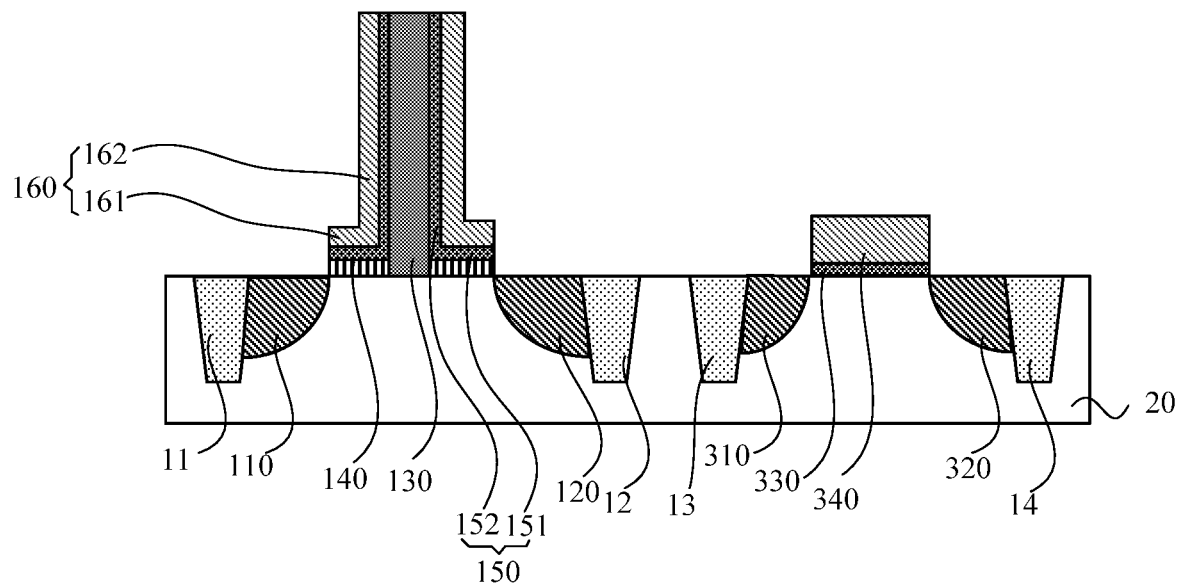

Step S135a-II: Pattern the gate material layer 218, to retain a gate material layer 218 that surrounds the first gate dielectric layer 150 and that is disposed at the second gate dielectric layer 330, where the gate material layer 218 disposed at the first gate dielectric layer 150 is defined as the first gate region 160; the gate material layer 218 disposed at the second gate dielectric layer 330 is defined as the second gate region 340; the gate region 160 includes a first part 161 and a second part 162; the first part 161 is stacked on the first gate dielectric layer 150; and one end of the second part 162 is connected to one end of the first part 161, and the second part 162 is attached to a surface of the second gate dielectric portion 152. Refer to FIG. 26.

The method for fabricating a semiconductor device further includes the following step:

Step I: Form the first drain 171, the second drain 172, the first source 173, the two first gates 174, the second source 351, the third drain 352, and the second gate 353, respectively corresponding to the first drain region 110, the second drain region 120, the first source region 130, the first gate region 160, the second source region 310, the third drain region 320, and the second gate region 340, where the first drain 171, the second drain 172, the first source 173, the two first gates 174, the second source 351, the third drain 352, and the second gate 353 are electrically connected to the first drain region 110, the second drain region 120, the first source region 130, the second part 162 of the first gate region 160, the second source region 310, the third drain region 320, and the second gate region 340, respectively.

Preferably, before the step I, the method for fabricating a semiconductor device further includes the following steps:

Step S136a: Form, on the first drain region 110, the second drain region 120, the first source region 130, and the first gate region 160, and on the second source region 310, the third drain region 320, and the second gate region 340, an insulation isolation layer 219, where the insulation isolation layer 219 covering the first drain region 110, the second drain region 120, the first source region 130, and the first gate region 160 is defined as a first isolation layer 180; and the insulation isolation layer 219 covering the second source region 310, the third drain region 320, and the second gate region 340 is defined as a second isolation layer 360.

Step S137a: Provide, at the first isolation layer 180, a first through hole 181, a second through hole 182, a third through hole 183, a fourth through hole 184, and a fifth through hole 185, where the fourth through hole 184 and the fifth through hole 185 are respectively disposed on both sides of the third through hole 183; the first through hole 181 is disposed corresponding to the first drain region 110, and the first drain 171 is connected to the first drain region 110 by using the first through hole 181; the second through hole 182 is disposed corresponding to the second drain region 120, and the second drain 172 is connected to the second drain region 120 by using the second through hole 182; the third through hole 183 is disposed corresponding to the first source region 130, and the first source 173 is connected to the first source region 130 by using the third through hole 183; and the fourth through hole 184 and the fifth through hole 185 are separately disposed corresponding to the second part 162 of the first gate region 160, and the two first gates 174 are connected to the second part 162 of the first gate region 160 respectively by using the fourth through hole 184 and the fifth through hole 185.

Figure 27:
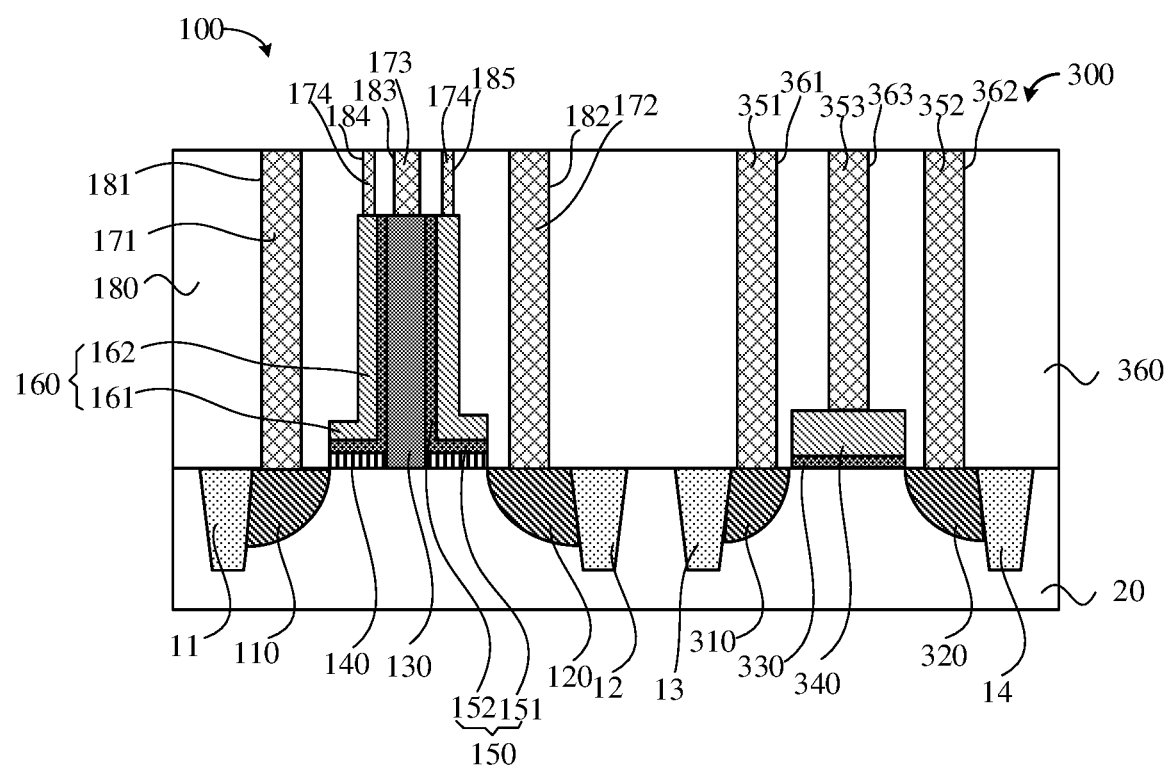

Step S138a: Provide, at the second isolation layer 360, a seventh through hole 361, an eighth through hole 362, and a ninth through hole 363, where the seventh through hole 361 is disposed corresponding to the second source region 310, and the second source 351 is connected to the second source region 310 by using the seventh through hole 361; the eighth through hole 362 is disposed corresponding to the third drain region 320, and the third drain 352 is connected to the third drain region 320 by using the eighth through hole 362; and the ninth through hole 363 is disposed corresponding to the second gate region 340, and the second gate 353 is connected to the second gate region 340 by using the ninth through hole 363. For the foregoing steps S136a to S138a, refer to FIG. 27.

In an implementation, the method for fabricating a semiconductor device further includes at least one of the following steps:

Step S139a-I: Form, between the first drain 171 and the first drain region 110, a first ohmic contact layer 191, where the first drain 171 is connected to the first drain region 110 by using the first ohmic contact layer 191. The first ohmic contact layer 191 is disposed between the first drain 171 and the first drain region 110, to connect the first drain 171 and the first drain region 110. The first ohmic contact layer 191 is used to reduce contact resistance between the first drain 171 and the first drain region 110.

Step S139a-II: Form, between the second drain 172 and the second drain region 120, a second ohmic contact layer 192, where the second drain 172 is connected to the second drain region 120 by using the second ohmic contact layer 192. The second ohmic contact layer 192 is disposed between the second drain 172 and the second drain region 120, to connect the second drain 172 and the second drain region 120. The second ohmic contact layer 192 is used to reduce contact resistance between the second drain 172 and the second drain region 120.

Step S139a-III: Form, between the first source 173 and the first source region 130, a third ohmic contact layer 193, where the first source 173 is connected to the first source region 130 by using the third ohmic contact layer 193. The third ohmic contact layer 193 is disposed between the first source 173 and the first source region 130, to connect the first source 173 and the first source region 130. The third ohmic contact layer 193 is used to reduce contact resistance between the first source 173 and the first source region 130.

Step S139a-IV: Form, between a first first-gate 174 and the second part 162 of the first gate region 160, a fourth ohmic contact layer 194, where the first first-gate 174 is connected to the second part 162 of the first gate region 160 by using the fourth ohmic contact layer 194. The fourth ohmic contact layer 194 is disposed between the first first-gate 174 and the second part 162 of the first gate region 160, to connect the first first-gate 174 and the second part 162 of the first gate region 160. The fourth ohmic contact layer 194 is used to reduce contact resistance between the first first-gate 174 and the second part 162 of the first gate region 160.

Step S139a-V: Form, between a second first-gate 174 and the second part 162 of the first gate region 160, a fifth ohmic contact layer 195, where the second first-gate 174 is connected to the second part 162 of the first gate region 160 by using the fifth ohmic contact layer 185. The fifth ohmic contact layer 195 is disposed between the second first-gate 174 and the second part 162 of the first gate region 160, to connect the second first-gate 174 and the second part 162 of the first gate region 160. The fifth ohmic contact layer 195 is used to reduce contact resistance between the second first-gate 174 and the second part 162 of the first gate region 160.

Step S139a-VI: Form, between the second source 351 and the second source region 310, a seventh ohmic contact layer 381, where the second source 351 is connected to the second source region 310 by using the seventh ohmic contact layer 381. The seventh ohmic contact layer 381 is disposed between the second source 351 and the second source region 310, to connect the second source 351 and the second source region 310. The seventh ohmic contact layer 381 is used to reduce contact resistance between the second source 351 and the second source region 310.

Step S139a-VII: Form, between the third drain 352 and the third drain region 320, an eighth ohmic contact layer 382, where the third drain 352 is connected to the third drain region 320 by using the eighth ohmic contact layer 382. The eighth ohmic contact layer 382 is disposed between the third drain 352 and the third drain region 320, to connect the third drain 352 and the third drain region 320. The eighth ohmic contact layer 382 is used to reduce contact resistance between the third drain 352 and the third drain region 320.

Step S139a-VIII: Form, between the second gate 353 and the second gate region 340, a ninth ohmic contact layer 383, where the second gate 353 is connected to the second gate region 340 by using the ninth ohmic contact layer 383. The ninth ohmic contact layer 383 is disposed between the second gate 353 and the second gate region 340, to connect the second gate 353 and the second gate region 340. The ninth ohmic contact layer 383 is used to reduce contact resistance between the second gate 353 and the second gate region 340.

Figure 28:
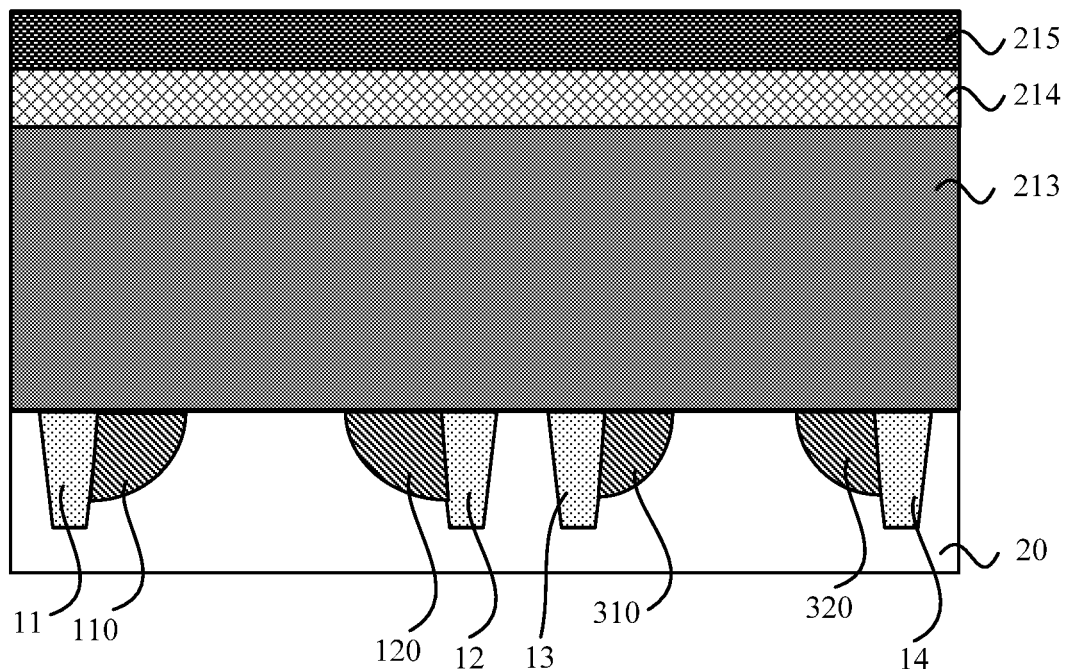

Referring to FIG. 3, in an implementation of the present disclosure, when the planar device 200 is the metal oxide semiconductor transistor, after the step S130, the step S120 includes the following steps:

Step a2: Deposit, at the second-type ion heavily-doped semiconductor layer 213, a second hard mask layer 214 and a photoresist 215. Refer to FIG. 28.

Figure 29:
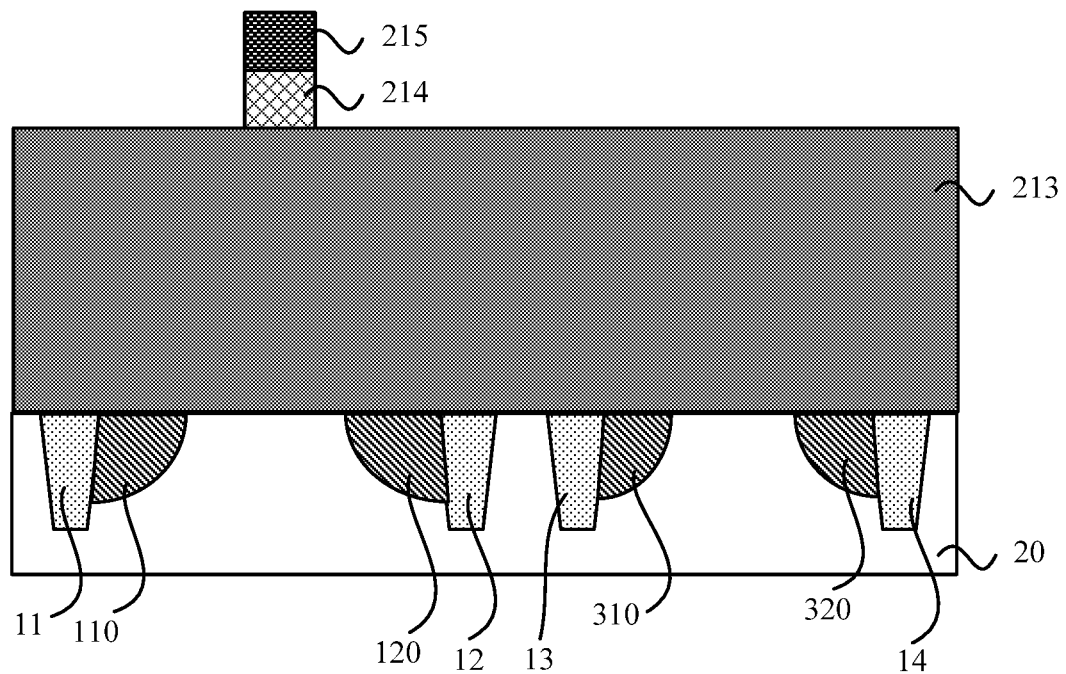

Step b2: Pattern the second hard mask layer 214 and the photoresist 215, to retain a second hard mask layer 214 and a photoresist 215 that are corresponding to a middle region between the first drain region 110 and the second drain region 120. Refer to FIG. 29.

Figure 30:
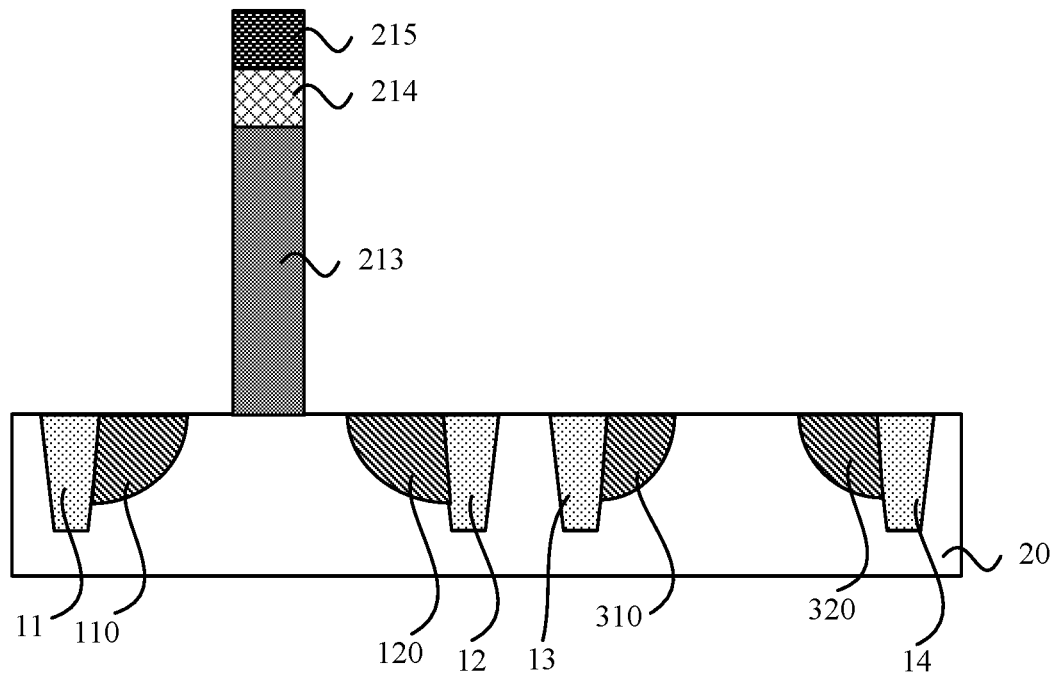

Step c2: Use the retained second hard mask layer 214 and photoresist 215 as a mask to etch the second-type ion heavily-doped semiconductor layer 213, to retain a second-type ion heavily-doped semiconductor layer 213 covered by the second hard mask layer 214 and the photoresist 215, so that the first source region 130 is formed. Refer to FIG. 30.

Figure 31:
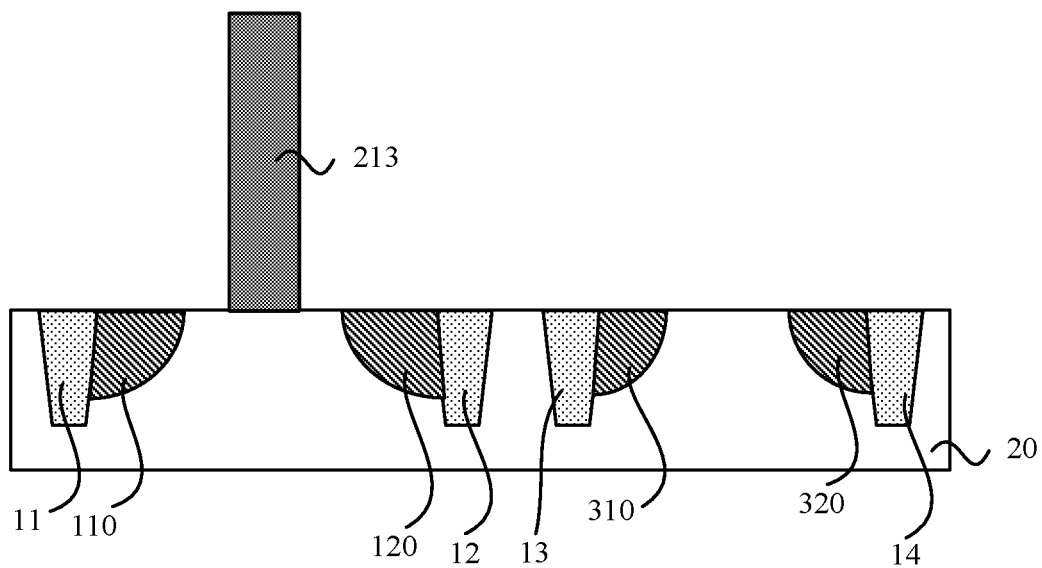

Step d2: Strip off the second hard mask layer 214 and the photoresist 215 that are corresponding to the middle of the first region 20a. Refer to FIG. 31.

Correspondingly, in an implementation, the step S134a and the step S135a include the following steps:

Step S134a-I': Deposit an entire gate dielectric material layer 217.

Figure 32:
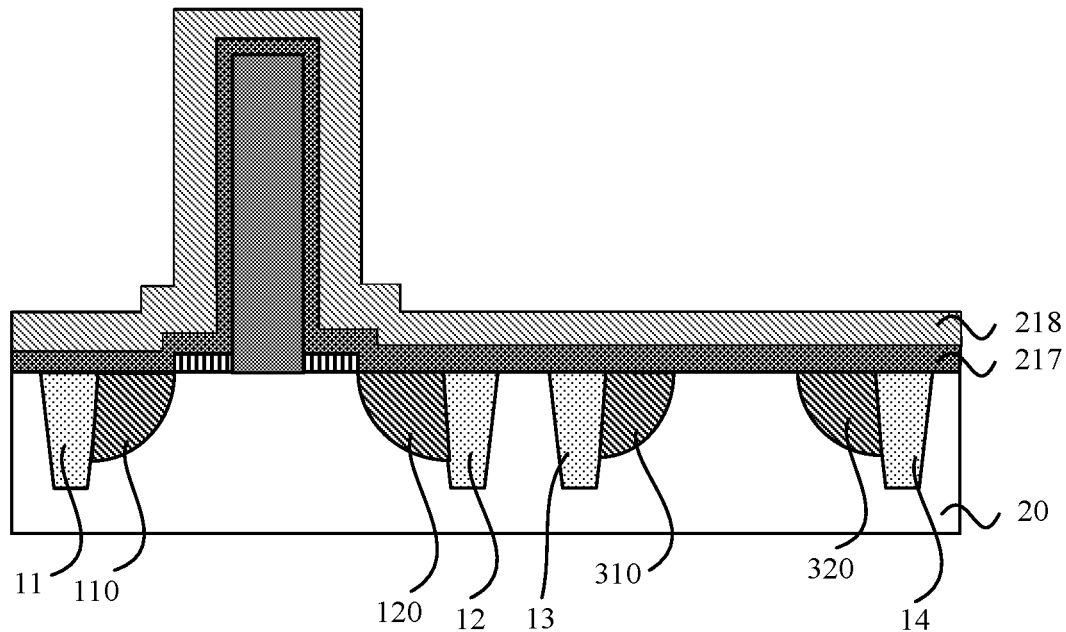

Step S134a-II': Deposit, at the entire gate dielectric material layer 217, an entire gate material layer 218. Refer to FIG. 32.

Figure 33:
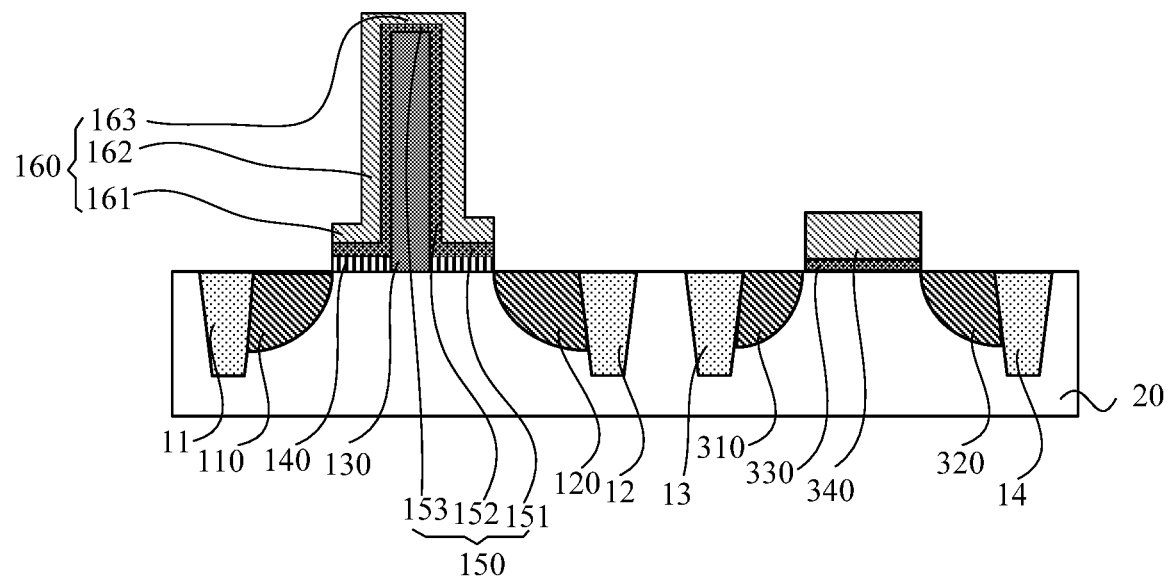

Step S134a-III': Pattern the gate dielectric material layer 217 and the gate material layer 218, to remove the gate dielectric material layer 217 and the gate material layer 218 that cover the first drain region 110, the second drain region 120, the second source region 310, and the third drain region 320, with the remaining gate dielectric material layer 217 being the first gate dielectric layer 150, where the first gate dielectric layer 150 includes a first gate dielectric portion 151, a second gate dielectric portion 152, and a third gate dielectric portion 153; the first gate dielectric portion 151 is stacked on the first insulation layer 140; one end of the second gate dielectric portion 152 is connected to the first gate dielectric portion 151, and the second gate dielectric portion 152 is attached to the surface of the first source region 130; the third dielectric portion 153 is connected to one end, of the second gate dielectric portion 152, that is away from the first gate dielectric portion 151, and the third dielectric portion 153 covers one end, of the first source region 130, that is away from the substrate 20; the first gate region 160 includes a first part 161, a second part 162, and a third part 163, where the first part 161 is stacked on the first gate dielectric layer 150; one end of the second part 162 is connected to one end of the first part 161, and the second part 162 is attached to a surface of the second gate dielectric portion 152; and the third part 163 is connected to one end, of the second part 162, that is away from the first part 161, and the third part 163 covers the third gate dielectric portion 153. Refer to FIG. 33.

The method for fabricating a semiconductor device further includes the following step:

Step II: Form a first drain 171, a second drain 172, a first source 173, three first gates 174, a second source 351, a third drain 352, and a second gate 353, respectively corresponding to the first drain region 110, the second drain region 120, the first source region 130, the first gate region 160, the second source region 310, the third drain region 320, and the second gate region 340, where the first drain 171, the second drain 172, the first source 173, the second source 351, the third drain 352, and the second gate 353 are electrically connected to the first drain region 110, the second drain region 120, the first source region 130, the second source region 310, the third drain region 320, and the second gate region 340, respectively; and two of the first gates 174 are connected to the second part 162 and respectively disposed on both sides of the first source 173, and the other one first gate 174 is connected to the third part 163.

Preferably, before the step II, the method for fabricating a semiconductor device further includes the following steps:

Step S136*b*: Form, on the first drain region 110, the second drain region 120, the first source region 130, and the first gate region 160, and on the second source region 310, the third drain region 320, and the second gate region 340, an insulation isolation layer 219, where the insulation isolation layer 219 covering the first drain region 110, the second drain region 120, the first source region 130, and the first gate region 160 is defined as a first isolation layer 180; and the insulation isolation layer 219 covering the second source region 310, the third drain region 320, and the second gate region 340 is defined as a second isolation layer 360.

Step S137*b*: Provide, at the first isolation layer 180, a first through hole 181, a second through hole 182, a third through hole 183, a fourth through hole 184, a fifth through hole 185, and a sixth through hole 186, where the fourth through hole 184 and the fifth through hole 185 are respectively disposed on both sides of the third through hole 183; the first through hole 181 is disposed corresponding to the first drain region 110, and the first drain 171 is connected to the first drain region 110 by using the first through hole 181; the second through hole 182 is disposed corresponding to the second drain region 120, and the second drain 172 is connected to the second drain region 120 by using the second through hole 182; the third through hole 183 is disposed corresponding to the first source region 130, and the first source 173 is connected to the first source region 130 by using the third through hole 183; the fourth through hole 184 and the fifth through hole 185 are separately disposed corresponding to the second part 162 of the first gate region 160; the sixth through hole 186 is disposed corresponding to the third part 163; and two of the first gates 174 are connected to the second part 162 of the first gate region 160 respectively by using the fourth through hole 184 and the fifth through hole 185, and the other one first gate 174 is connected to the third part 163 of the first gate region 160 by using the sixth through hole 186.

Figure 34:
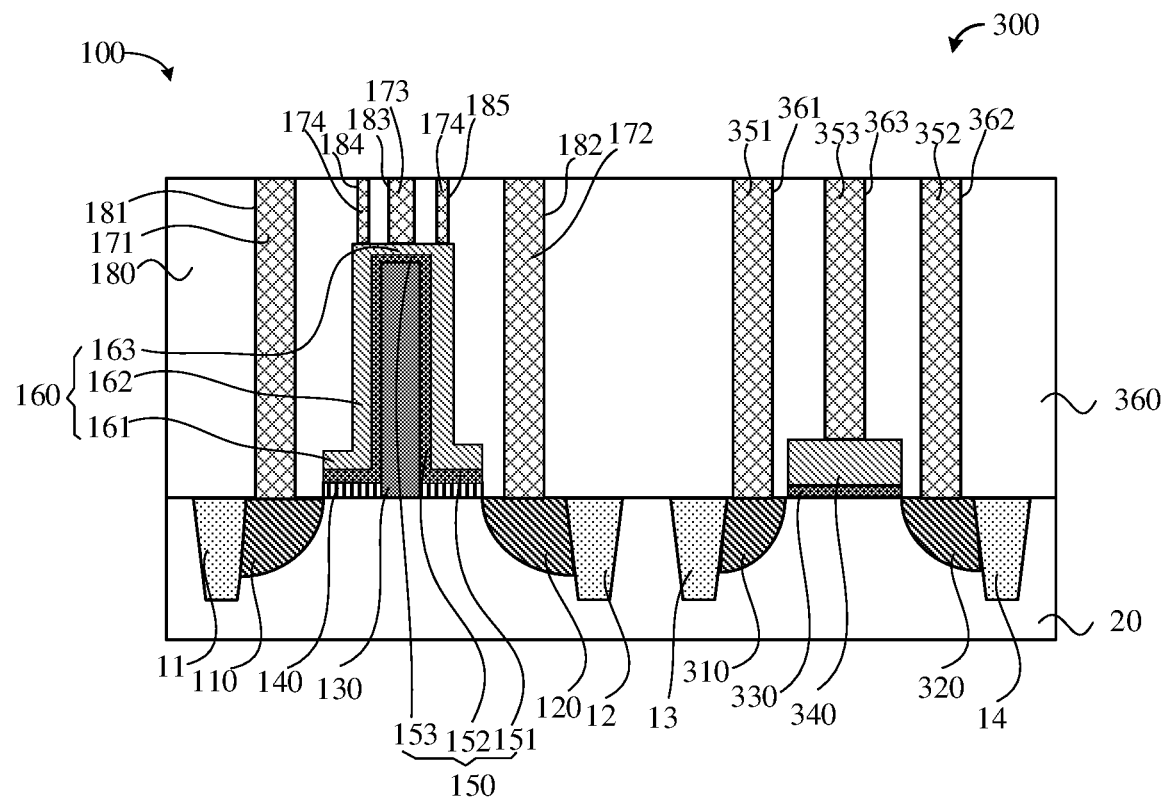

Step S138*b*: Provide, at the second isolation layer 360, a seventh through hole 361, an eighth through hole 362, and a ninth through hole 363, where the seventh through hole 361 is disposed corresponding to the second source region 310, and the second source 351 is connected to the second source region 310 by using the seventh through hole 361; the eighth through hole 362 is disposed corresponding to the third drain region 320, and the third drain 352 is connected to the third drain region 320 by using the eighth through hole 362; and the ninth through hole 363 is disposed corresponding to the second gate region 340, and the second gate 353 is connected to the second gate region 340 by using the ninth through hole 363. For the steps S136*b* to S138*b*, refer to FIG. 34.

The method for fabricating a semiconductor device further includes at least one of the following steps:

Step S139*b*-I: Form, between the first drain 171 and the first drain region 110, a first ohmic contact layer 191, where the first drain 171 is connected to the first drain region 110 by using the first ohmic contact layer 191. The first ohmic contact layer 191 is disposed between the first drain 171 and the first drain region 110, to connect the first drain 171 and the first drain region 110. The first ohmic contact layer 191 is used to reduce contact resistance between the first drain 171 and the first drain region 110.

Step S139*b*-II: Form, between the second drain 172 and the second drain region 120, a second ohmic contact layer 192, where the second drain 172 is connected to the second drain region 120 by using the second ohmic contact layer 192. The second ohmic contact layer 192 is disposed between the second drain 172 and the second drain region 120, to connect the second drain 172 and the second drain region 120. The second ohmic contact layer 192 is used to reduce contact resistance between the second drain 172 and the second drain region 120.

Step S139*b*-III: Form, between the first source 173 and the first source region 130, a third ohmic contact layer 193, where the first source 173 is connected to the first source region 130 by using the third ohmic contact layer 193. The third ohmic contact layer 193 is disposed between the first source 173 and the first source region 130, to connect the first source 173 and the first source region 130. The third ohmic contact layer 193 is used to reduce contact resistance between the first source 173 and the first source region 130.

Step S139*b*-IV: Form, between a first first-gate 174 and the second part 162 of the first gate region 160, a fourth ohmic contact layer 194, where the first first-gate 174 is connected to the second part 162 of the first gate region 160 by using the fourth ohmic contact layer 194. The fourth ohmic contact layer 194 is disposed between the first first-gate 174 and the second part 162 of the first gate region 160, to connect the first first-gate 174 and the second part 162 of the first gate region 160. The fourth ohmic contact layer 194 is used to reduce contact resistance between the first first-gate 174 and the second part 162 of the first gate region 160.

Step S139*b*-V: Form, between a second first-gate 174 and the second part 162 of the first gate region 160, a fifth ohmic contact layer 195, where the second first-gate 174 is connected to the second part 162 of the first gate region 160 by using the fifth ohmic contact layer 195. The fifth ohmic contact layer 195 is disposed between the second first-gate 174 and the second part 162 of the first gate region 160, to connect the second first-gate 174 and the second part 162 of the first gate region 160. The fifth ohmic contact layer 195 is used to reduce contact resistance between the second first-gate 174 and the second part 162 of the first gate region 160.

Step S139*b*-VI: Form, between a third first-gate 174 and the third part 163 of the first gate region 160, a sixth ohmic contact layer 196, where the third first-gate 174 is connected to the third part 163 of the first gate region 160 by using the sixth ohmic contact layer 196.

Step S139*b*-VII: Form, between the second source 351 and the second source region 310, a seventh ohmic contact layer 381, where the second source 351 is connected to the second source region 310 by using the seventh ohmic contact layer 381. The seventh ohmic contact layer 381 is disposed between the second source 351 and the second source region 310, to connect the second source 351 and the second source region 310. The seventh ohmic contact layer 381 is used to reduce contact resistance between the second source 351 and the second source region 310.

Step S139*b*-VIII: Form, between the third drain 352 and the third drain region 320, an eighth ohmic contact layer 382, where the third drain 352 is connected to the third drain region 320 by using the eighth ohmic contact layer 382. The eighth ohmic contact layer 382 is disposed between the third drain 352 and the third drain region 320, to connect the third drain 352 and the third drain region 320. The eighth ohmic contact layer 382 is used to reduce contact resistance between the third drain 352 and the third drain region 320.

Step S139b-V-IX: Form, between the second gate 353 and the second gate region 340, a ninth ohmic contact layer 383, where the second gate 353 is connected to the second gate region 340 by using the ninth ohmic contact layer 383. The ninth ohmic contact layer 383 is disposed between the second gate 353 and the second gate region 340, to connect the second gate 353 and the second gate region 340. The ninth ohmic contact layer 383 is used to reduce contact resistance between the second gate 353 and the second gate region 340.

Compared with that in the prior art, according to the method for fabricating a semiconductor device in the present disclosure, a doping type of the first drain region 110 and the second drain region 120 that are in the first region 20a is the same as a doping type of the second source region 310 and the third drain region 320 of the metal oxide semiconductor transistor 300 in the second region 20b, and the first drain region 110, the second drain region 120, the second source region 310, and the third drain region 320 can be implemented by a single time of ion injection. This reduces process steps and process complexity for fabricating the semiconductor device, so that costs are reduced. In addition, the semiconductor device fabrication process in the present disclosure is compatible with the existing CMOS standard process, with no extra complicated process methods.

The following describes the method for fabricating a semiconductor device when the planar device in the semiconductor device is the capacitor. After the step S130, the step S120 further includes the following steps:

Step S131c: Form, from the first surface 100c, a first drain region 110 and a second drain region 120 that are embedded into the first surface 100c, and form, from the second surface 200c, a first doping region 410 embedded into the second surface 200c, where one end of the first drain region 110 is flush with the first surface 100c; one end of the second drain region 120 is flush with the first surface 100c; the first drain region 110 and the second drain region 120 are opposite to each other, separated by a part of the first substrate 100a, and disposed between the first shallow trench isolation region 11 and the second shallow trench isolation region 12; the first drain region 110 is in contact with the first shallow trench isolation region 11; the second drain region 120 is in contact with the second shallow trench isolation region 12; one end of the first doping region 410 is flush with the third surface 200c; the first doping region 410 is disposed between the third shallow trench isolation region 13 and the fourth shallow trench isolation region 14; and one end of the first doping region 410 is in contact with the third shallow trench isolation region 13, and the other end of the first doping region 410 is in contact with the fourth shallow trench isolation region 14.

Step S132c: Form a first source region 130. The first source region 130 is disposed in a protruding manner on the first surface 100c, and the first source region 130 is located between the first drain region 110 and the second drain region 120.

Step S133c: Form a first insulation layer 140 and a second insulation layer 420. The first insulation layer 140 is disposed in a protruding manner on a surface of the first substrate. The first insulation layer 140 is symmetrically disposed on both sides of the first source region 130, and connected to a region between the first drain region 110 and the first source region 130 and a region between the second drain region 120 and the first source region 130. A thickness of the first insulation layer 140 is less than a height of the first source region 130. The second insulation layer 420 is disposed in the middle of the first doping region 410, and the second insulation layer 420 does not cover the both ends of the first doping region 410. The second insulation layer 420 is located at a same layer as the first insulation layer 140.

Step S134c: Form a first gate dielectric layer 150 and a third gate dielectric layer 430 that are disposed at intervals. The first gate dielectric layer 150 is symmetrically disposed on the both sides of the first source region 130 and is attached to a surface of the first source region 130 and a surface of the first insulation layer 140. The third gate dielectric layer 430 is stacked on the second insulation layer 420.

Step S135c: Form a first gate region 160 and a third gate region 440. The first gate region 160 is disposed around the first gate dielectric layer 150. The third gate region 440 is stacked on the third gate dielectric layer 430.

Figure 35:
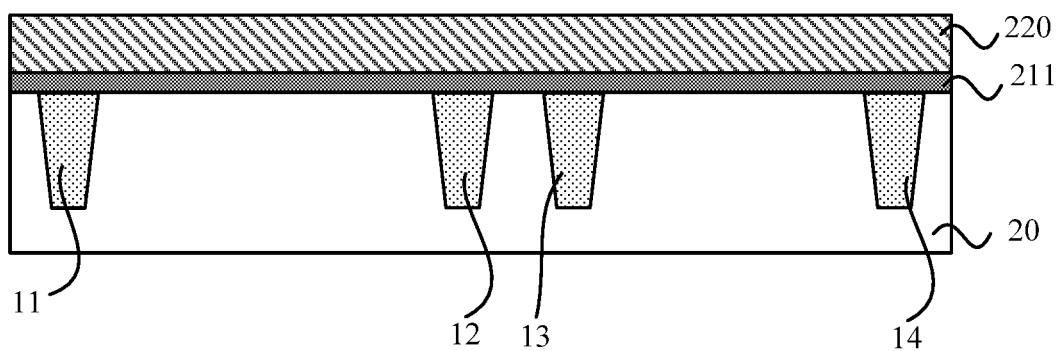
FIG. 35 to FIG. 50 are schematic diagrams of fabrication steps in a fabrication method of a semiconductor device in which a planar device is a capacitor according to an example implementation of the present disclosure.

Specifically, in this implementation, the step S131c includes the following steps:

Step S131c-I: Form, in sequence on a same surface of the substrate 20, an oxide layer 211 and a third hard mask layer 220 that are stacked. Refer to FIG. 35.

Figure 36:
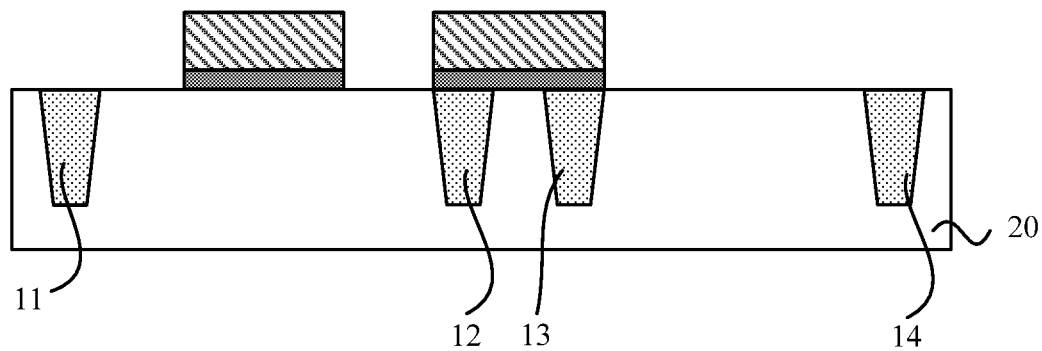

Step S131c-II: Pattern the oxide layer 211 and the third hard mask layer 220, to remove an oxide layer 211 and a third hard mask layer 220 that are located at both ends of the first region 20a and on the second region 20b. Refer to FIG. 36.

Figure 37:
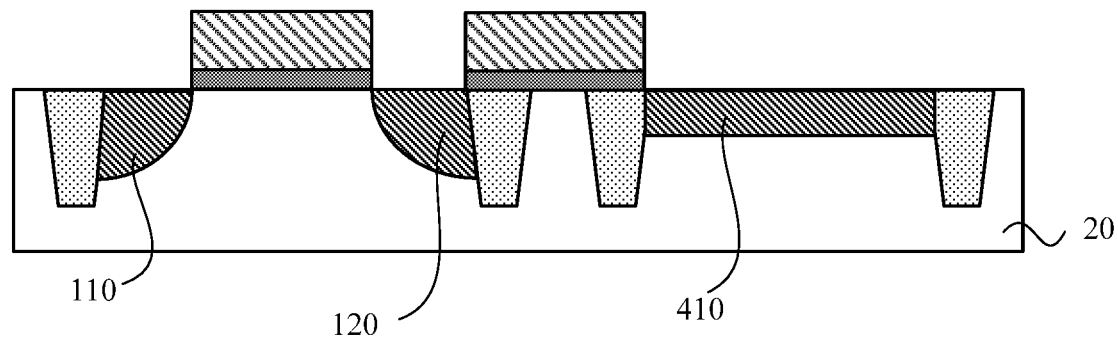

Step S131c-III: Use the patterned oxide layer 211 and third hard mask layer 220 as a mask to perform first-type ion heavy-doping on the surface of the substrate 20, to form, in the first region 20a, the first drain region 110 and the second drain region 120 that are disposed at intervals, and form, in the second region 20b, the first doping region 410. Refer to FIG. 37.

Figure 38:
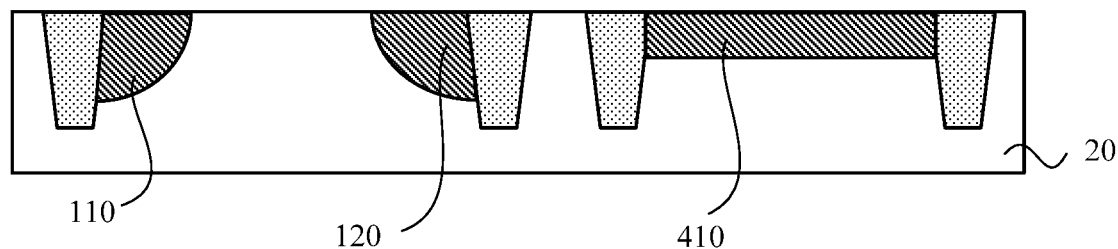

Step S131c-IV: Strip off the remaining oxide layer 211 and third hard mask layer 220. Refer to FIG. 38.

Preferably, between the step S131c and the step S132c, the method for fabricating a semiconductor device further includes: performing annealing processing on the substrate 20.

Figure 39:
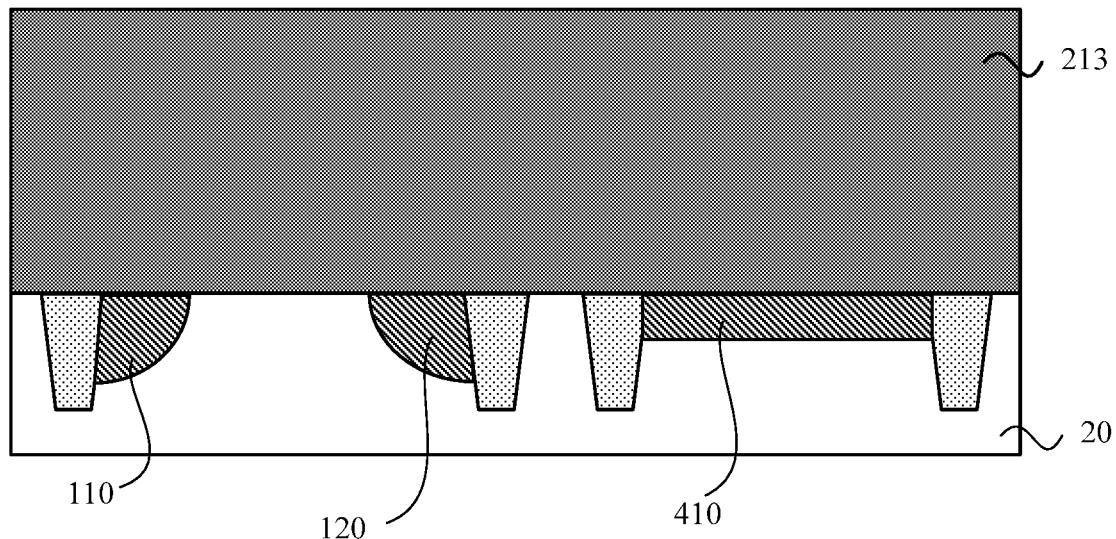

In this implementation, the step S132c specifically includes the following steps:

Step S132c-I: Deposit a second-type ion heavily-doped semiconductor layer 213. Refer to FIG. 39.

Step S132c-II: Pattern the second-type ion heavily-doped semiconductor layer 213, to form the first source region 130.

Figure 40:
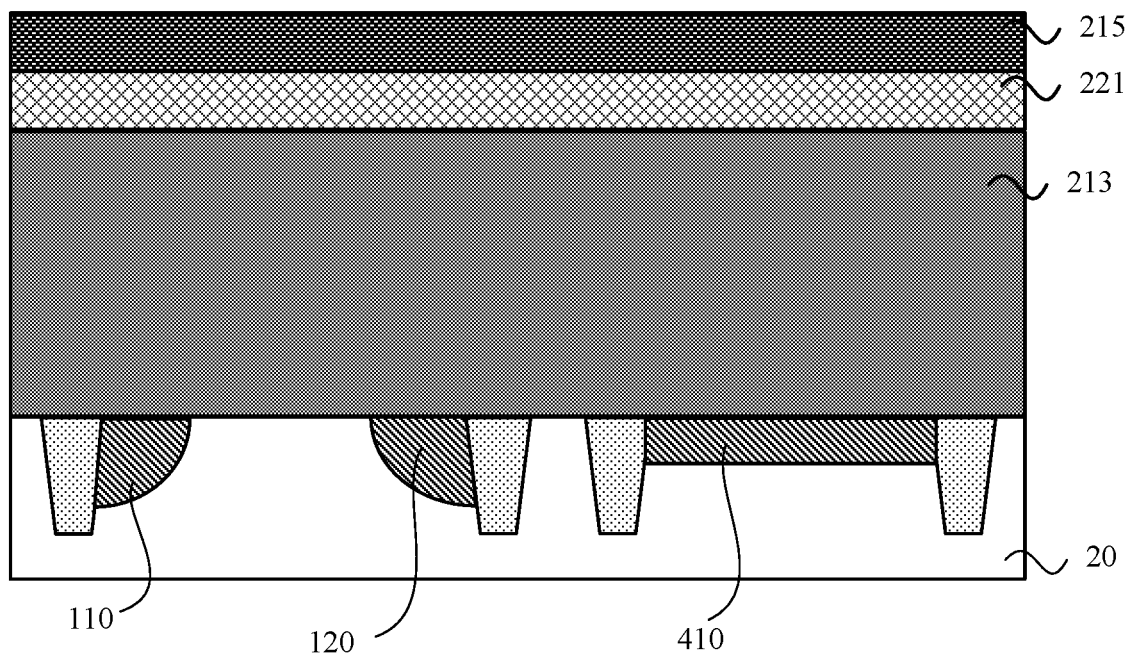

The step S132c-II specifically includes the following steps:

Step a3: Deposit, at the second-type ion heavily-doped semiconductor layer 213, a fourth hard mask layer 221 and a photoresist 215. Refer to FIG. 40.

Figure 41:
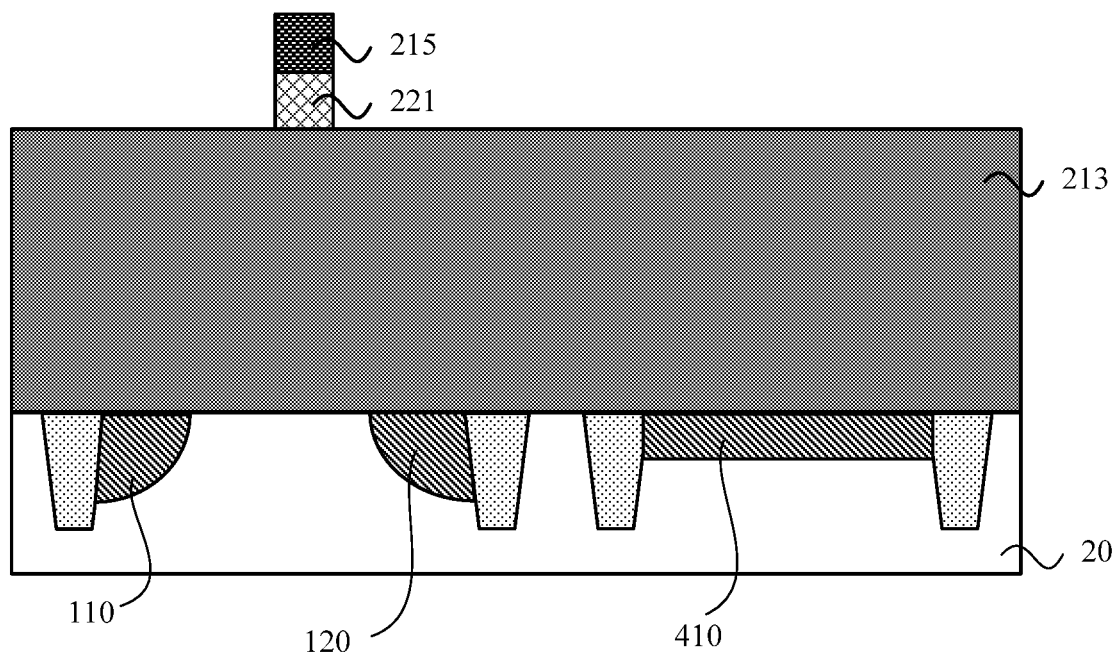

Step b3: Pattern the fourth hard mask layer 221 and the photoresist 215, to retain a fourth hard mask layer 221 and a photoresist 215 that are corresponding to a middle region between the first drain region 110 and the second drain region 120. Refer to FIG. 41.

Figure 42:
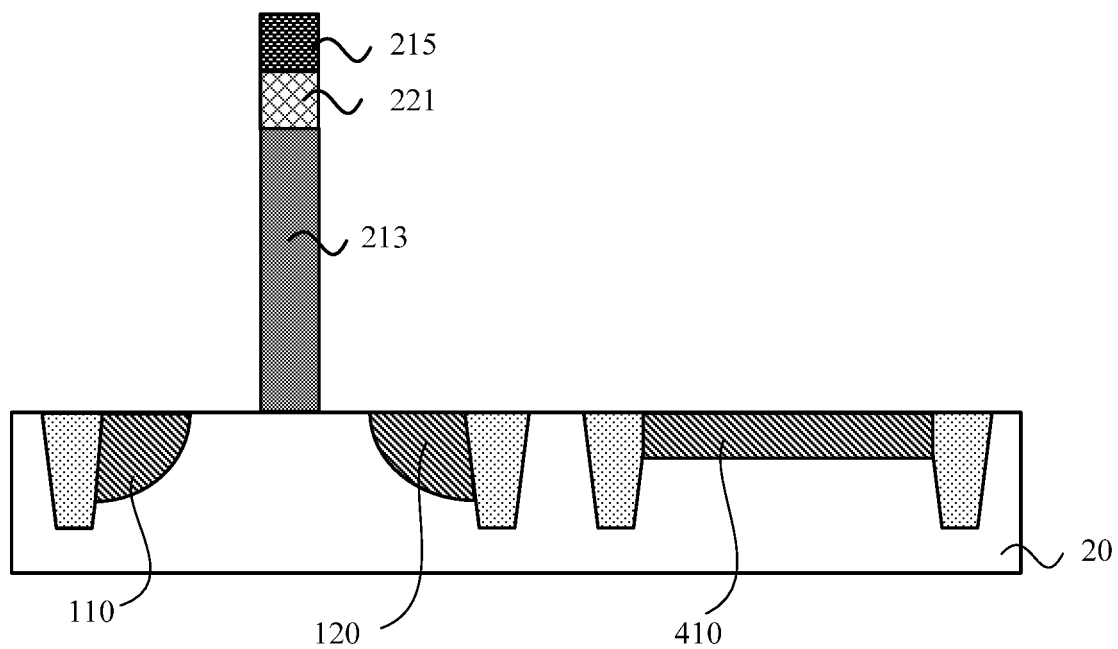

Step c3: Use the retained fourth hard mask layer 221 and photoresist 215 as a mask to etch the second-type ion heavily-doped semiconductor layer 213, to retain a second-type ion heavily-doped semiconductor layer 213 covered by the fourth hard mask layer 221 and the photoresist 215, so that the first source region 130 is formed. Refer to FIG. 42.

Figure 43:
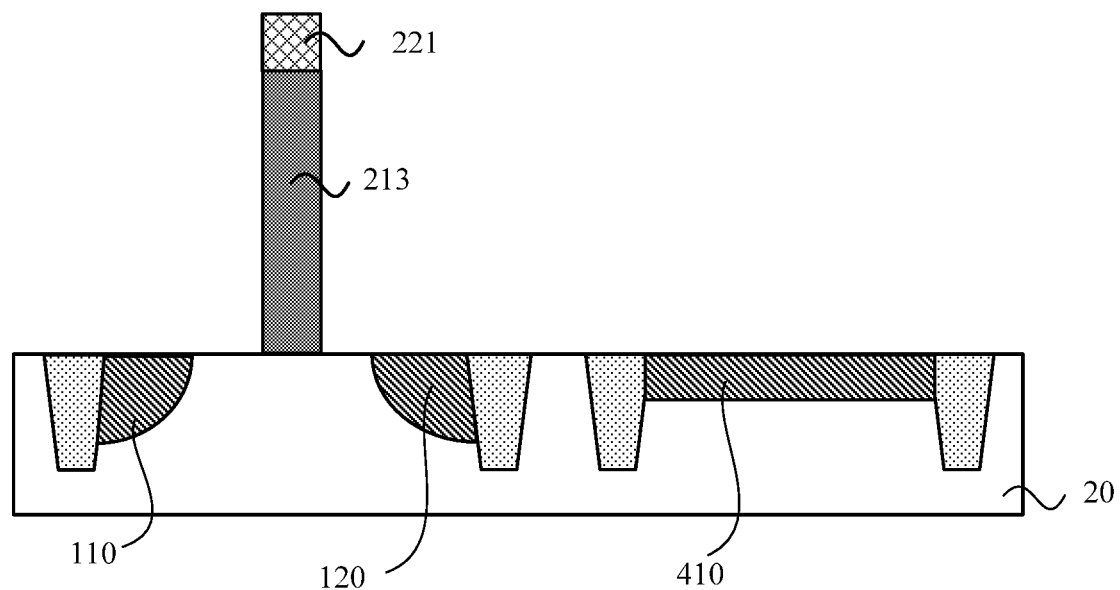

Step d3: Strip off the photoresist 215 corresponding to the middle of the first region 20a. Refer to FIG. 43.

Figure 44:
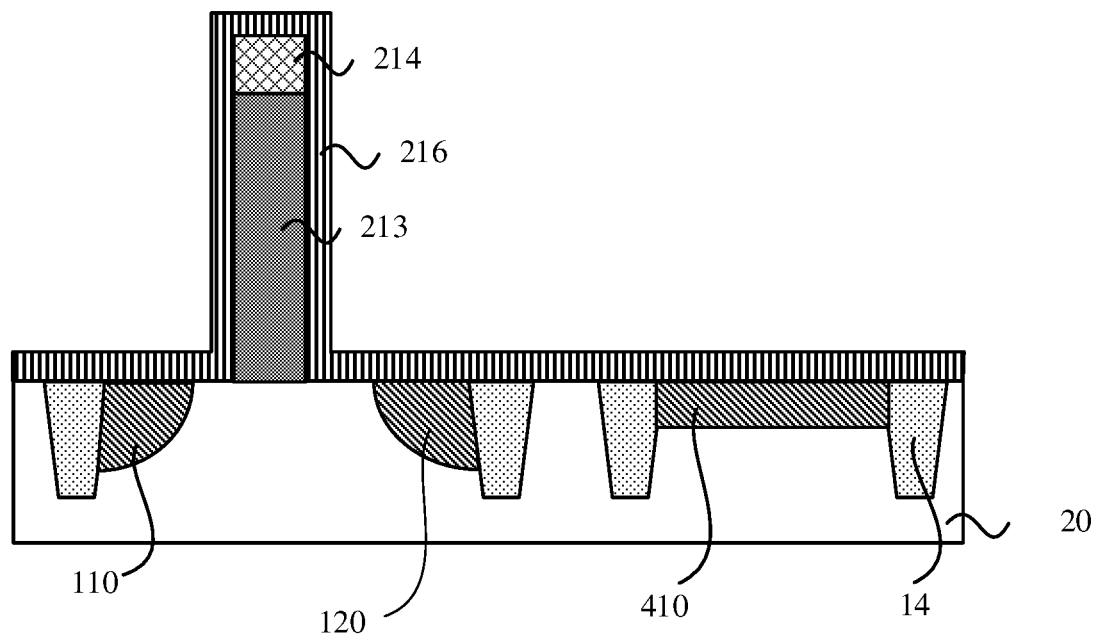

Correspondingly, the step S133c specifically includes the following steps:

Step S133c-I: Deposit an insulation layer 216, where a thickness of the insulation layer 216 is less than the height of the first source region 130. Refer to FIG. 44.

Figure 45:
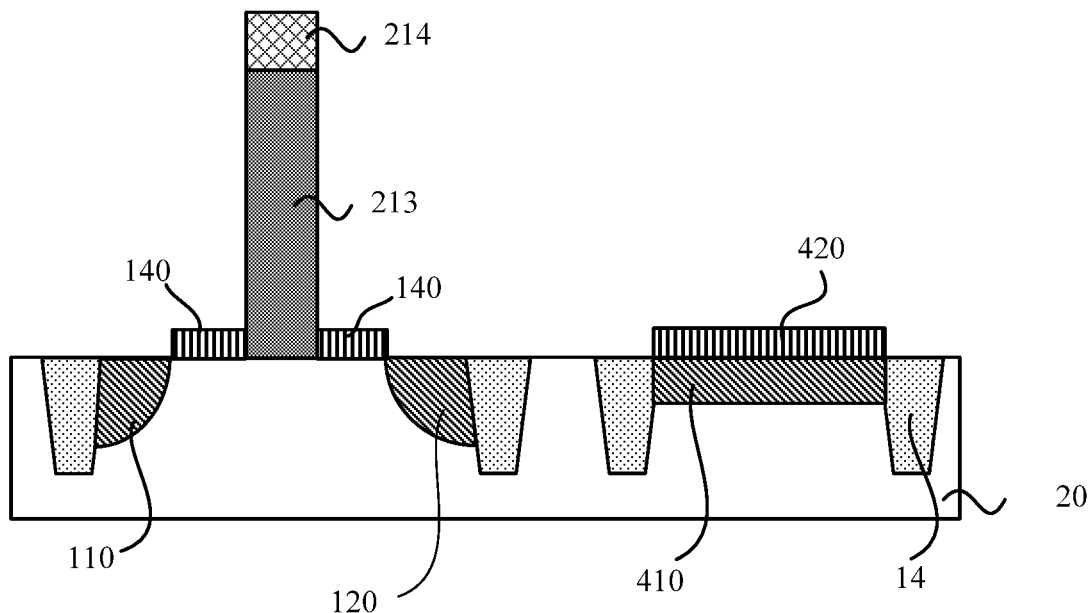

Step S133c-II: Pattern the insulation layer 216, to retain a part, of the insulation layer 216, that surrounds the first source region 130, and a part, of the insulation layer 216, that is disposed in the middle of the first doping region 410, where the part, of the insulation layer 216, that surrounds the first source region 130 is the first insulation layer 140, and the part, of the insulation layer, that is disposed in the middle of the first doping region 410 is the second insulation layer 420. Refer to FIG. 45.

Figure 46:
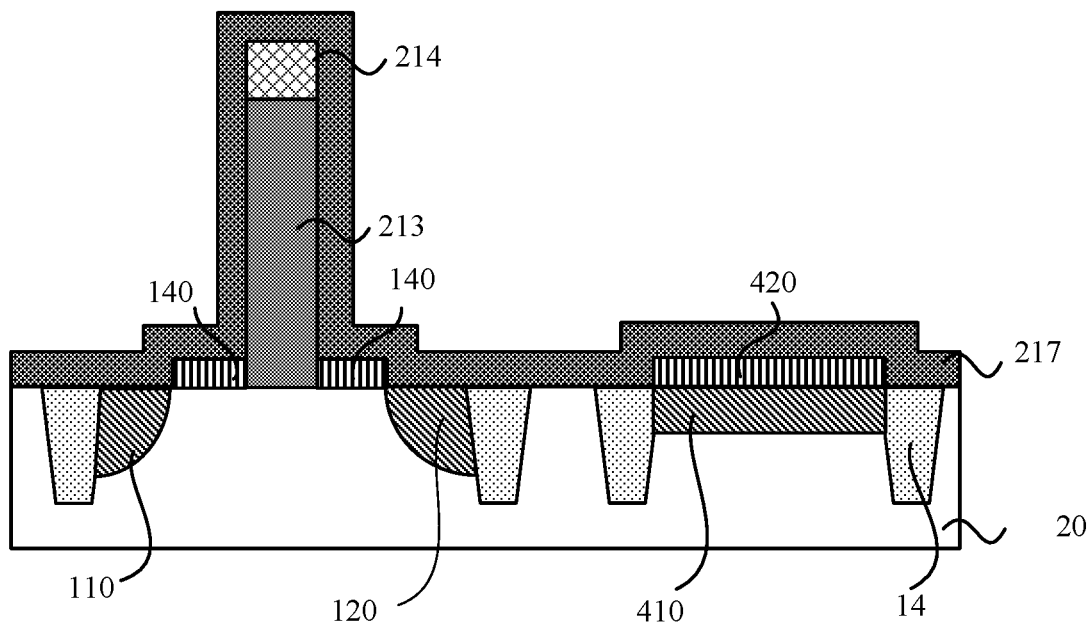

Correspondingly, the step S134c specifically includes the following steps:

Step S134c-I: Deposit an entire gate dielectric material layer 217. Refer to FIG. 46.

Figure 47:
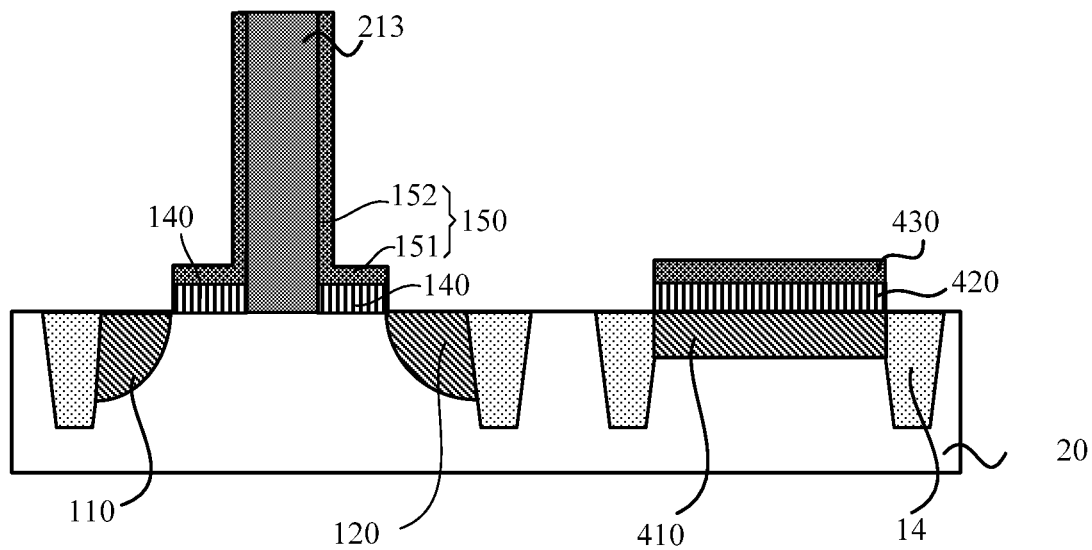

Step S134c-II: Pattern the gate dielectric material layer 217, to retain a gate dielectric material layer 217 that is attached to the surface of the first insulation layer 140 and the surface of the first source region 130 and that is symmetrically disposed on the both sides of the first source region 130, and retain agate dielectric material layer 217 disposed at the second insulation layer 420, where the gate dielectric material layer 217 that is attached to the surface of the first insulation layer 140 and the surface of the first source region 130 and that is symmetrically disposed on the both sides of the first source region 130 is defined as the first gate dielectric layer 150; the gate dielectric material layer 217 disposed at the second insulation layer 420 is defined as the third gate dielectric layer 430; the first gate dielectric layer 150 includes a first gate dielectric portion 151 and a second gate dielectric portion 152; the first gate dielectric portion 151 is stacked on the first insulation layer 140; and one end of the second gate dielectric portion 152 is connected to the first gate dielectric portion 151, and the second gate dielectric portion 152 is attached to the surface of the first source region 130. Refer to FIG. 47.

Figure 48:
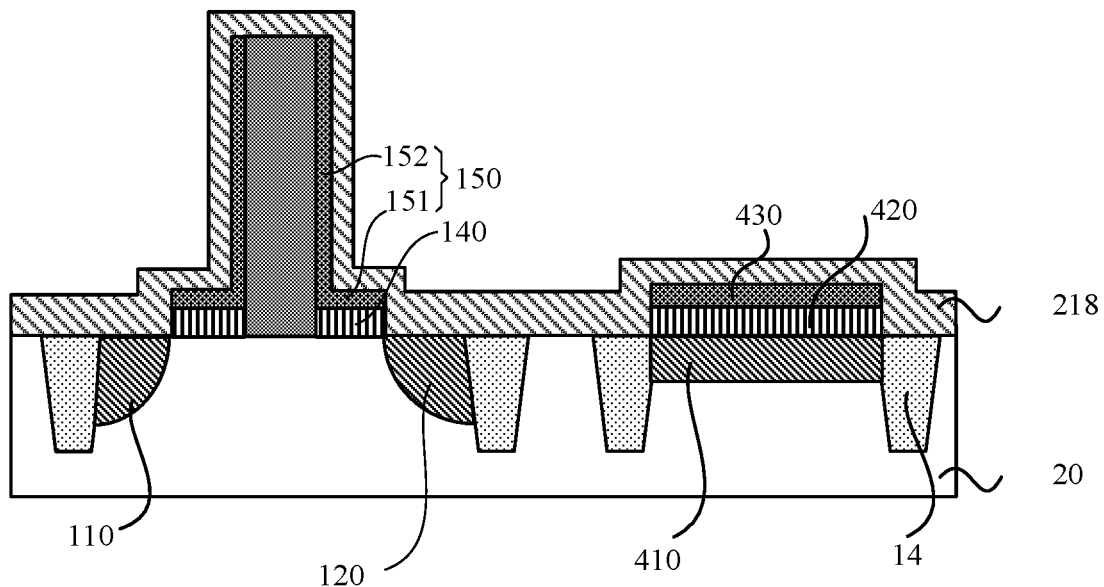

Correspondingly, the step S135c specifically includes the following steps:

Step S135c-I: Deposit an entire gate material layer 218. Refer to FIG. 48.

Figure 49:
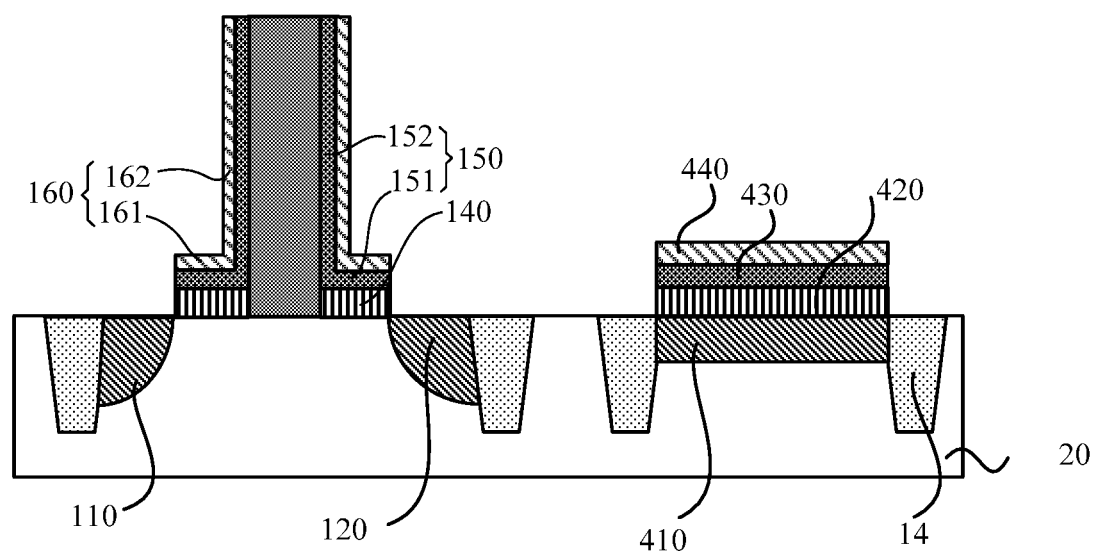

Step S135c-II: Pattern the gate material layer 218, to retain a gate material layer 218 that surrounds the first gate dielectric layer 150 and that is disposed at the third gate dielectric layer 430, where the gate material layer 218 disposed at the first gate dielectric layer 150 is defined as the first gate region 160; the gate material layer disposed at the third gate dielectric layer 430 is defined as the third gate region 440; the first gate region 160 includes a first part 161 and a second part 162; the first part 161 is stacked on the first gate dielectric layer 150; and one end of the second part 162 is connected to one end of the first part 161, and the second part 162 is attached to a surface of the second gate dielectric portion 152. Refer to FIG. 49.

The method for fabricating a semiconductor device further includes the following step:

Step III: Form a first drain 171, a second drain 172, a first source 173, and two first gates 174, respectively corresponding to the first drain region 110, the second drain region 120, the first source region 130, and the first gate region 160, form a first electrode 451 corresponding to one end of the first doping region 410, form a second electrode 452 corresponding to the other end of the first doping region 410, and form a third electrode 453 corresponding to the third gate region 440.

Preferably, before the step III, the method for fabricating a semiconductor device further includes the following steps:

Step S136c: Form, on the first drain region 110, the second drain region 120, the first source region 130, the first gate region 160, and the third gate region 440, an insulation isolation layer 219, where the insulation isolation layer 219 covering the first drain region 110, the second drain region 120, the first source region 130, and the first gate region 160 is defined as a first isolation layer 180; and the insulation isolation layer 219 covering the third gate region 440 is defined as a third isolation layer 460.

Step S137c: Provide, at the first isolation layer 180, a first through hole 181, a second through hole 182, a third through hole 183, a fourth through hole 184, and a fifth through hole 185, where the fourth through hole 184 and the fifth through hole 185 are respectively disposed on both sides of the third through hole 183; the first through hole 181 is disposed corresponding to the first drain region 110, and the first drain 171 is connected to the first drain region 110 by using the first through hole 181; the second through hole 182 is disposed corresponding to the second drain region 120, and the second drain 172 is connected to the second drain region 120 by using the second through hole 182; the third through hole 183 is disposed corresponding to the first source region 130, and the first source 173 is connected to the first source region 130 by using the third through hole 183; and the fourth through hole 184 and the fifth through hole 185 are separately disposed corresponding to the second part 162 of the first gate region 160, and the two first gates 174 are connected to the first gate region 160 respectively by using the fourth through hole 184 and the fifth through hole 185.

Figure 50:
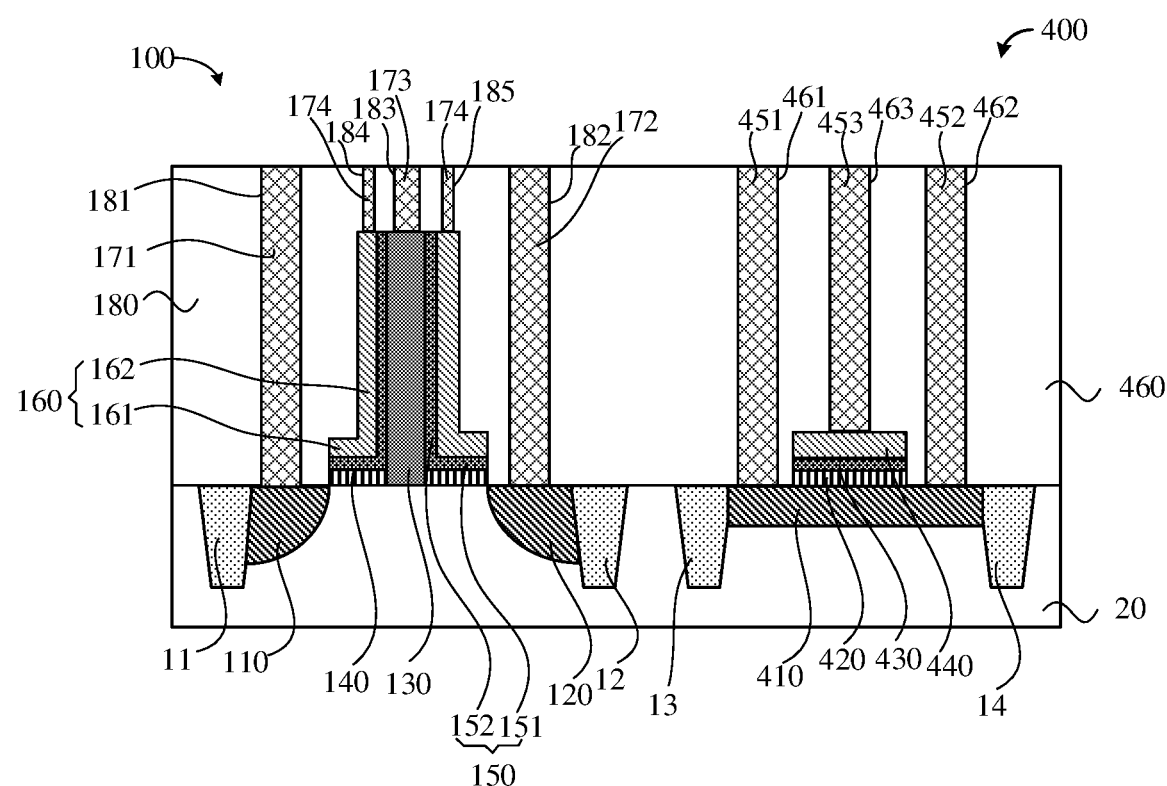

Step S138c: Provide, at the third isolation layer 460, a tenth through hole 461, an eleventh through hole 462, and a twelfth through hole 463, where the first electrode 451 is connected to one end of the first doping region 410 by using the tenth through hole 461; the second electrode 452 is connected to the other end of the first doping region 410 by using the eleventh through hole 462; and the third electrode 453 is connected to the third gate region 440 by using the twelfth through hole 463. For steps S136c to 138c, refer to FIG. 50.

Figure 51:
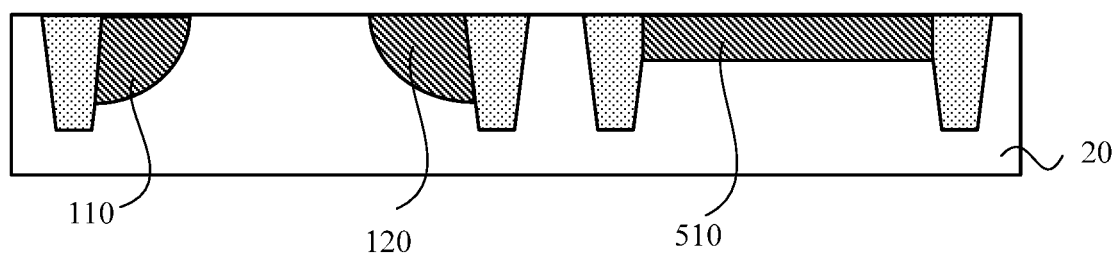
FIG. 51 to FIG. 56 are schematic diagrams of fabrication steps in a fabrication method of a semiconductor device in which a planar device is a resistor according to an example implementation of the present disclosure.

The following describes a method for fabricating the semiconductor device 10 when the planar device 200 in the semiconductor device 10 is the resistor 500. When the planar device 200 is the resistor, after the step S130, the step S120 further includes the following steps:

Step S131d: Form, from the first surface 100c, a first drain region 110 and a second drain region 120 that are embedded into the first surface 100c, and form, from the second surface 200c, a second doping region 510 embedded into the second surface 200c, where one end of the first drain region 110 is flush with the first surface 100c; one end of the second drain region 120 is flush with the first surface 100c; the first drain region 110 and the second drain region 120 are opposite to each other, separated by a part of the first substrate 100a, and disposed between the first shallow trench isolation region 11 and the second shallow trench isolation region 12; the first drain region 110 is in contact with the first shallow trench isolation region 11; the second drain region 120 is in contact with the second shallow trench isolation region 12; one end of the second doping region 510 is flush with the third surface 200c; the second doping region 510 is disposed between the third shallow trench isolation region 13 and the fourth shallow trench isolation region 14; and one end of the second doping region 510 is in contact with the third shallow trench isolation region 13, and the other end of the second doping region 510 is in contact with the fourth shallow trench isolation region 14. The second doping region 510 is located at a same layer as the first drain region 110 and the second drain region 120. Refer to FIG. 51.

Figure 52:
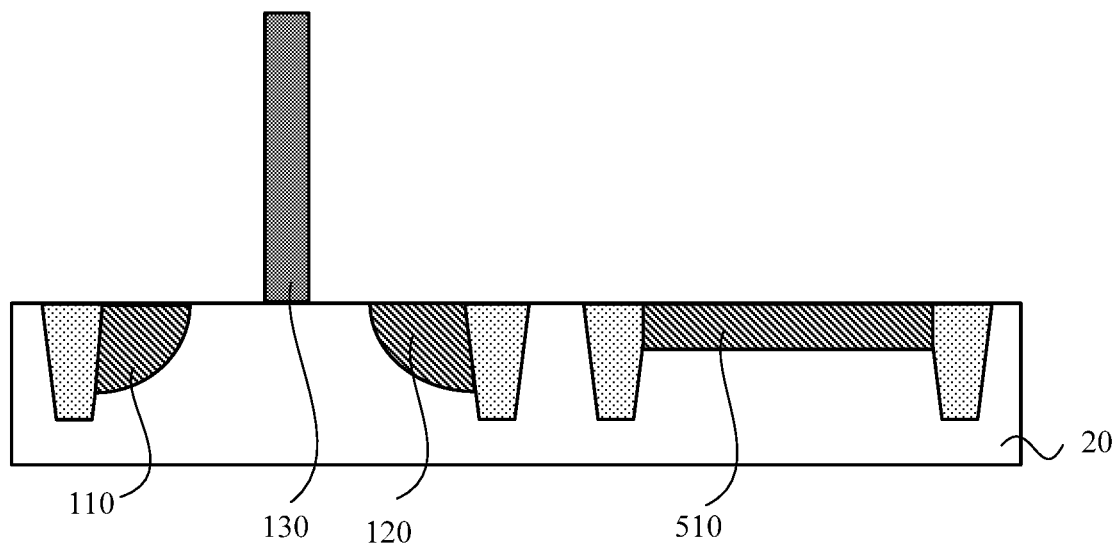

Step S132d: Form a first source region 130. The first source region 130 is disposed in a protruding manner on a surface of the first substrate 100a, and the first source region 130 is located between the first drain region 110 and the second drain region 120. Refer to FIG. 52.

Figure 53:
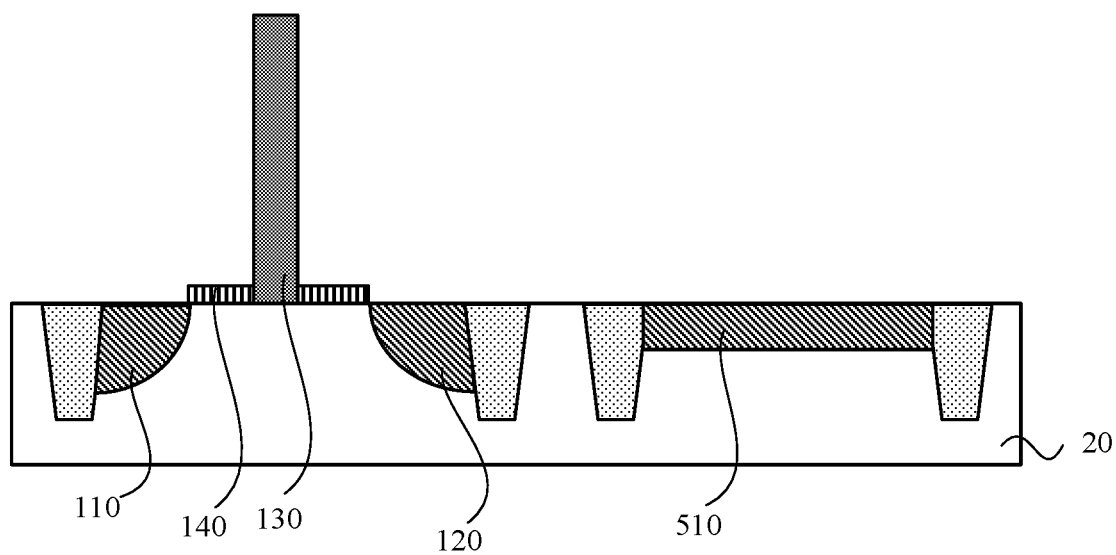

Step S133d: Form a first insulation layer 140. The first insulation layer 140 is disposed in a protruding manner on the surface of the first substrate. The first insulation layer 140 is symmetrically disposed on both sides of the first source region 130, and connected to a region between the first drain region 110 and the first source region 130 and a region between the second drain region 120 and the first source region 130. A thickness of the first insulation layer 140 is less than a height of the first source region 130. Refer to FIG. 53.

Figure 54:
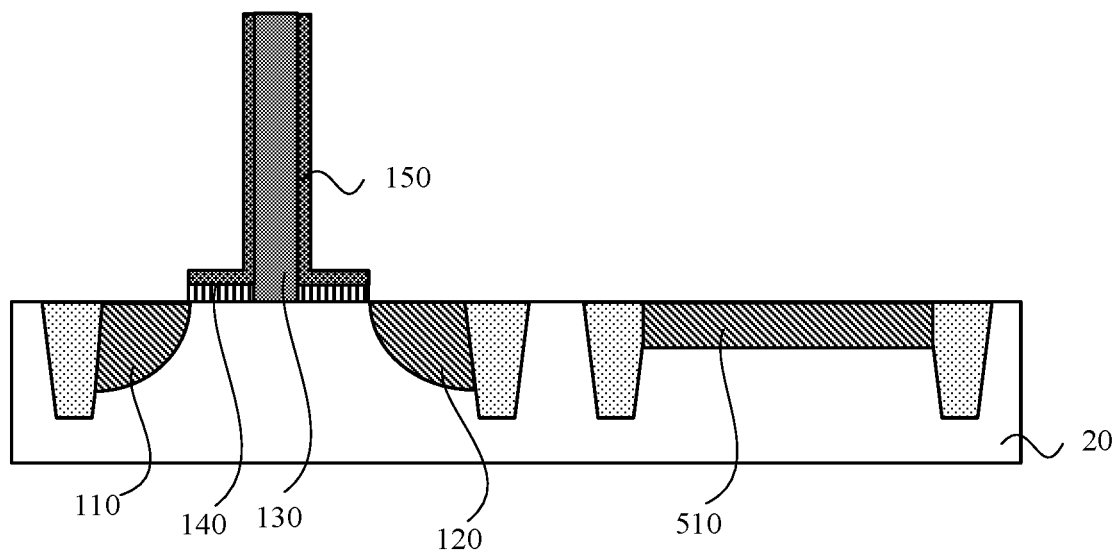

Step S134d: Form a first gate dielectric layer 150. The first gate dielectric layer 150 is symmetrically disposed on the both sides of the first source region 130 and is attached to a surface of the first source region 130 and a surface of the first insulation layer 140. Refer to FIG. 54.

Figure 55:
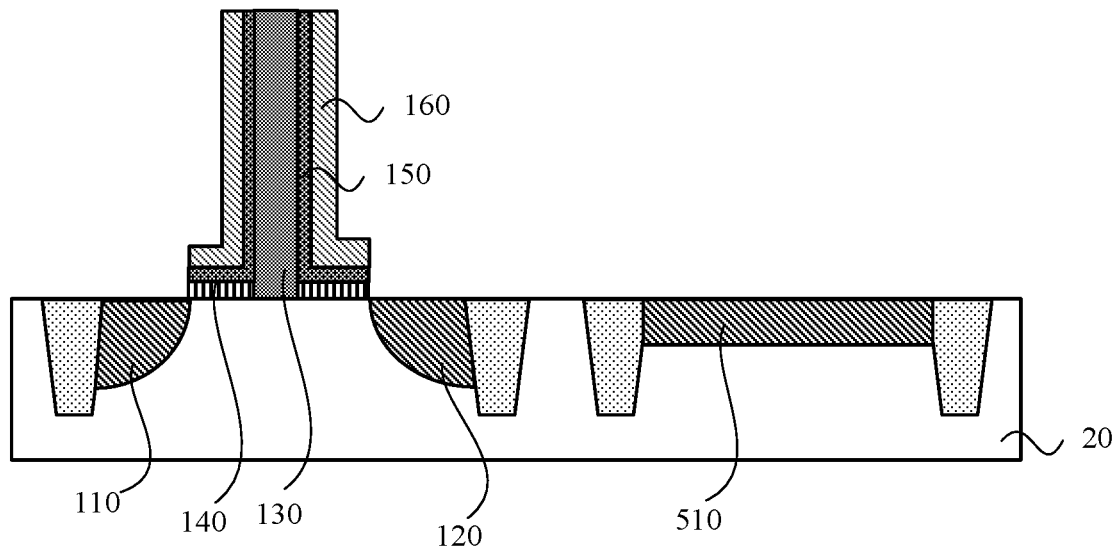

Step S135d: Form a first gate region 160, where the first gate region 160 is disposed around the first gate dielectric layer 150. Refer to FIG. 55.

The method for fabricating a semiconductor device further includes the following step:

Step IV: Form a first drain 171, a second drain 172, a first source 173, and two first gates 174, respectively corresponding to the first drain region 110, the second drain region 120, the first source region 130, and the first gate region 160, and form a fourth electrode 520 and a fifth electrode 530, corresponding to both ends of the second doping region 510.

Preferably, before the step IV, the method for fabricating a semiconductor device further includes the following steps:

Step S136d: Form, on the first drain region 110, the second drain region 120, the first source region 130, and the first gate region 160, and on the second doping region 510, an insulation isolation layer 219, where the insulation isolation layer 219 covering the first drain region 110, the second drain region 120, the first source region 130, and the first gate region 160 is defined as a first isolation layer 180; and the insulation isolation layer 219 covering the second doping region 510 is defined as a fourth isolation layer 540.

Step S137d: Provide, at the first isolation layer 180, a first through hole 181, a second through hole 182, a third through hole 183, a fourth through hole 184, and a fifth through hole 185, where the fourth through hole 184 and the fifth through hole 185 are respectively disposed on both sides of the third through hole 183; the first drain 171 is connected to the first drain region 110 by using the first through hole 181; the second drain 172 is connected to the second drain region 120 by using the second through hole 182; the first source 173 is connected to the first source region 130 by using the third through hole 183; and the two first gates 174 are connected to the first gate region 160 respectively by using the fourth through hole 184 and the fifth through hole 185.

Figure 56:
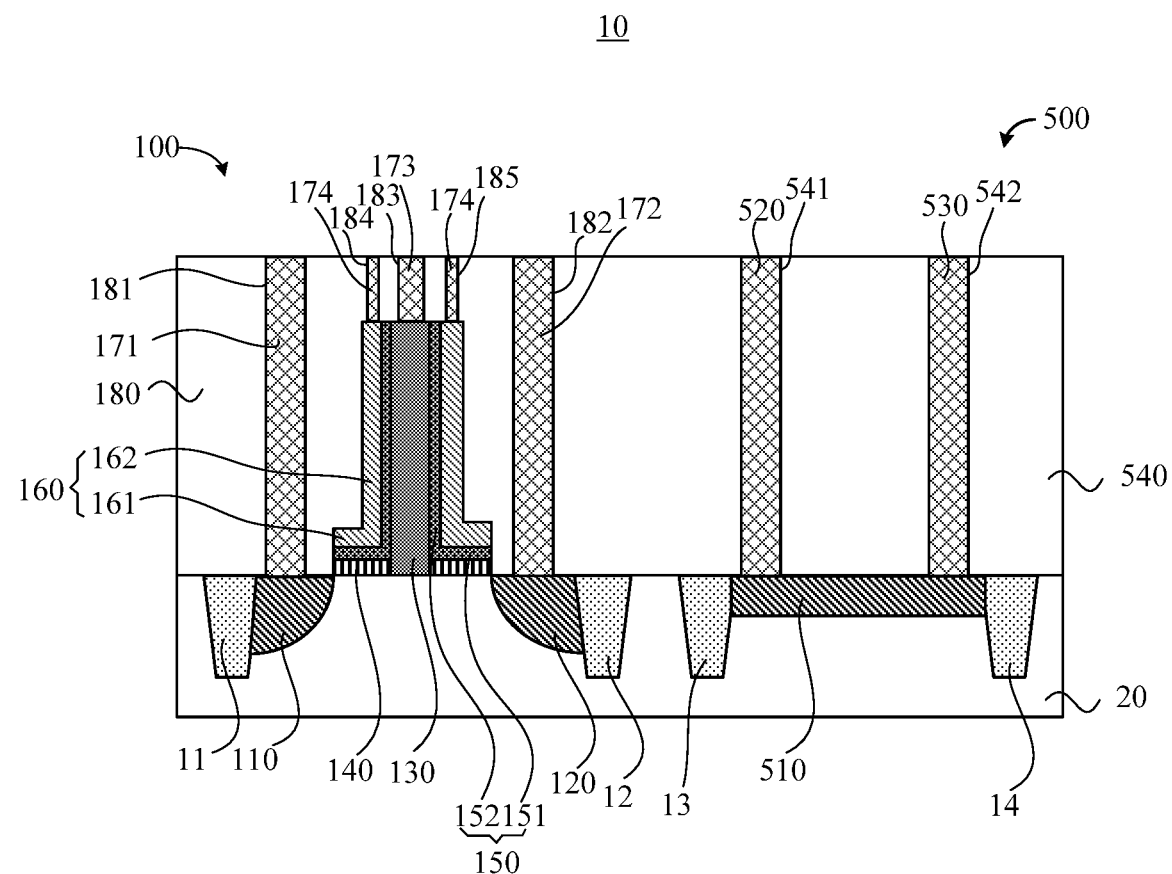

Step S138d: Provide, at the fourth isolation layer 540, a twelfth through hole 541 and a thirteenth through hole 542, where the fourth electrode 520 is connected to one end of the second doping region 510 by using the twelfth through hole 541, and the fifth electrode 530 is connected to the other end of the second doping region 510 by using the thirteenth through hole 542. For the steps S136d to S138d, refer to FIG. 56.

Compared with that in the prior art, according to the method for fabricating a semiconductor device in the present disclosure, layers of a same material in the tunnel field-effect transistor and the planar device are formed in a same process. This reduces process complexity and implementation costs for fabricating the semiconductor device.

It can be understood that in the present disclosure, a tunnel field-effect transistor is used as an example of a device disposed in the first region 20a in the semiconductor device 10 for illustration, and in other implementations, the device in the first region 20a in the semiconductor device 10 may be another device whose drain region is disposed at the bottom of the another device.

What is disclosed above is merely example embodiments of the present disclosure, and certainly is not intended to limit the protection scope of the present disclosure. A person of ordinary skill in the art may understand that all or some of processes that implement the foregoing embodiments and equivalent modifications made in accordance with the claims of the present disclosure shall fall within the scope of the present disclosure.

What is claimed is:
1. A semiconductor device, comprising:
 a tunnel field-effect transistor comprising:
  a first substrate; and
  a first electrical element, wherein the first electrical element is formed on one side of the first substrate, wherein the first electrical element comprises:
   a first drain region;
   a second drain region, wherein the first drain region and the second drain region are opposite to each other and separated by a part of the first substrate;
   a first shallow trench isolation region;
   a second shallow trench isolation region, wherein the first drain region and the second drain region are disposed between the first shallow trench isolation region and the second shallow trench isolation region;
 a planar device comprising:
  a second substrate; and
  a second electrical element, wherein the second substrate and the first substrate are an integrated structure and form a main substrate, wherein the second electrical element is formed on one side of the second substrate, wherein the second electrical element and the first electrical element are disposed on a same side of the main substrate, and wherein the planar device comprises at least one of a metal oxide semiconductor transistor, a capacitor, or a resistor.

2. The semiconductor device according to claim 1, wherein the first substrate comprises a first surface and a second surface that are disposed opposite to each other, wherein the second substrate comprises a third surface and a fourth surface that are disposed opposite to each other, wherein the first substrate is in contact with the second substrate, wherein the third surface is flush with the first surface, and wherein the fourth surface is flush with the second surface.

3. The semiconductor device according to claim 2, wherein the first shallow trench isolation region and the second shallow trench isolation region are embedded into the first substrate from the first surface, wherein one end of the first shallow trench isolation region is flush with the first surface, wherein one end of the second shallow trench isolation region is flush with the first surface, and wherein the second shallow trench isolation region and the first shallow trench isolation region are opposite to each other and separated by a part of the first substrate.

4. The semiconductor device according to claim 3, wherein the first electrical element further comprises a first source region, a first insulation layer, a first gate dielectric layer, and a first gate region, wherein the first drain region and the second drain region are embedded into the first substrate from the first surface, wherein one end of the first drain region is flush with the first surface, wherein one end of the second drain region is flush with the first surface, wherein the first drain region is in contact with the first shallow trench isolation region, wherein the second drain region is in contact with the second shallow trench isolation region, wherein the first source region is disposed in a protruding manner on the first surface, wherein the first source region is located between the first drain region and the second drain region, wherein the first insulation layer is disposed in a protruding manner on the first surface, wherein the first insulation layer is symmetrically disposed on both sides of the first source region connected to a region between the first drain region and the first source region and a region between the second drain region and the first source region, wherein a thickness of the first insulation layer is less than a height of the first source region, wherein the first gate dielectric layer is symmetrically disposed on the both sides of the first source region and is attached to a surface of the first source region and a surface of the first insulation layer, and wherein the first gate region is disposed around the first gate dielectric layer.

5. The semiconductor device according to claim 4, wherein the first gate dielectric layer comprises a first gate dielectric portion and a second gate dielectric portion, wherein the first gate dielectric portion is stacked on the first insulation layer, wherein one end of the second gate dielectric portion is connected to the first gate dielectric portion, and wherein the second gate dielectric portion is attached to the surface of the first source region.

6. The semiconductor device according to claim 5, wherein the first gate region comprises a first part and a second part, wherein the first part is stacked on the first gate dielectric portion, wherein one end of the second part is connected to one end of the first part, and wherein the second part is attached to a surface of the second gate dielectric portion.

7. The semiconductor device according to claim 6, wherein the first gate dielectric layer further comprises a third gate dielectric portion, wherein the third gate dielectric portion is connected to one end of the second gate dielectric portion that is away from the first gate dielectric portion, wherein the third gate dielectric portion covers one end of the first source region that is away from the substrate, wherein the first gate region further comprises a third part connected to one end of the second part that is away from the first part, and wherein the third part covers the third gate dielectric portion.

8. The semiconductor device according to claim 6, wherein the first electrical element further comprises a first drain, a second drain, a first source, and two first gates, wherein the first drain, the second drain, the first source, and the two first gates correspondingly connect to the first drain region, the second drain region, the first source region, and the second part of the first gate region, respectively, and wherein the two first gates are respectively disposed on both sides of the first source.

9. The semiconductor device according to claim 7, wherein the first electrical element further comprises a first drain, a second drain, a first source, and three first gates, wherein the first drain, the second drain, the first source, and the three first gates correspondingly connect to the first drain region, the second drain region, the first source region, and the first gate region during disposing, wherein two of the first gates are connected to the second part and respectively disposed on both sides of the first source, and wherein another first gate excluding the two of the first gates is connected to the third part.

10. The semiconductor device according to claim 1, wherein the second electrical element comprises a third shallow trench isolation region and a fourth shallow trench isolation region, wherein the third shallow trench isolation region and the fourth shallow trench isolation region are embedded into the second substrate from the third surface, wherein one end of the third shallow trench isolation region is flush with the third surface, wherein one end of the fourth shallow trench isolation region is flush with the third surface, and wherein the fourth shallow trench isolation region and the third shallow trench isolation region are disposed opposite to each other and separated by a part of the second substrate.

11. The semiconductor device according to claim 10, wherein the planar device is the metal oxide semiconductor transistor, wherein the second electrical element comprises a second source region, a third drain region, a second gate dielectric layer, and a second gate region, wherein the second source region and the third drain region are embedded into the second substrate from the third surface, wherein one end of the second source region is flush with the third surface, wherein one end of the third drain region is flush with the third surface, wherein the second source region and the third drain region are opposite to each other separated by a part of the second substrate and disposed between the third shallow trench isolation region and the fourth shallow trench isolation region, wherein the second source region is in contact with the third shallow trench isolation region, wherein the third drain region is in contact with the fourth shallow trench isolation region, wherein the second gate dielectric layer is disposed in a protruding manner on the third surface, wherein the second gate dielectric layer is disposed between the second source region and the third drain region, wherein the second gate region is stacked on the second gate dielectric layer, and wherein the second gate region is in contact with the second gate dielectric layer.

12. The semiconductor device according to claim 11, wherein the second electrical element further comprises a second source, a third drain, and a second gate, and wherein the second source, the third drain, and the second gate are correspondingly connected to the second source region, the third drain region, and the second gate region, respectively.

13. The semiconductor device according to claim 12, wherein the second electrical element further comprises a second isolation layer, wherein the second isolation layer is located at a same layer as the first isolation layer, wherein the second isolation layer covers the second source region, the third drain region, and the second gate region, wherein a seventh through hole, an eighth through hole, and a ninth through hole are disposed at the second isolation layer, wherein the seventh through hole is disposed corresponding to the second source region, wherein the second source is connected to the second source region using the seventh through hole, wherein the eighth through hole is disposed corresponding to the third drain region, wherein the third drain is connected to the third drain region using the eighth through hole, wherein the ninth through hole is disposed corresponding to the second gate region, and wherein the second gate is connected to the second gate region using the ninth through hole.

14. The semiconductor device according to claim 11, wherein the first drain region, the second drain region, the second source region, and the third drain region are first-type ion heavily-doped regions, wherein the first source region is a second-type ion heavily-doped region, wherein the first-type ion heavily-doped region is an N-type ion heavily-doped region and the second-type ion heavily-doped region is a P-type ion heavily-doped region, or wherein the first-type ion heavily-doped region is a P-type ion heavily-doped region and the second-type ion heavily-doped region is an N-type ion heavily-doped region.

15. The semiconductor device according to claim 10, wherein the planar device is the capacitor, wherein the second electrical element comprises a first doping region, a second insulation layer, a third gate dielectric layer, and a third gate region, wherein the first doping region is embedded into the second substrate from the third surface; one end of the first doping region is flush with the third surface, wherein the first doping region is disposed between the third shallow trench isolation region and the fourth shallow trench isolation region, wherein one end of the first doping region is in contact with the third shallow trench isolation region, wherein another end of the first doping region is in contact with the fourth shallow trench isolation region wherein the second insulation layer is disposed in the middle of the first doping region, wherein the second insulation layer does not cover the both ends of the first doping region, wherein the third gate dielectric layer is stacked on the second insulation layer, and wherein the third gate region is stacked on the third gate dielectric layer.

16. The semiconductor device according to claim 15, wherein the second electrical element further comprises a first electrode, a second electrode, and a third electrode, wherein the first electrode and the second electrode correspondingly connect to the both ends of the first doping region, respectively, and wherein the third electrode is connected to the third gate region.

17. The semiconductor device according to claim 10, wherein the planar device is the resistor, wherein the second electrical element comprises a second doping region, wherein the second doping region is embedded into the second substrate from the third surface, wherein one end of the second doping region is flush with the third surface, wherein the second doping region is disposed between the third shallow trench isolation region and the fourth shallow trench isolation region, wherein one end of the second doping region is in contact with the third shallow trench isolation region, and wherein another end of the second doping region is in contact with the fourth shallow trench isolation region.

18. The semiconductor device according to claim 17, wherein the second electrical element further comprises a fourth electrode and a fifth electrode, and the fourth electrode and the fifth electrode are correspondingly connected to the both ends of the second doping region, respectively.

19. A method for fabricating a semiconductor device, comprising:

providing a main substrate comprising a first substrate and a second substrate that are adjacent to each other, wherein the first substrate comprises a first surface and a second surface that are disposed opposite to each other, wherein the second substrate comprises a third surface and a fourth surface that are disposed opposite to each other, wherein the third surface is flush with the first surface, and wherein the fourth surface is flush with the second surface;

forming a first electrical element on one side of the first substrate by forming a first shallow trench isolation region and a second shallow trench isolation region; and forming a first drain region and a second drain region, wherein the first drain region and the second drain region are opposite to each other and separated by a part of the first substrate, and wherein the first drain region and the second drain region are disposed between the first shallow trench isolation region and the second shallow trench isolation region; and forming a second electrical element on one side of the second substrate, wherein the second electrical element and the first electrical element are disposed on a same side of the main substrate, wherein the first substrate and the first electrical element constitute a tunnel field-effect transistor, wherein the second substrate and the second electrical element constitute a planar device, and wherein the planar device comprises at least one of a metal oxide semiconductor transistor, a capacitor, or a resistor.

20. The method according to claim 19, further comprising forming, from the third surface, a third shallow trench isolation region and a fourth shallow trench isolation region that are embedded into the second substrate, wherein one end of the first shallow trench isolation region is flush with the first surface, wherein one end of the second shallow trench isolation region is flush with the first surface, wherein the second shallow trench isolation region and the first shallow trench isolation region are disposed opposite to each other and separated by a part of the first substrate, wherein one end of the third shallow trench isolation region is flush with the third surface, wherein one end of the fourth shallow trench isolation region is flush with the third surface, and wherein the fourth shallow trench isolation region and the third shallow trench isolation region are disposed opposite to each other and separated by a part of the second substrate.

* * * * *